(12) United States Patent
Oikawa et al.

(10) Patent No.: US 9,529,266 B2
(45) Date of Patent: Dec. 27, 2016

(54) METHOD OF FORMING PATTERN

(71) Applicant: Tokyo Ohka Kogyo Co., Ltd., Kawasaki-shi (JP)

(72) Inventors: Tomohiro Oikawa, Kawasaki (JP); Kazuishi Tanno, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 25 days.

(21) Appl. No.: 14/579,718

(22) Filed: Dec. 22, 2014

(65) Prior Publication Data

US 2015/0185619 A1 Jul. 2, 2015

(30) Foreign Application Priority Data

Dec. 27, 2013 (JP) .................... 2013-271455

(51) Int. Cl.
*G03F 7/30* (2006.01)
*G03F 7/40* (2006.01)
*G03F 7/038* (2006.01)

(52) U.S. Cl.
CPC ............... *G03F 7/40* (2013.01); *G03F 7/0382* (2013.01)

(58) Field of Classification Search
CPC ............ G03F 7/30; G03F 7/40; G03F 7/0382
USPC .................. 430/324, 326, 312, 325
See application file for complete search history.

(56) References Cited

U.S. PATENT DOCUMENTS

| 2004/0110085 | A1 | 6/2004 | Iwai et al. | |
| 2008/0318171 | A1* | 12/2008 | Tsubaki | G03F 7/0392 430/326 |
| 2009/0081595 | A1 | 3/2009 | Hatakeyama et al. | |
| 2009/0197204 | A1 | 8/2009 | Shiono et al. | |
| 2009/0317743 | A1 | 12/2009 | Shiono et al. | |
| 2010/0178618 | A1* | 7/2010 | Hatakeyama | G03F 7/40 430/323 |
| 2010/0203457 | A1* | 8/2010 | Hatakeyama | G03F 1/144 430/326 |
| 2010/0310985 | A1 | 12/2010 | Mori et al. | |
| 2010/0310995 | A1* | 12/2010 | Chen | G03F 7/0035 430/326 |
| 2010/0330507 | A1* | 12/2010 | Tsubaki | G03F 7/325 430/325 |
| 2011/0052883 | A1* | 3/2011 | Jain | G03F 7/2022 428/195.1 |
| 2011/0117499 | A1 | 5/2011 | Matsumiya et al. | |
| 2012/0149916 | A1 | 6/2012 | Utsumi et al. | |

FOREIGN PATENT DOCUMENTS

| EP | 2031007 A2 | 3/2009 |
| JP | A-2003-241385 | 8/2003 |
| JP | A-2006-291177 | 10/2006 |
| JP | A-2009-211036 | 9/2009 |
| JP | A-2010-002870 | 1/2010 |
| JP | A-2010-032994 | 2/2010 |
| JP | A-2010-277043 | 12/2010 |
| JP | A-2011-013569 | 1/2011 |
| JP | A-2011-128226 | 6/2011 |

OTHER PUBLICATIONS

D. Gil et al., Proceedings of SPIE, vol. 5754, p. 119-128, 2005.
Takeaki Ebihara, et al., Proceedings of SPIE, vol. 5256, p. 985-994, 2003.
Yan Borodovsky, Proceedings of SPIE, vol. 6153, p. 615301-1-19, 2006.

* cited by examiner

*Primary Examiner* — John S Chu
(74) *Attorney, Agent, or Firm* — Knobbe Martens Olson & Bear LLP

(57) ABSTRACT

Using a resist composition which exhibits decreased solubility in an organic solvent upon exposure, patterning is conducted by a negative-tone development using a developing solution containing an organic solvent to form a first resist pattern on the substrate, wherein the first resist pattern is composed of a plurality of exposed portions. Then, a pattern reversing composition containing an organic solvent which does not dissolve the first resist pattern is applied to the substrate on which the first resist pattern has been formed, to form a pattern reversing film. Next, the first resist pattern is removed and patterning of the pattern reversing film is conducted by an alkali developing to form a reversed pattern in which the image of the first resist pattern is reversed.

4 Claims, 2 Drawing Sheets

METHOD OF FORMING PATTERN

TECHNICAL FIELD

The present invention relates to a method of forming a pattern, in which a negative-tone resist pattern is formed using a resist composition, a pattern reversing composition is applied thereto to form a pattern reversing film, and then an alkali development is conducted thereby forming a pattern having a reversed image of the negative-tone resist pattern.

Priority is claimed on Japanese Patent Application No. 2013-271455, filed on Dec. 27, 2013, the content of which is incorporated herein by reference.

BACKGROUND ART

Techniques (pattern-forming techniques) in which a fine pattern is formed on top of a support, and a lower layer beneath that pattern is then fabricated by conducting etching with this pattern as a mask are widely used in the semiconductor industry for IC device fabrication and the like.

These types of fine patterns are usually formed from an organic material, and are formed, for example, using a lithography method or a nanoimprint method or the like. In lithography techniques, for example, a resist film composed of a resist material is formed on a support such as a substrate, and the resist film is subjected to selective exposure of radial rays such as light or electron beam, followed by development, thereby forming a resist pattern having a predetermined shape on the resist film. Using this resist pattern as a mask, a semiconductor or the like is produced by conducting a step in which the substrate is processed by etching.

Resist materials in which the exposed portions exhibit increased solubility in a developing solution is called a positive type, and a resist material in which the exposed portions exhibit decreased solubility in a developing solution is called a negative type.

In recent years, advances in lithography techniques have led to rapid progress in the field of pattern miniaturization. Typically, these miniaturization techniques of a resist pattern involve shortening the wavelength of the exposure light source. Conventionally, ultraviolet radiation typified by g-line and i-line radiation has been used, but nowadays KrF excimer lasers and ArF excimer lasers are starting to be introduced in mass production of the semiconductor elements. For example, by lithography using ArF excimer laser, a pattern having a resolution of 45 nm level is formed. Furthermore, in order to enhance resolution, research is also being conducted into lithography techniques that use an exposure light source having a wavelength shorter than these excimer lasers, such as $F_2$ excimer lasers, electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources. As a resist material that satisfies these conditions, a chemically amplified composition is used which includes an acid generator that generates acid upon exposure. In a chemically amplified resist composition, a base component which exhibits changed solubility in a developing solution under action of acid is generally used in addition to the acid generator. For example, in a chemically amplified positive resist composition, a base component which exhibits increased solubility in an alkali developing solution under action of acid is used. Conventionally, a resin is typically used as the base component of a chemically amplified resist composition (see Patent Document 1).

As a technique for further improving the resolution, a lithography method called liquid immersion lithography (hereafter, frequently referred to as "immersion exposure") is known in which exposure (immersion exposure) is conducted in a state where the region between the lens and the resist layer formed on a wafer is filled with a solvent (an immersion medium) that has a larger refractive index than the refractive index of air (see for example, Non-Patent Document 1).

According to this type of immersion exposure, it is considered that higher resolutions equivalent to those obtained using a shorter wavelength light source or a larger NA lens can be obtained using the same exposure light source wavelength, with no lowering of the depth of focus. Furthermore, immersion exposure can be conducted by applying a conventional exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution.

Immersion lithography is effective in forming patterns having various shapes. Further, immersion exposure is expected to be capable of being used in combination with currently studied super-resolution techniques, such as phase shift method and modified illumination method. Currently, as the immersion exposure technique, technique using an ArF excimer laser as an exposure source is being actively studied. Further, water is mainly used as the immersion medium.

As a lithography technique which has been recently proposed, a double patterning method is known in which patterning is conducted two or more times to form a resist pattern (for example, see Non-Patent Documents 2 and 3).

There are several different types of double patterning process, for example, (1) a method in which a lithography step (from application of resist compositions to exposure and developing) and an etching step are performed twice or more to form a pattern and (2) a method in which the lithography step is successively performed twice or more.

Formation of patterns according to the step (1) can be conducted, for example, by the following procedure. A laminate is prepared in which a substrate, a lower-layer film and a hard mask are laminated. Subsequently, a resist film is formed on the hard mask, and the resist film is subjected to selective exposure and developing through a photomask, thereby forming a first resist pattern in which a plurality of hole patterns having a predetermined size are arranged at predetermined positions. Then, the hard mask is subjected to etching by using the first resist pattern as a mask, followed by the removal of the remaining first resist pattern. As a result, a hard mask is obtained in which the image of the first resist pattern is transferred. Subsequently, a resist composition is applied to the hard mask. As a result, a resist film is formed which fills in the concave portions within the hard mask. Then, the resist film is subjected to selective exposure through some photomask having a different pattern arranged, followed by developing to form a second resist pattern. Then, the hard mask is subjected to etching by using the second resist pattern as a mask, followed by the removal of the remaining second resist pattern. As a result, a hard mask is obtained in which the image of the first resist pattern and the image of the second resist pattern are transferred. The image of the pattern of the hard mask is transferred to the lower-layer film by conducting an etching process using the hard mask as a mask. As a result, a pattern is formed, which has a narrower pitch than that of photomask used.

According to the method (2), for example, a first resist film is formed on a substrate, and patterning of the first resist film is conducted to form a plurality of resist patterns (first resist pattern). Then, a second resist material is applied to the plurality of resist patterns to form a second resist film which fills in the concave portions between the plurality of resist patterns. Then, patterning of the second resist film is conducted.

According to the double patterning method, a resist pattern with a higher level of resolution can be formed, as compared to the case where a resist pattern is formed by a single lithography step (namely, a single patterning process), even when a light source with the same exposure wavelength is used, or even when the same resist composition is used. Furthermore, double patterning process can be conducted using a conventional exposure apparatus.

As a lithography technique which has been recently proposed, a pattern formation method by which the image of a positive pattern is reversed to a negative pattern has been proposed (see Patent Document 2). The method includes: a step in which a positive pattern is formed using a chemically amplified positive composition containing: a resin which contains a repeating unit having an acid labile group capable of being removed by acid and which exhibits solubility in alkali developing solution after removal of acid labile group, an photo acid generator that generates acid upon exposure of high-energy radiation or a heat acid generator that generates acid by heating, and an organic solvent; a step in which the obtained positive pattern is exposed or heated so as to increase alkali solubility thereof due to removal of acid labile group in the resin of the positive pattern by the action of acid or heat, and form a crosslink thereby ensuring resistance to an organic solvent, such that the solubility of the resin in alkali wet etching solution is not impaired; a step in which a reversing film is formed using a composition for forming a pattern reversing film; and a step in which the positive pattern having the crosslink formed is dissolved and removed using an alkali wet etching solution.

DOCUMENTS OF RELATED ART

Patent Document

[Patent Document 1] Japanese Unexamined Patent Application, First Publication No. 2003-241385
[Patent Document 2] Japanese Unexamined Patent Application, First Publication No. 2009-211036

Non-Patent Documents

[Non-Patent Document 1] Proceedings of SPIE (U.S.), vol. 5754, pp. 119-128 (2005)
[Non-Patent Document 2] Proceedings of SPIE (U.S.), vol. 5256, pp. 985-994 (2003)
[Non-Patent Document 3] Proceedings of SPIE (U.S.), vol. 615301-1-19 (2006)

SUMMARY OF THE INVENTION

However, in the case of forming a space pattern or a hole pattern on a resist film, it becomes necessary to form a resist pattern using an incident light weaker than that used in the case of a line pattern or a dot pattern, and hence, the contrast of the intensity of the incident light between exposed portions and unexposed portions becomes unsatisfactory. Therefore, pattern formation performance such as resolution and lithography margin (e.g., margin with respect to the exposure amount (EL margin), margin with respect to the depth of focus (DOF margin), verticality of the pattern shape) tends to be restricted, and it becomes difficult to form a resist pattern with a high resolution and to form a hole pattern with a dense pitch.

A double patterning process is one of the techniques which are capable of forming a resist pattern having high resolution. However, in the method (1) among the conventional double patterning processes, each of patterning (formation of a resist film, exposure, development) of a resist film and etching of a hard mask layer below needs to be conducted at least twice, which results in the increase of number of steps required and amount of chemical drugs used, and ultimately the increase in the production cost. Furthermore, the method (2) is suitable for formation of a line and space pattern, but is not suitable for formation of an isolated space pattern (trench pattern) or a hole pattern.

In the method of forming a pattern of Patent Document 2, a step in which acid is generated from a photo acid generator upon exposure is required after obtaining a positive pattern. When a heat acid generator is used, in a formation of positive pattern (first resist pattern), the contrast is weakened due to acid generated from the heat acid generator during a post exposure bake treatment. As a result, problems may be caused, for example, the resolution is deteriorated, and a pattern cannot be formed.

Therefore, a new technique is required, in which a formation of a fine pattern such as a space pattern and hole pattern (particularly, hole pattern having a dense pitch) having a high resolution is conducted by a simple method with small number of steps.

The present invention takes the above circumstances into consideration, with an object of providing a method of forming a pattern; the method is useful as a method of forming a fine pattern.

For solving the above-mentioned problems, the present invention employs the following aspects.

The method of forming a pattern of the present invention, including: a step (1) in which a resist composition which exhibits decreased solubility in an organic solvent upon exposure is applied to a substrate to form a first resist film, the first resist film is subjected to exposure, and the exposed first resist film is subject to patterning by negative-tone developing using a developing solution containing an organic solvent to form a first resist pattern; and a step (2) in which a pattern reversing composition containing an organic solvent which does not dissolve the first resist pattern is applied to the substrate on which the first resist pattern has been formed, so as to form a pattern reversing film, and the obtained pattern reversing film is subjected to alkali developing treatment using an alkali developing solution to remove the first resist pattern and to conduct patterning of the pattern reversing film, so as to form a reversed pattern of the first resist pattern.

According to the present invention, there is provided a method of forming a pattern; the method is useful as a method of forming a fine pattern.

MODE FOR CARRYING OUT THE INVENTION

Figure 1:
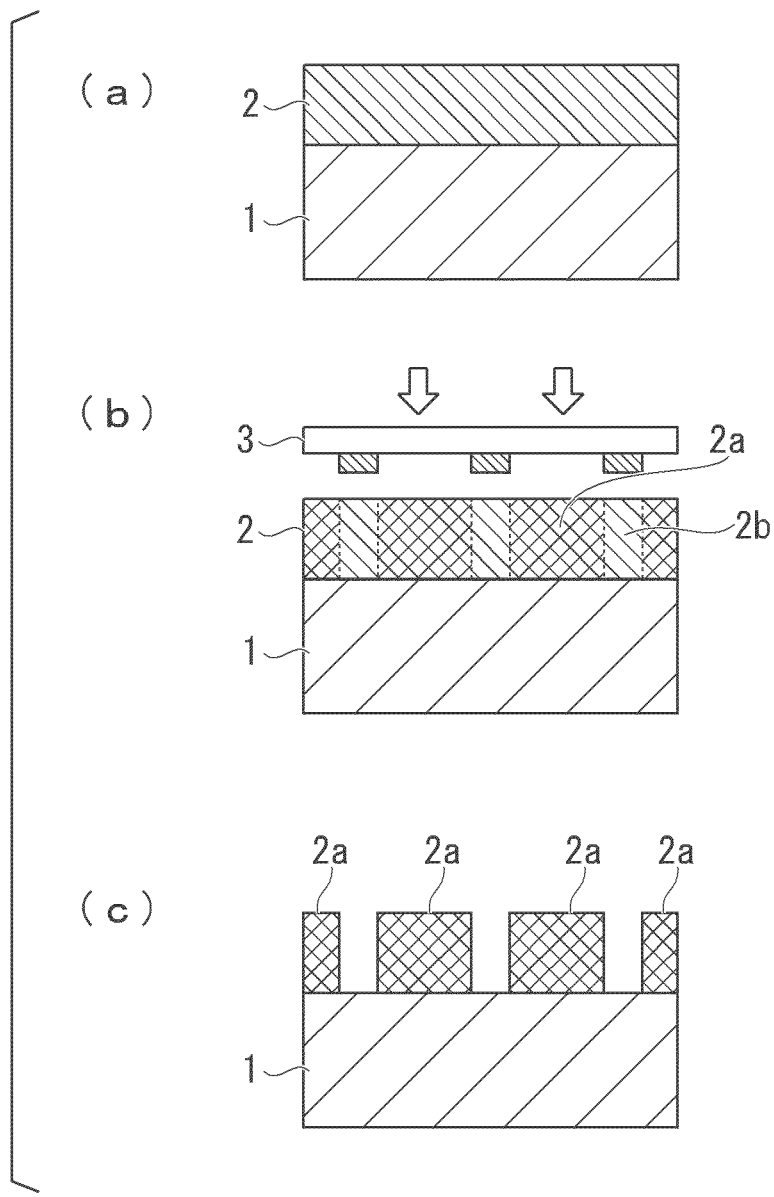
FIG. 1 is a schematic diagram showing one embodiment of the step (1) in the method of forming a pattern according to the present invention.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group within an alkoxy group.

The term "alkylene group" includes linear, branched or cyclic, divalent saturated hydrocarbon, unless otherwise specified.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with fluorine atom(s).

The term "structural unit" refers to a monomer unit that contributes to the formation of a polymeric compound (resin, polymer, copolymer).

The expression "may have a substituent" means that a case where a hydrogen atom (—H) is substituted with a monovalent group, or a case where a methylene (—CH$_2$—) group is substituted with a divalent group.

The term "exposure" is used as a general concept that includes irradiation with any form of radiation.

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid (CH$_2$=CH—COOH) has been substituted with an organic group.

The acrylate ester may have the hydrogen atom bonded to the carbon atom on the α-position substituted with a substituent. The substituent ($R^{\alpha 0}$) that substitutes the hydrogen atom bonded to the carbon atom on the α-position is an atom other than hydrogen or a group, and examples thereof include an alkyl group of 1 to 5 carbon atoms and a halogenated alkyl group of 1 to 5 carbon atoms. Further, an acrylate ester having the hydrogen atom bonded to the carbon atom on the α-position substituted with a substituent ($R^{\alpha 0}$) which has been substituted with a substituent containing an ester bond (e.g., an itaconic acid diester), or an acrylic acid having the hydrogen atom bonded to the carbon atom on the α-position substituted with a substituent ($R^{\alpha 0}$) which has been substituted with a hydroxyalkyl group or a group in which the hydroxy group within a hydroxyalkyl group has been modified (e.g., α-hydroxyalkyl acrylate) can be mentioned as an acrylate ester having the hydrogen atom bonded to the carbon atom on the α-position substituted with a substituent. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from acrylamide" refers to a structural unit that is formed by the cleavage of the ethylenic double bond of acrylamide.

The acrylamide may have the hydrogen atom bonded to the carbon atom on the α-position substituted with a substituent, and may have either or both terminal hydrogen atoms on the amino group of acrylamide substituted with a substituent. A carbon atom on the α-position of an acrylamide refers to the carbon atom bonded to the carbonyl group, unless specified otherwise.

As the substituent which substitutes the hydrogen atom on the α-position of acrylamide, the same substituents as those described above for the substituent ($R^{\alpha 0}$) on the α-position of the aforementioned α-substituted acrylate ester can be mentioned.

A "structural unit derived from hydroxystyrene or a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and which may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) of hydroxystyrene refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include vinylbenzoic acid in which the hydrogen atom of the carboxy group has been substituted with an organic group and which may have the hydrogen atom on the α-position substituted with a substituent; and vinylbenzoic acid which has a substituent other than a hydroxy group or carboxy group bonded to the benzene ring and may have the hydrogen atom on the α-position substituted with a substituent. Here, the α-position (carbon atom on the α-position) of vinylbenzoic acid refers to the carbon atom having the benzene ring bonded thereto, unless specified otherwise.

The term "styrene" includes styrene itself and compounds in which the hydrogen atom at the α-position of styrene has been substituted with another substituent such as an alkyl group or a halogenated alkyl group.

A "structural unit derived from styrene or a styrene derivative" refers to a structural unit that is formed by the cleavage of the ethylenic double bond of styrene or a styrene derivative.

The term "styrene derivative" includes styrene which has a substituent other than a hydroxyl group or carboxy group bonded to the benzene ring of styrene which may have a hydrogen atom substituted with a substituent at the α-position, provided that the aforementioned hydroxystyrene derivative and vinylbenzoic acid derivative are excluded from the definition of the styrene derivative.

As the alkyl group as a substituent on the α-position, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

(Method of Forming a Pattern)

The method of forming a pattern of the present invention, including: a step (1) in which a resist composition which exhibits decreased solubility in an organic solvent upon exposure is applied to a substrate to form a first resist film, the first resist film is subjected to exposure, and the exposed first resist film is subject to patterning by negative-tone developing using a developing solution containing an organic solvent to form a first resist pattern; and a step (2) in which a pattern reversing composition containing an organic solvent which does not dissolve the first resist pattern is applied to the substrate on which the first resist pattern has been formed, so as to form a pattern reversing film, and the obtained pattern reversing film is subjected to alkali developing treatment using an alkali developing solution to remove the first resist pattern and to conduct patterning of the pattern reversing film, so as to form a reversed pattern of the first resist pattern.

Hereinbelow, the method of forming a pattern according to the present invention will be described, with reference to the drawings. However, the present invention is not limited to these embodiments.

Figure 2:
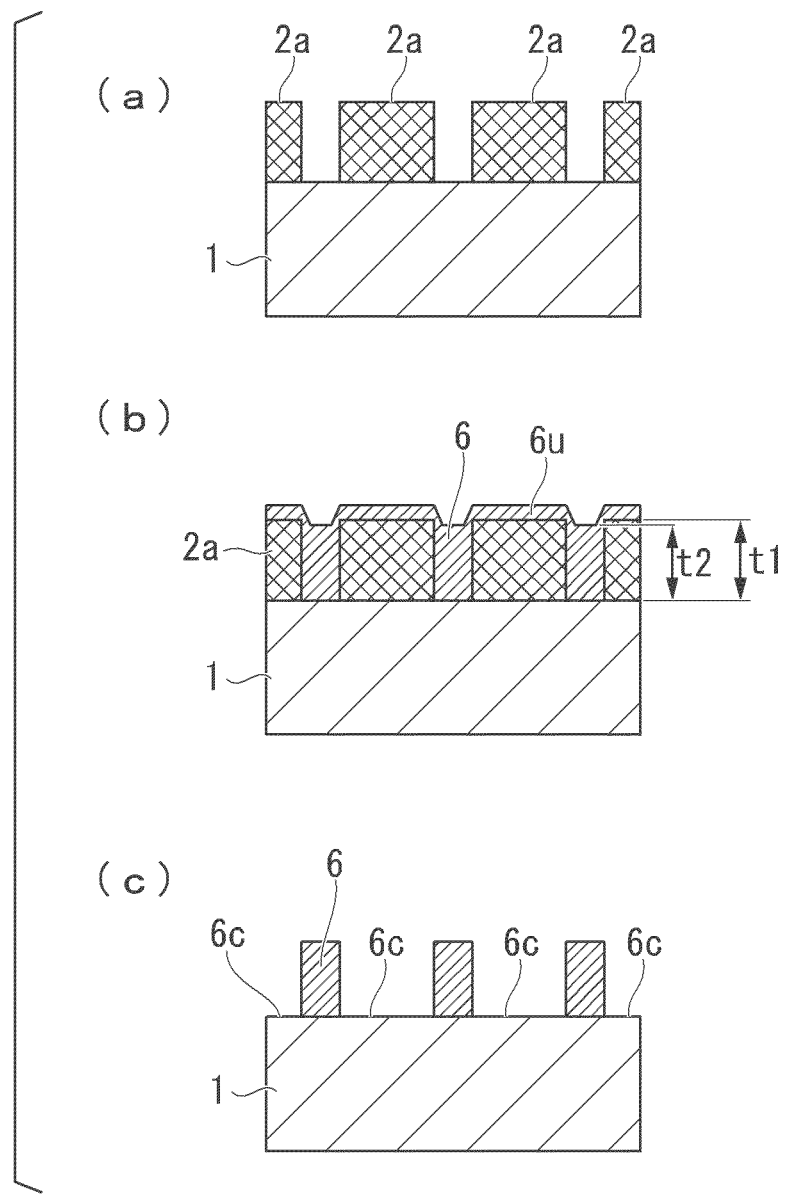
FIG. 2 is a schematic diagram showing one embodiment of the step (2) in the method of forming a pattern according to the present invention.

FIGS. 1 and 2 shows examples of one embodiment of the method of forming a pattern according to the present invention.

In the present embodiment, the step (1) is conducted in the manner as shown in FIG. 1.

In the present embodiment, firstly, as shown in FIG. 1(a), a resist composition that exhibits decreased solubility in an organic solvent upon exposure is applied to a substrate 1 to form the first resist film 2.

Next, as shown in FIG. 1(b), the first resist film 2 is subjected to exposure through a photomask 3 having a predetermined pattern formed thereon. Then, the first resist film 2 is subjected to post exposure bake (PEB). As a result, in the first resist film 2, the solubility of the exposed region (exposed portions 2a) in an organic solvent is decreased. On the other hand, the solubility of the unexposed region (unexposed portions 2b) in an organic solvent is either unchanged or only slightly changed, so that there is a difference between the exposed portions 2a and the unexposed portions 2b in terms of solubility in a developing solution (i.e., dissolution contrast can be observed). By conducting development using a developing solution containing an organic solvent (organic developing solution), the exposed portions 2a of the resist film 2 remain, and the unexposed portions 2b of the first resist film 2 are dissolved and removed. As a result, as shown in FIG. 1(c), a resist pattern (first resist pattern) including a plurality of exposed portions 2a arranged at intervals is formed on the substrate 1.

Next, the step (2) is conducted in the manner as shown in FIG. 2.

In the step (2), to form a pattern reversing film 6 which fills in the concave portions formed between the plurality of exposed portions 2a, a pattern reversing composition containing an organic solvent which does not dissolve the first resist pattern is applied to the substrate 1 on which the first resist pattern composed of a plurality of exposed portions 2a has been formed (FIG. 2(b)).

Next, by conducting developing using an alkali developing solution, the first resist pattern is removed, but the pattern reversing film 6 which has filled in the concave portions formed between the plurality of exposed portions 2a is not removed and retained. In the pattern reversing film 6, portions formed on the exposed portions 2a have a thin thickness, so that the portions are removed as well as the exposed portions 2a by alkali development. As a result, as shown in FIG. 2(c), the portions where the first pattern had been present becomes space portions 6c, and thereby forming a pattern (reversed pattern) which has a reversed image of the first resist pattern.

Each of these steps (1) and (2) will be described in more detail below.

[Step (1)]

In the step (1), a resist composition which exhibits decreased solubility in an organic solvent upon exposure is applied to a substrate to form a first resist film, the first resist film is subjected to exposure, and the exposed first resist film is subject to patterning by negative-tone developing using a developing solution containing an organic solvent to form a first resist pattern.

The method for forming the first resist pattern can be performed, for example, as follows.

Firstly, a resist composition that exhibits decreased solubility in an organic solvent upon exposure is applied to a substrate 1 by a conventional method such as using a spinner or the like, and a bake treatment (post applied bake (PAB)) is conducted at a temperature of 80 to 150° C. for 40 to 120 seconds, preferably 50 to 90 seconds, to form a first resist film 2.

The resist composition will be described later in detail.

The thickness of the first resist film 2 is preferably within the range from 50 to 500 nm, and more preferably from 50 to 450 nm. By ensuring the film thickness of the first resist pattern 2 within the aforementioned range, the first resist pattern having a high resolution can be formed.

Subsequently, the first resist film 2 is subjected to selective exposure, either by exposure through a photomask 3 having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a photomask 3.

Following exposure, baking treatment (post exposure baking (PEB)) is preferably conducted under temperature conditions of 80 to 150° C. for 40 to 120 seconds, and preferably 50 to 90 seconds.

After selective exposure and bake treatment (PEB), the first resist film 2 is subjected to negative-tone development. The negative-tone developing treatment is performed using a developing solution containing an organic solvent (i.e., organic developing solution).

In the method of forming a resist pattern in this embodiment, the first resist pattern is formed through patterning by negative development. As a result, a pattern having high resolution is formed, even when the region where the optical strength becomes weak is likely to be generated especially in the film thickness direction of exposed portions 2a of the first resist film 2.

After the negative-tone developing treatment, it is preferable to conduct a rinse treatment. With respect to the rinse treatment, It is preferable to perform a rinse treatment using a rinse liquid containing an organic solvent. After the negative-tone developing treatment or the rinsing, the organic developing solution or the rinse liquid remaining on the resist pattern can be removed by a treatment using a supercritical fluid.

After the negative-tone developing treatment or the rinse treatment, drying is conducted. If desired, bake treatment (post bake) can be conducted following the negative-tone developing treatment.

By the aforementioned procedure, the first resist pattern including a plurality of exposed portions 2a arranged at intervals is formed on the substrate 1.

The substrate 1 is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate 1, any one of the above-mentioned substrates provided with an inorganic and/or organic film on the surface thereof may be used. As the inorganic film, an inorganic anti-reflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film is formed (triple-layer resist method).

An inorganic film can be formed, for example, by coating an in organic anti-reflection film composition such as a silicon-based material on a substrate, followed by baking.

An organic film can be formed, for example, by dissolving a resin component and the like for forming the film in an organic solvent to obtain an organic film forming material, coating the organic film forming material on a substrate using a spinner or the like, and baking under heating conditions preferably in the range of 200 to 300° C. for 30 to 300 seconds, more preferably for 60 to 180 seconds.

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The method of forming a pattern of the present embodiment is effective to KrF excimer laser, ArF excimer laser, EB and EUV, and particularly effective to ArF excimer laser, EB and EUV.

With respect to exposure dose, a suitable level capable of reducing the solubility of the exposed portions 2a of the first resist film 2 in an organic developing solution can be employed. In general, the optimum exposure dose (Eop) of the first resist film 2 is employed. The term "optimum exposure dose" refers to an exposure dose at which a resist pattern having a predetermined dimension can be faithfully reproduced by selective exposure of the resist film, PEB treatment at a predetermined bake temperature and developing treatment.

The photomask 3 is not particularly limited, and a conventional mask can be used. For example, a binary mask in which the transmittance of the light shielding portion is 0% or a halftone-phase shift mask (HT-mask) in which the transmittance of the light shielding portion is 6% can be used.

As a binary mask, those in which a chromium film, a chromium oxide film, or the like is formed as a light shielding portion on a quartz glass substrate are generally used.

Examples of the half-tone type phase shift masks include those in which a MoSi (molybdenum silicide) film, a chromium film, a chromium oxide film, an oxynitriding silicon film, or the like is formed, as a light shielding portion on a substrate generally made of quartz glass.

In the present embodiment, exposure is conducted through a photomask 3, but the present invention is not limited to this embodiment. For example, the exposure may be conducted without using a mask, e.g., selective exposure by drawing with electron beam (EB) or the like.

The exposure of the first resist film 2 can be either a general exposure (dry exposure) conducted in air or an inert gas such as nitrogen, or immersion exposure (immersion lithography).

In immersion lithography, the region between the first resist film 2 and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which preferably have a boiling point within a range from 70 to 180° C. and more preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

As the organic solvent contained in the organic developing solution used in a negative-tone developing process, any of the conventional organic solvents can be used, which are capable of dissolving the base component (i.e., base component prior to exposure). Specific examples of the organic solvent include polar solvents such as ketone organic solvents, ester organic solvents, alcohol organic solvents, nitrile organic solvents, amide organic solvents and ether organic solvents, and hydrocarbon organic solvents.

In the present invention, a ketone organic solvent is an organic solvent containing C—C(=O)—C within the structure thereof. An ester organic solvent is an organic solvent containing C—C(=O)—O—C within the structure thereof.

An alcohol organic solvent is an organic solvent containing an alcoholic hydroxy group within the structure thereof, and an "alcoholic hydroxy group" refers to a hydroxy group bonded to a carbon atom of an aliphatic hydrocarbon group. A nitrile organic solvent is an organic solvent containing a nitrile group in the structure thereof. An amide organic solvent is an organic solvent containing an amide group within the structure thereof. An ether organic solvent is an organic solvent containing C—O—C within the structure thereof.

Some organic solvents have a plurality of the functional groups which characterizes the aforementioned solvents within the structure thereof. In such a case, the organic solvent can be classified as any type of the solvent having the characteristic functional group. For example, diethyleneglycol monomethylether can be classified as either an alcohol organic solvent or an ether organic solvent.

A hydrocarbon organic solvent consists of a hydrocarbon which may be halogenated, and does not have any substituent other than a halogen atom. Examples of the halogen atom include a fluorine atom, a chlorine atom, a bromine atom and an iodine atom, and a fluorine atom is preferable.

Among these, in terms of ensuring a resist pattern having high resolution, the organic developing solution used in the negative-tone development preferably contains at least one organic solvent selected from the group consisting of ester organic solvents and ketone organic solvents, and more preferably an ester organic solvent.

Examples of ester organic solvents include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate and propyl-3-methoxypropionate.

Among these, as an ester organic solvent, butyl acetate is preferable.

Examples of ketone organic solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonyl acetone, ionone, diacetonylalcohol, acetylcarbinol, acetophenone, methyl naphthyl ketone, isophorone, propylenecarbonate, γ-butyrolactone and methyl amyl ketone (2-heptanone).

As a ketone organic solvent, methyl amyl ketone (2-heptanone) is preferable.

If desired, the organic developing solution may have a conventional additive blended. Examples of the additive include surfactants. The surfactant is not particularly limited, and for example, an ionic or non-ionic fluorine and/or silicon surfactant can be used.

As the surfactant, a non-ionic surfactant is preferable, and a fluorine surfactant or a silicon surfactant is more preferable.

When a surfactant is added, the amount thereof based on the total amount of the organic developing solution is generally 0.001 to 5% by weight, preferably 0.005 to 2% by weight, and more preferably 0.01 to 0.5% by weight.

The negative-tone developing treatment can be performed by a conventional developing method. Examples thereof include a method in which the substrate 1 is immersed in the developing solution for a predetermined time (a dip method), a method in which the developing solution is cast up on the surface of the substrate 1 by surface tension and maintained for a predetermined period (a puddle method), a method in which the developing solution is sprayed onto the surface of the substrate 1 (spray method), and a method in which the developing solution is continuously ejected from a developing solution ejecting nozzle while scanning at a constant rate to apply the developing solution to the substrate 1 while rotating the substrate at a constant rate (dynamic dispense method).

As the organic solvent contained in the rinse liquid used in the rinse treatment after the developing treatment in the case of a negative-tone developing process, any of the aforementioned organic solvents contained in the organic developing solution can be used which hardly dissolves the resist pattern. In general, at least one solvent selected from the group consisting of hydrocarbon organic solvents, ketone organic solvents, ester organic solvents, alcohol organic solvents, amide organic solvents and ether organic solvents is used. Among these, at least one solvent selected from the group consisting of hydrocarbon organic solvents, ketone organic solvents, ester organic solvents, alcohol organic solvents and amide organic solvents is preferable, more preferably at least one solvent selected from the group consisting of ester organic solvents and ketone organic solvents, and an ester organic solvent is particularly desirable.

These organic solvents can be used individually, or at least 2 solvents may be mixed together. Further, an organic solvent other than the aforementioned examples or water may be mixed together. However, in consideration of the development characteristics, the amount of water within the rinse liquid, based on the total amount of the rinse liquid is preferably 30% by weight or less, more preferably 10% by weight or less, still more preferably 5% by weight or less, and most preferably 3% by weight or less.

If desired, the rinse solution may have a conventional additive blended. Examples of the additive include surfactants. As the surfactant, the same surfactants as those described above can be mentioned, and a non-ionic surfactant is preferable, and a fluorine surfactant or a silicon surfactant is more preferable.

When a surfactant is added, the amount thereof based on the total amount of the rinse liquid is generally 0.001 to 5% by weight, preferably 0.005 to 2% by weight, and more preferably 0.01 to 0.5% by weight.

The rinse treatment using a rinse liquid (washing treatment) can be conducted by a conventional rinse method. Examples of the rinse method include a method in which the rinse liquid is continuously applied to the substrate 1 while rotating it at a constant rate (rotational coating method), a method in which the substrate 1 is immersed in the rinse liquid for a predetermined time (dip method), and a method in which the rinse liquid is sprayed onto the surface of the substrate 1 (spray method).

[Step (2)]

In the step (2), a pattern reversing composition containing an organic solvent which does not dissolve the first resist pattern is applied to the substrate on which the first resist pattern has been formed in the step (1), to form a pattern reversing film, and the obtained pattern reversing film is subjected to alkali developing treatment using an alkali developing solution to remove the first resist pattern and to conduct patterning of the pattern reversing film to form a reversed pattern of the first resist pattern.

For example, by a conventional method such as using a spinner, the pattern reversing composition is applied to a substrate 1 on which a first resist pattern has been formed, and then bake treatment (prebake) is conducted and an organic solvent is volatilized, thereby forming a pattern reversing film 6 which fills in the concave portion formed between a plurality of exposed portions 2a.

The baking temperature (prebaking temperature) may be appropriately adjusted depending on the composition of the pattern reversing composition to be used, and is preferably 60° C. or more, more preferably 80° C. or more, and still more preferably 90 to 130° C.

The baking time is preferably 40 to 120 seconds, and more preferably 60 to 90 seconds.

In the present invention, the thickness t2 of the pattern reversing film 6 (the minimum value of the film thickness of the portion filling the concave portion formed between exposed portions 2a) may be appropriately adjusted depending on the dissolution rate of the pattern reversing film in an alkali developing solution.

When the dissolution rate of the pattern reversing film 6 in an alkali developing solution is slightly fast, it is preferable that the film thickness t2 of the pattern reversing film 6 is thicker than the height of exposed portions 2a (i.e., thicker than film thickness t1 of the first resist pattern) (t2>t1). When the dissolution rate of the pattern reversing film 6 in an alkali developing solution is slightly slow, it is preferable that the film thickness t2 of the pattern reversing film 6 is substantially the same as the height of exposed portions 2a or is thinner than that of exposed portions 2a (t2≤t1). When the latter relationship (t2≤t1) is fulfilled, the thickness of the pattern reversing film 6u which covers the upper surface of exposed portions 2a becomes thin enough to remove easily during alkali development. The pattern reversing film 6u (film formed on exposed portions 2a) is a thin film, and therefore, thickness loss of the pattern reversing film 6u is likely to occur during alkali development. As a result, the pattern reversing film 6u is dissolved and removed as well as exposed portions 2a during alkali development. Therefore, a reversed pattern is satisfactorily formed.

When the thickness of the pattern reversing film 6 is too large even though the dissolution rate of the pattern reversing film 6 in an alkali developing solution is slow (or developing time is short), the pattern reversing film 6u formed on the exposed portion 2a is not sufficiently removed by alkali developing in the step (2). On the other hand, when the thickness of the pattern reversing film 6 is too small even though the dissolution rate of the pattern reversing film 6 in an alkali developing solution is fast (or developing time is long), not only the exposed portion 2a but also the pattern reversing film 6 are dissolved and removed by alkali developing in the step (2), and hence, an excellent reversed pattern is less likely to be formed.

The formation of pattern reversing film 6 is preferably conduced, so that the relationship between the film thickness of the first resist pattern t1 and the film thickness of the pattern reversing film t2 represented by "thickness t2/thickness t1" fulfills the following range. That is, the relationship thickness t2/thickness t1=0.5 to 1.5 is preferable, and 0.5 to 1.3 is more preferable, and 0.55 to 1.25 is still more preferable.

By forming a pattern reversing film 6 such that the relationship thickness t2/thickness t1 becomes within the preferable range, the first resist pattern is sufficiently removed by alkali development using an alkali developing solution, and a residual image of the pattern reversing film 6 is likely to be formed with a predetermined film thickness.

To form a pattern reversing film 6 such that the film has a predetermined film thickness t2, it is preferable that, when the pattern reversing composition is applied to the substrate 1, the number of revolution of the substrate 1 is appropriately controlled, taking into consideration the viscosity and temperature of the pattern reversing composition.

Subsequently, following formation of the pattern reversing film 6, alkali developing is conducted. As described above, by controlling the dissolution rate of the pattern reversing film 6 in an alkali developing solution and the film thickness t2 (further, by adjusting developing time) appropriately, after alkali development, a portion (pattern reversing film 6u) of the pattern reversing film 6, which has been formed on upper surface of exposed portions 2a, is removed. The exposed portions 2a are removed together with the pattern reversing film 6u. In contrast, the pattern reversing film 6 which has filled in the concave portions formed between the exposed portions 2a remains to form a pattern image. As a result, as shown in FIG. 2(c), the portion where the removed exposed portions 2a had been present becomes space portions 6c, and thereby forming a pattern (reversed pattern) which has a reversal image of the first resist pattern.

When the first resist pattern is a line pattern, a space pattern as a reversed pattern is formed, which is present at the same position of the line pattern and has substantially the same dimension (space width) as the dimension (line width) of the line pattern. When the first resist pattern is a dot pattern, a hole pattern as a reversed pattern is formed, which is present at the same position of the dot pattern and has substantially the same dimension (hole diameter) as the dimension (dot dimension) of the dot pattern.

The alkali developing can be conducted by a conventional method, for example, using a tetramethylammonium hydroxide (TMAH) solution having a concentration of 0.1 to 10% by weight. The temperature condition is preferably 20 to 30° C., and the developing time is preferably 5 to 90 seconds. The alkali developing of the pattern reversing film 6 can be conducted, for example, by using a tetramethylammonium hydroxide (TMAH) solution having a concentration of 2.38% by weight at 23° C. The developing time (including immersion, application using a nozzle) and is preferably 10 to 30 seconds.

In the alkali development of the step (2), the dissolution rate of the pattern reversing film 6 in an alkali developing solution is preferably 1.0 to 3.5 nm/s, more preferably 1.0 to 3.0 nm/s, and still more preferably 1.1 to 3.0 nm/s.

When the dissolution rate is no less than the lower limit of the above preferable range, the film reduction appropriately occur, and as described later, the pattern reversing film 6u formed on exposed portions 2a is dissolved and removed together with the exposed portions 2a during alkali development, thereby forming a reversed pattern having an excellent resolution. When the dissolution rate is no more than the upper limit of the above preferable range, the film is not excessively dissolved in an alkali developing solution, and after alkali development, a pattern reversing film 6 having a predetermined shape is likely to be formed.

The dissolution rate can be controlled depending on the type of base component (A") described later or the combination of the base component (A") and other components (for example, dissolution inhibitor component).

In the present invention, the "dissolution rate in an alkali developing solution" is a dissolution rate determined when a pattern reversing film 6 is subjected to alkali development in the same manner as in the alkali development of the step (2). For example, the dissolution rate is a value determined in accordance with the following method.

[Method of Determining Dissolution Rate in Alkaline Developing Solution]

To a substrate such as silicon substrate, a pattern reversing composition is applied uniformly using a spinner, then prebake (PAB) treatment is conducted to form a pattern reversing film. Next, the pattern reversing film is subjected to alkali development, and the dissolution rate (reduced film thickness per unit time, unit: nm/s) of the pattern reversing film in the alkali development is measured using NanoSpec (manufactured by Nanometrics Inc.).

After the alkali developing, a rinse treatment using pure water or the like can be conducted.

Further, after the alkali developing, post bake treatment may be conducted.

Post bake (which is performed in order to remove water content after the alkali developing and rinsing) is generally conducted at about 120 to 160° C. preferably for 30 to 90 seconds.

In this embodiment, by forming a line pattern and/or dot pattern as a first resist pattern, a space pattern and/or a hole pattern can be formed as a reversed pattern.

The space pattern or hole pattern formed as a reversed pattern has excellent resolution, shape and lithography margin (e.g., margin with respect to the exposure amount (EL margin), margin with respect to the depth of focus (DOF margin), verticality of the pattern shape), as compared to the pattern directly formed by one time lithography process.

When a space pattern or hole pattern is directly formed, in which a fine region (a part of the resist film) needs to be removed, as described above, it becomes necessary to form a resist pattern using a weak incident light, and therefore, pattern formation capability is severely restricted. In contrast, in the step (1) of this embodiment, a resist pattern (negative-tone resist pattern) is formed through a negative-tone development. As a result, the region where the optical strength becomes weak is dissolved and removed selectively. Therefore, a fine pattern is satisfactorily formed. Furthermore, the pattern formation capability of forming a reversed pattern in the step (2) according to this embodiment depends on the pattern formation capability of forming a first resist pattern (isolated line pattern, dot pattern, line and space pattern) in the step (1). Therefore, there is almost no restriction in the pattern formation capability as compared to the case where a space pattern or hole pattern is directly formed. According to the method of forming a pattern, including the step (1) and the step (2), a fine pattern (space pattern, hole pattern (particularly, hole pattern having more dense pitch)) having a high resolution and an excellent shape can be formed.

In the method of forming a pattern of this embodiment, by applying the pattern reversing composition in the step (2), the first resist pattern can be removed by an alkali development in the step (2). Therefore, according to the method of forming a pattern of this embodiment, both exposure and post exposure bake are not required, and a reversed pattern can be formed just by alkali development, as compared with twice patterning process in double patterning process. The method of forming a pattern can reduce the number of steps and is a simple method to improve through-put, as compared to a conventional double patterning process.

In the method of forming a pattern, the resist composition used in the step (1) is not restricted, as compared to the specific resist composition which can form a crosslink (see Patent Document 2). A conventional chemically amplified composition can be used without modification. As a pattern reversing composition, resin components which have been proposed may be used.

According to the method of forming a pattern of the present invention, when the first resist film is formed in the step (1), A plurality of exposure processes can be conducted, and therefore, patterns having various shapes can be formed. According to the method of forming a pattern of the present invention, a reversed pattern of a large area pattern can be formed, which is difficult to form by the conventional method.

In the present invention, the step (2) may be conducted using a resist pattern which has been subjected to twice or more normal patterning process (the resist pattern is formed through double patterning process).

As a result, a further dense with a narrow pitch or a pattern with a complicated shape can be formed.

In the present invention, after the patterning step (2), the substrate 1 can be subjected to etching treatment using the pattern as a mask. By etching the substrate 1, a semiconductor device or the like can be produced.

The etching can be conducted by a conventional method (e.g., dry etching, wet etching). For example, etching of an organic film (resist pattern, organic antireflection film or the like) is preferably performed by dry etching. Among dry etching, oxygen-plasma etching or etching using $CF_4$ gas or a $CHF_3$ gas is preferable, and oxygen-plasma etching is particularly desirable. Etching of the substrate or inorganic antireflection film is preferably performed using a halogen gas, more preferably using a fluorinated carbon-based gas, and most preferably using a $CF_4$ gas or a $CHF_3$ gas.

<Resist Composition>

The resist composition used in a method of forming a pattern is a resist composition that exhibits decreased solubility in an organic developing solution upon exposure.

As such a resist composition, a resist composition that generates acid upon exposure and includes a base component (A) which exhibits decreased solubility in an organic solvent contained in an organic developing solution under action of acid (hereafter, referred to as "component (A)") can be mentioned.

When a resist film is formed using the resist composition and the formed resist film is subjected to a selective exposure, acid is generated at exposed portions of the resist film, and the generated acid acts on the component (A) to decrease the solubility of the component (A) in an organic solvent contained in an organic developing solution, whereas the solubility of the component (A) in an organic solvent contained in an organic developing solution is not changed at unexposed portions of the resist film, thereby generating difference in solubility in an organic solvent contained in an organic developing solution between exposed portions and unexposed portions. Therefore, by subjecting the resist film to development using an organic developing solution, the unexposed portions of the resist film are dissolved and removed, thereby forming a negative-tone resist pattern.

The resist composition has a function of generating acid upon exposure, and in the resist composition, the component (A) may generate acid upon exposure, or an additive component other than the component (A) may generate acid upon exposure.

Specific examples of the resist composition include:

a resist composition (1) containing an acid generator component (B) which generates acid upon exposure (hereafter, referred to as "component (B)");

a resist composition (2) in which the component (A) is a component which generates acid upon exposure; or a resist composition (3) in which the component (A) is a component which generates acid upon exposure, and further containing an acid generator component (B).

That is, when the resist composition is the aforementioned resist composition (2) or (3), the component (A) is a "base component which generates acid upon exposure and exhibits decreased solubility in an organic solvent contained in an organic developing solution under action of acid". When the resist composition is the aforementioned resist composition (2) or (3), the component (A1) described later is a "polymeric compound which generates acid upon exposure and exhibits decreased solubility in an organic solvent contained in an organic developing solution under action of acid". As the polymeric compound, a resin having a structural unit which generates acid upon exposure can be used. As the structural unit which generates acid upon exposure, a conventional structural unit can be used.

The resist composition is particularly preferably the aforementioned resist composition (1).

<<Component (A)>>

In the present invention, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compound used as the base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. Hereafter, a "polymeric compound" or a "resin" refers to a polymer having a molecular weight of 1,000 or more.

As the molecular weight of the polymer, the weight average molecular weight in terms of the polystyrene equivalent value determined by gel permeation chromatography (GPC) is used.

The component (A) preferably contains a polymeric compound including a structural unit (a1) containing an acid decomposable group that exhibits increased polarity by the action of acid (hereafter, this polymeric compound is referred to as "component (A1)"). Other polymeric compounds and/or low-molecular compounds may be used in combination with the component (A1).

Component (A1)

The component (A1) has a structural unit (a1) containing an acid decomposable group that exhibits increased polarity by the action of acid.

When the resist film formed using the resist composition containing the component (A1) is subjected to exposure, in the structural unit (a1), at least a part of the bond within the structure thereof is cleaved by the action of acid to exhibit increased polarity. Therefore, the resist composition of the present embodiment becomes a negative type in the case of using an organic developing solution as a developing solution (negative-tone developing process), and a positive type in the case of using an alkali developing solution as a developing solution (alkali developing process). Since the polarity of the component (A1) is changed prior to and after exposure, by using the component (A1), an excellent development contrast can be achieved not only in an alkali developing process, but also in a solvent developing process.

That is, in the case of a solvent developing process, the component (A1) exhibits high solubility in an organic developing solution prior to exposure, and when acid is generated upon exposure, the polarity of the component (A1) is increased by the action of the generated acid, thereby decreasing the solubility of the component (A1) in an organic developing solution. Therefore, in the formation of a resist pattern, by conducting selective exposure of a resist film formed by applying the resist composition to a substrate, the exposed portions changes from an soluble state to an insoluble state in an organic developing solution, whereas the unexposed portions remain soluble in an organic developing solution. As a result, by conducting development using an organic developing solution, a contrast can be made between the exposed portions and unexposed portions, thereby enabling the formation of a negative resist pattern.

Structural Unit (a1):

The structural unit (a1) is a structural unit containing an acid decomposable group that exhibits increased polarity by the action of acid.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of acid to form a polar group.

Examples of the polar group include a carboxy group, a hydroxy group, an amino group and a sulfo group (—$SO_3H$). Among these, a polar group containing —OH in the structure thereof (hereafter, frequently referred to as "OH-containing polar group") is preferable, a carboxy group or a hydroxy group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

Here, the "acid dissociable group" includes:

(i) a group in which the bond between the acid dissociable group and the adjacent atom is cleaved by the action of acid; and (ii) a group in which one of the bonds is cleaved by the action of acid, and then a decarboxylation reaction occurs, thereby cleaving the bond between the acid dissociable group and the adjacent atom.

It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. By the increase in the polarity, the solubility in a developing solution changes and, the solubility in an organic developing solution is relatively decreased.

The acid dissociable group is not particularly limited, and any of the groups that have been conventionally proposed as acid dissociable groups for the base resins of chemically amplified resists can be used.

Examples of the acid dissociable group for protecting the carboxy group or hydroxy group as a polar group include the acid dissociable group represented by general formula (a1-r-1) shown below (hereafter, sometimes referred to as "acetal-type acid dissociable group").

[Chemical Formula 1]

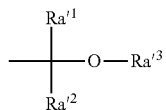

(a1-r-1)

In the formula, $Ra'^1$ and $Ra'^2$ represents a hydrogen atom or an alkyl group; and $Ra'^3$ represents a hydrocarbon group, provided that $Ra'^3$ may be bonded to $Ra'^1$ or $Ra'^2$ to form a ring.

In the formula (a1-r-1), as the alkyl group for $Ra'^1$ and $Ra'^2$, the same alkyl groups as those described above for the alkyl groups as the substituent which may be bonded to the carbon atom on the α-position of the aforementioned α-substituted alkylester can be used, although a methyl group or ethyl group is preferable, and a methyl group is particularly desirable.

As the hydrocarbon group for $Ra'^3$, an alkyl group of 1 to 20 carbon atoms is preferable, an alkyl group of 1 to 10 carbon atoms is more preferable, and a linear or branched alkyl group is still more preferable. Specific examples thereof include a methyl group, an ethyl group, a propyl group, an isopropyl group, an n-butyl group, an isobutyl group, a tert-butyl group, a pentyl group, an isopentyl group, a neopentyl group, 1,1-dimethylethyl group, 1,1-diethylpropyl group, 2,2-dimethylpropyl group and 2,2-dimethylbutyl group.

When $Ra'^3$ is a cyclic hydrocarbon group, the hydrocarbon group may be either an aliphatic group or an aromatic group, and may be either a polycyclic group or a monocyclic group. As the monocyclic alicyclic hydrocarbon group, a group in which one hydrogen atom has been removed from a monocycloalkane is preferable. The monocycloalkane preferably has 3 to 8 carbon atoms, and specific examples thereof include cyclopentane, cyclohexane and cyclooctane. As the polycyclic alicyclic hydrocarbon group, a group in which one hydrogen atom has been removed from a polycycloalkane is preferable, and the polycycloalkane preferably has 7 to 12 carbon atoms. Examples of the polycycloalkane include adamantane, norbornane, isobornane, tricyclodecane and tetracyclododecane.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which one hydrogen atom has been removed from the aforementioned aromatic hydrocarbon ring (aryl group); and a group in which one hydrogen atom of the aforementioned aryl group has been substituted with an alkylene group (an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atoms, more preferably 1 or 2, and most preferably 1.

In the case where $Ra'^3$ is bonded to $Ra'^1$ or $Ra'^2$ to form a ring, the cyclic group is preferably a 4 to 7-membered ring, and more preferably a 4 to 6-membered ring. Specific examples of the cyclic group include tetrahydropyranyl group and tetrahydrofuranyl group.

Examples of the acid dissociable group for protecting the carboxy group as a polar group include the acid dissociable group represented by general formula (a1-r-2) shown below (hereafter, with respect to the acid dissociable group represented by the following formula (a1-r-2), the acid dissociable group constituted of alkyl groups is referred to as "tertiary ester-type acid dissociable group").

[Chemical Formula 2]

(a1-r-2)

In the formula, $Ra'^4$ to $Ra'^6$ each independently represents a hydrocarbon group, provided that $Ra'^5$ and $Ra'^6$ may be mutually bonded to form a ring.

As the hydrocarbon group for $Ra'^4$ to $Ra'^6$, the same groups as those described above for $Ra'^3$ can be mentioned.

$Ra'^4$ is preferably an alkyl group of 1 to 5 carbon atoms. In the case where $Ra'^5$ and $Ra'^6$ are mutually bonded to form a ring, a group represented by general formula (a1-r2-1) shown below can be mentioned.

On the other hand, in the case where $Ra'^4$ to $Ra'^6$ are not mutually bonded and independently represent a hydrocarbon group, the group represented by general formula (a1-r2-2) shown below can be mentioned.

[Chemical Formula 3]

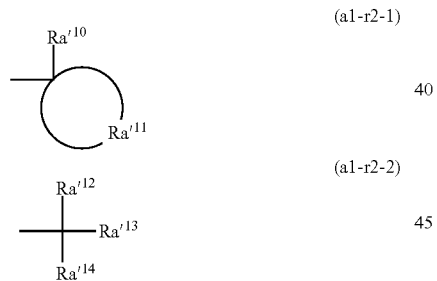

(a1-r2-1)

(a1-r2-2)

In the formulae, $Ra'^{10}$ represents an alkyl group of 1 to 10 carbon atoms; $Ra'^{11}$ is a group which forms an aliphatic cyclic group together with a carbon atom having $Ra'^{10}$ bonded thereto; $Ra'^{12}$ to $Ra'^{14}$ each independently represents an hydrocarbon group.

In the formula (a1-r2-1), as the alkyl group of 1 to 10 carbon atoms for $Ra'^{10}$, the same groups as described above for the linear or branched alkyl group for $Ra'^3$ in the formula (a1-r-1) are preferable. In the formula (a1-r2-1), as the aliphatic cyclic group which is formed by $Ra'^{11}$, the same groups as those described above for the cyclic alkyl group for $Ra'^3$ in the formula (a1-r-1) are preferable.

In the formula (a1-r2-2), it is preferable that $Ra'^{12}$ and $Ra'^{14}$ each independently represents an alkyl group or 1 to 10 carbon atoms, and it is more preferable that the alkyl group is the same group as described above for the linear or branched alkyl group for $Ra'^3$ in the formula (a1-r-1), it is still more preferable that the alkyl group is a linear alkyl group of 1 to 5 carbon atoms, and it is particularly preferable that the alkyl group is a methyl group or an ethyl group.

In the formula (a1-r2-2), it is preferable that $Ra'^{13}$ is the same group as described above for the linear, branched or cyclic alkyl group for $Ra'^3$ in the formula (a1-r-1).

Among these, the same cyclic alkyl group as those describe above for $Ra'^3$ is more preferable.

Specific examples of the group represented by formula (a1-r2-1) are shown below. The "*" in the formula represents a valence bond (the same applies below).

[Chemical Formula 4]

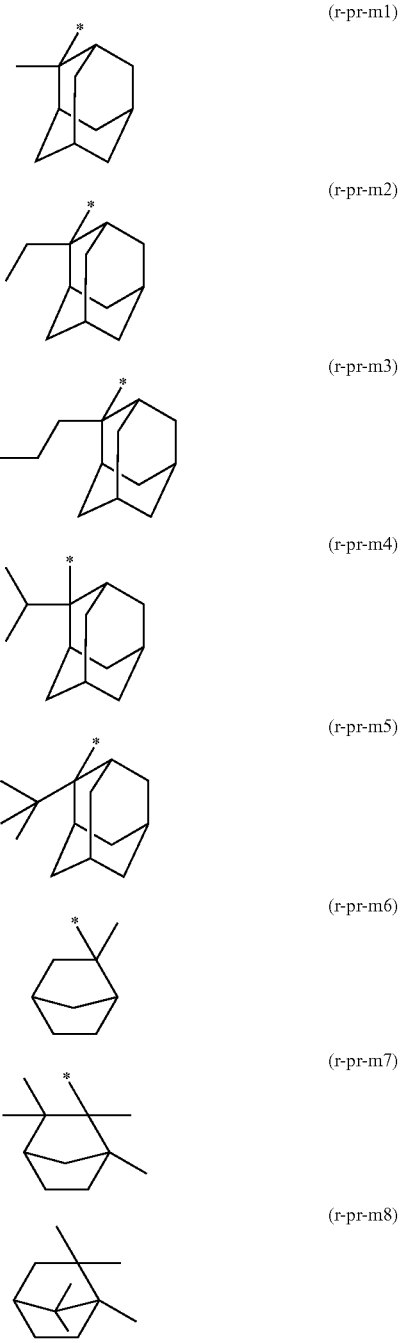

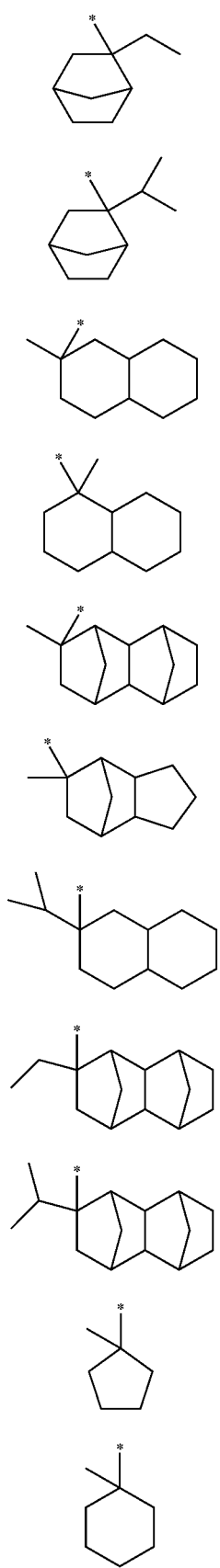
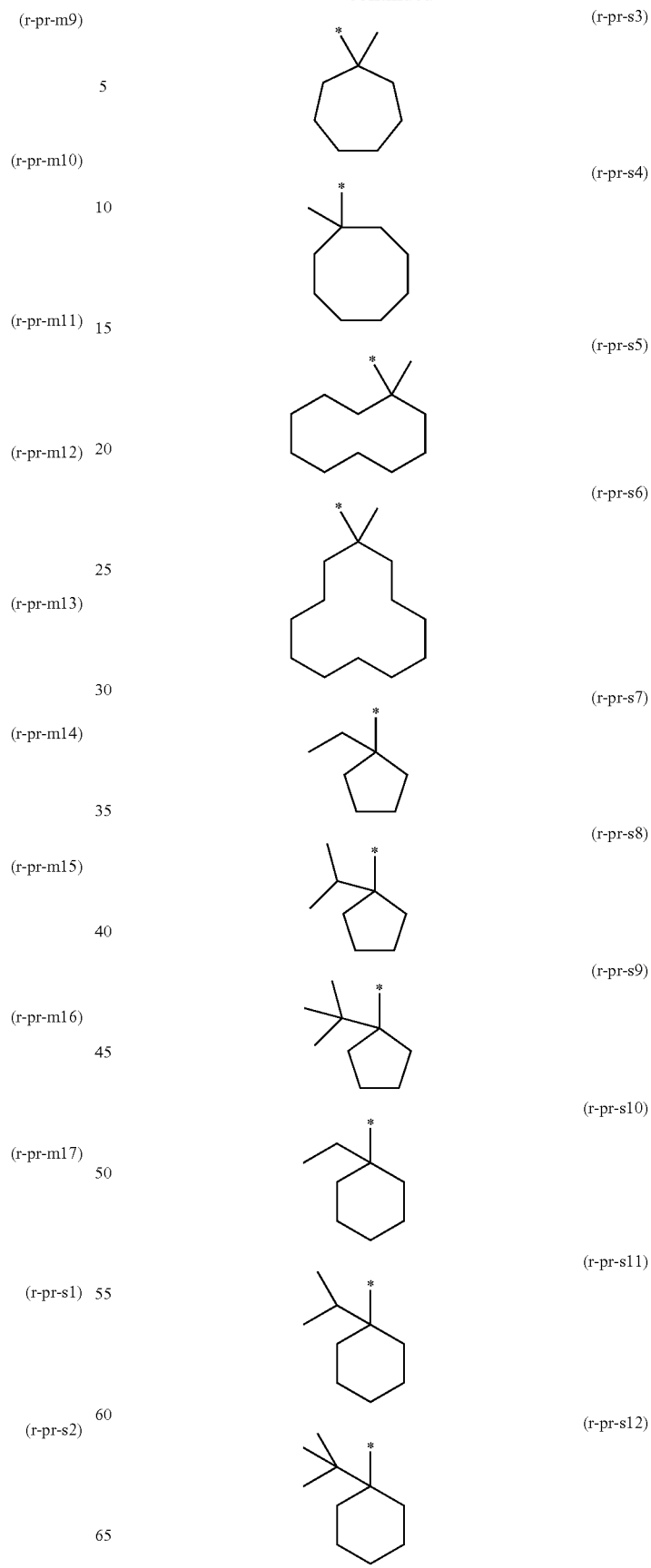

-continued
(r-pr-s13)
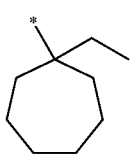
(r-pr-s14)
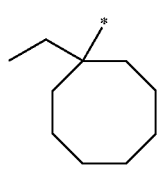
(r-pr-s15)
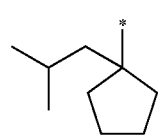
(r-pr-s16)
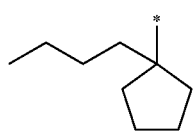
(r-pr-s17)
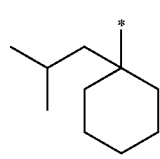
(r-pr-s18)
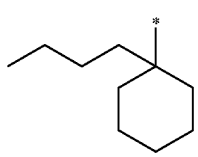
(r-pr-s19)
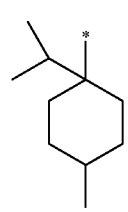
(r-pr-s20)
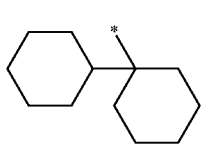
Specific examples of the group represented by formula (a1-r2-2) are shown below.
[Chemical Formula 5]
(r-pr-cm1)
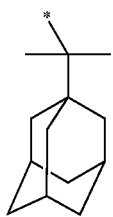
(r-pr-cm2)
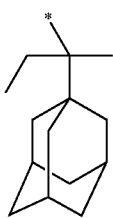
(r-pr-cm3)
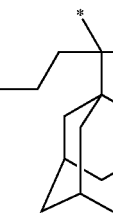
(r-pr-cm4)
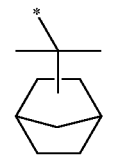
(r-pr-cm5)
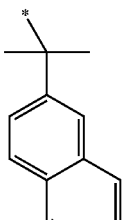
(r-pr-cm6)
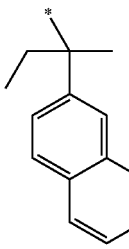
(r-pr-cm7)
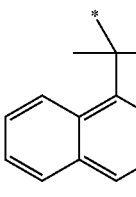

-continued (r-pr-cm8) 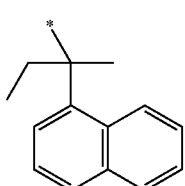

(r-pr-cs1) 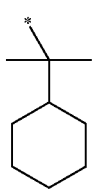

(r-pr-cs2) 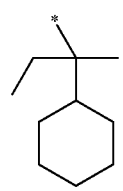

(r-pr-cs3) 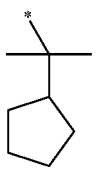

(r-pr-cs4) 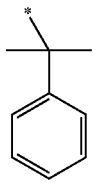

(r-pr-cs5) 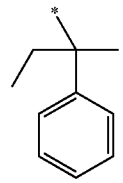

(r-pr-c1) 

(r-pr-c2) 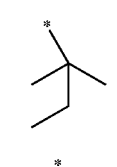

(r-pr-c3) 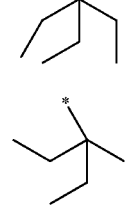

-continued (r-pr-c5) 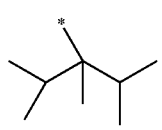

Examples of the acid dissociable group for protecting a hydroxy group as a polar group include the acid dissociable group represented by general formula (a1-r-3) shown below (hereafter, referred to as "tertiary alkyloxycarbonyl-type acid dissociable group").

[Chemical Formula 6]

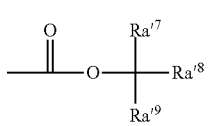

(a1-r-3)

In the formula, $Ra'^7$ to $Ra'^9$ each represents an alkyl group.

In the formula (a1-r-3), $Ra'^7$ to $Ra'^9$ is preferably an alkyl group of 1 to 5 carbon atoms, and more preferably an alkyl group of 1 to 3 carbon atoms.

Further, the total number of carbon atoms within the alkyl group is preferably 3 to 7, more preferably 3 to 5, and most preferably 3 or 4.

Examples of the structural unit (a1) include a structural unit derived from an acrylate ester which may have the hydrogen atom bonded to the carbon atom on the α-position substituted with a substituent and contains an acid decomposable group which exhibits increased polarity by the action of acid; a structural unit derived from hydroxystyrene or a hydroxystyrene derivative in which at least a part of the hydrogen atom of the hydroxy group is protected with a substituent containing an acid decomposable group; and a structural unit derived from vinylbenzoic acid or a vinylbenzoic acid derivative in which at least a part of the hydrogen atom within —C(=O)—OH is protected with a substituent containing an acid decomposable group.

As the structural unit (a1), a structural unit derived from an acrylate ester which may have the hydrogen atom bonded to the carbon atom on the α-position substituted with a substituent is preferable.

As the structural unit (a1), structural units represented by general formulas (a1-1) to (a1-3) shown below are preferable.

[Chemical Formula 7]

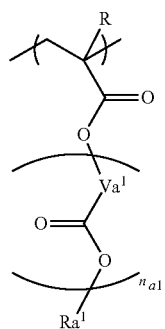

(a1-1)

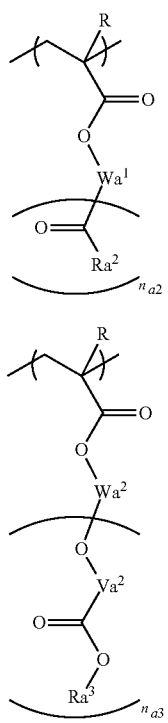

(a1-2)

(a1-3)

In the formulae, R represents a hydrogen atom, an alkyl group of 1 to 5 carbon atoms or a halogenated alkyl group of 1 to 5 carbon atoms; $Va^1$ represents a divalent hydrocarbon group which may contain an ether bond, urethane bond or amide bond; $n_{a1}$ each independently represents an integer of 0 to 2; $Ra^1$ represents an acid dissociable group represented by the aforementioned formula (a1-r-1) or (a1-r-2); $Wa^1$ represents a hydrocarbon group having a valency of $n_{a2}+1$; $n_{a2}$ represents 1 to 3; $Ra^e$ represents an acid dissociable group represented by the aforementioned formulae (a1-r-1) or (a1-r-3); $Wa^2$ represents a hydrocarbon group having a valency of $n_{a3}+1$; $n_{a3}$ represents an integer of 1 to 3; and $Va^2$ represents a divalent hydrocarbon group which may contain an ether bond, urethane bond or amide bond; $Ra^3$ represents an acid dissociable group represented by the aforementioned formula (a1-r-1) or (a1-r-2).

In general formulae (a1-1) to (a1-3), as the alkyl group of 1 to 5 carbon atoms for R, a linear or branched alkyl group of 1 to 5 carbon atoms is preferable, and specific examples include a methyl group, an ethyl group, a propyl group, an isopropyl group, an n-butyl group, an isobutyl group, a tert-butyl group, a pentyl group, an isopentyl group and a neopentyl group.

The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In the formula (a1-1), $Va^1$ represents a divalent hydrocarbon group which may contain an ether bond, an urethane bond or an amide bond.

The divalent hydrocarbon group for $Va^1$ may be either an aliphatic hydrocarbon group or an aromatic hydrocarbon group.

The aliphatic hydrocarbon group as the divalent hydrocarbon group for $Va^1$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable, and specific examples include a methylene group [—$CH_2$—], an ethylene group [—$(CH_2)_2$—], a trimethylene group [—$(CH_2)_3$—], a tetramethylene group [—$(CH_2)_4$-] and a pentamethylene group [—$(CH_2)_5$—].

As the branched aliphatic hydrocarbon group, a branched alkylene group is preferable, and specific examples include alkylalkylene groups, e.g., alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

As examples of the aliphatic hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed within a linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic alicyclic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which two hydrogen atoms have been removed from a polycycloalkane is preferable, and the polycycloalkane preferably has 7 to 12 carbon atoms. Examples of the polycycloalkane include adamantane, norbornane, isobornane, tricyclodecane and tetracyclododecane.

The aromatic hydrocarbon group as the divalent hydrocarbon group for $Va^1$ is a hydrocarbon group having an aromatic ring.

The aromatic hydrocarbon group preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (for example, a group in which one hydrogen atom has been removed from an aryl group within an arylalkyl group such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atoms, more preferably 1 or 2, and most preferably 1.

Further, as the group for $Va^1$, a group in which the aforementioned divalent hydrocarbon group has been bonded via an ether bond, urethane bond or amide bond, and a group in which any one of these bond is interposed within the hydrocarbon chain of the aforementioned divalent hydrocarbon group can be mentioned.

In the formula (a1-1), $n_{a1}$ represents an integer of 0 to 2, preferably 0 or 1, and more preferably 0.

In the aforementioned formula (a1-2), the hydrocarbon group for $Wa^1$ having a valency of $n_{a2}+1$ may be either an aliphatic hydrocarbon group or an aromatic hydrocarbon group. The aliphatic hydrocarbon group refers to a hydrocarbon group that has no aromaticity, and may be either saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof. As the specific examples thereof, the same groups as those described above for $Va^1$ in the aforementioned formula (a1-1) can be mentioned.

The valency of $n_{a2}+1$ is preferably divalent, trivalent or tetravalent, and divalent or trivalent is more preferable.

In the aforementioned formula (a1-3), the hydrocarbon group for $Wa^2$ having a valency of $n_{a3}+1$ may be either an aliphatic hydrocarbon group or an aromatic hydrocarbon group. The aliphatic hydrocarbon group refers to a hydrocarbon group that has no aromaticity, and may be either saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof. As the specific examples thereof, the same groups as those described above for $Va^1$ in the aforementioned formula (a1-1) can be mentioned.

The valency of $n_{a3}+1$ is preferably divalent, trivalent or tetravalent, and divalent or trivalent is more preferable.

In the formula (a1-3), $Va^2$ is the same group as defined above for $Va^1$ in the formula (a1-1).

As the structural unit represented by the aforementioned formula (a1-2), a structural unit represented by general formula (a1-2-01) shown below is desirable.

[Chemical Formula 8]

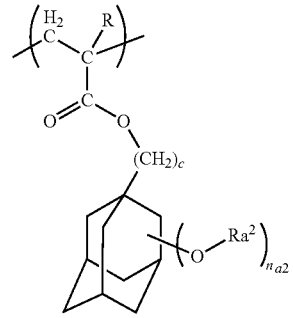

(a1-2-01)

In the formula (a1-2-01), $Ra^e$ represents an acid dissociable group represented by the aforementioned formulae (a1-r-1) or (a1-r-3); $n_{a2}$ is an integer of 1 to 3, preferably 1 or 2, and more preferably 1; c is an integer of 0 to 3, preferably 0 or 1, and more preferably 1; and R is the same as defined above.

Specific examples of structural units represented by general formulae (a1-1) and (a1-2) are shown below. In the formulas shown below, $R^\alpha$ represents a hydrogen atom, a methyl group or a trifluoromethyl group.

[Chemical Formula 9]

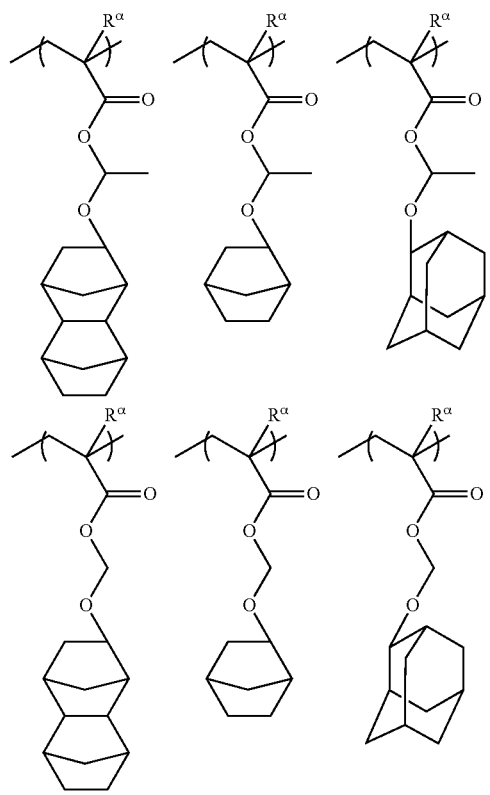

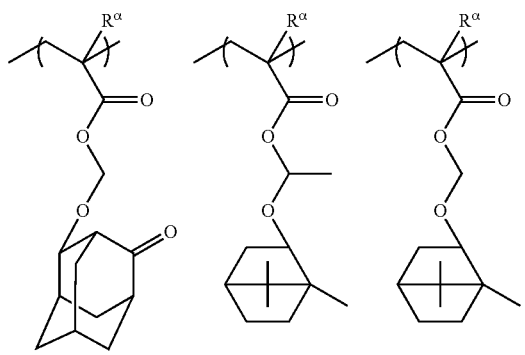
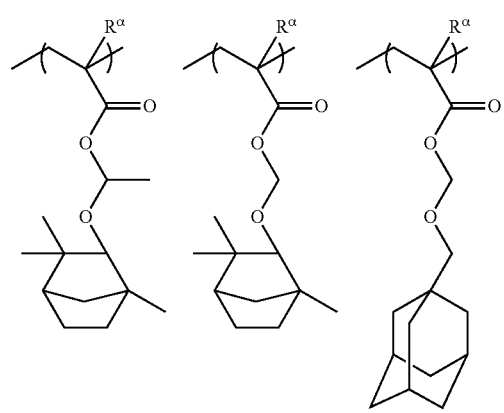
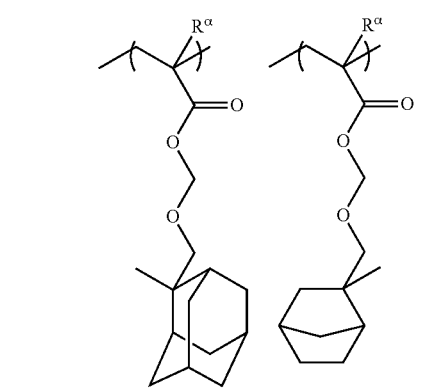
[Chemical Formula 10]
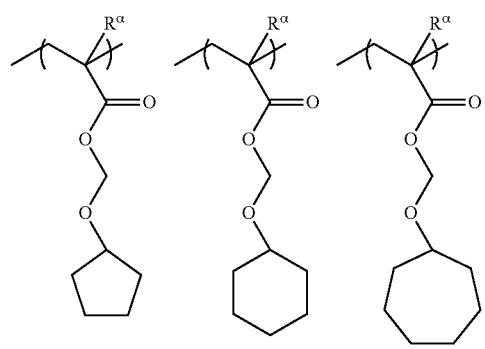
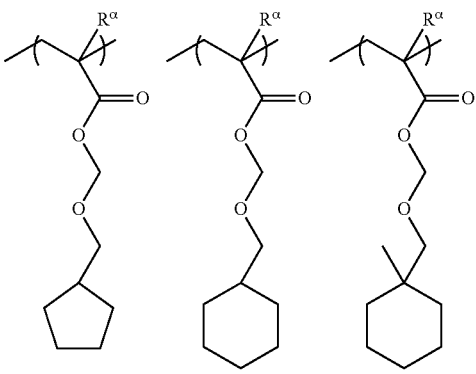
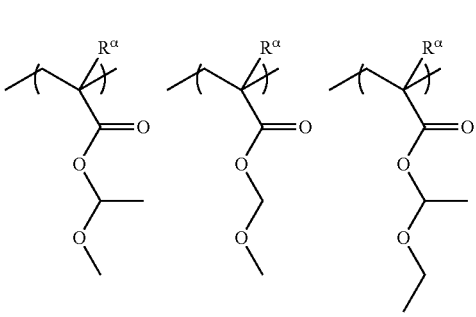
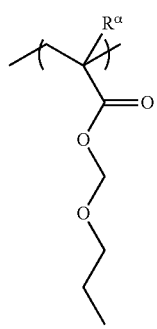
[Chemical Formula 11]
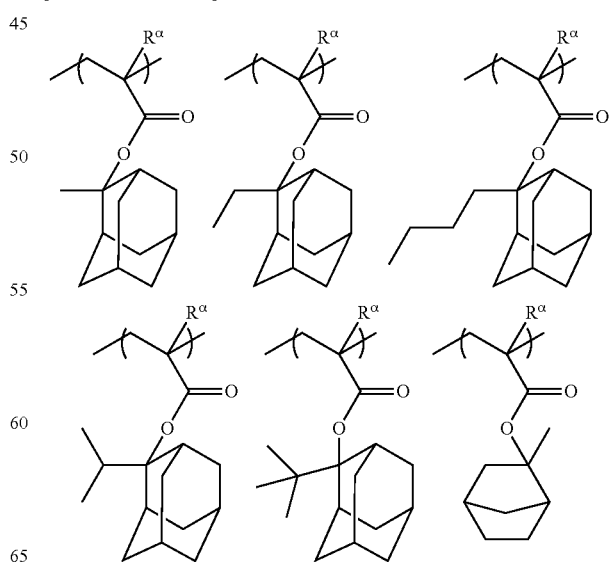

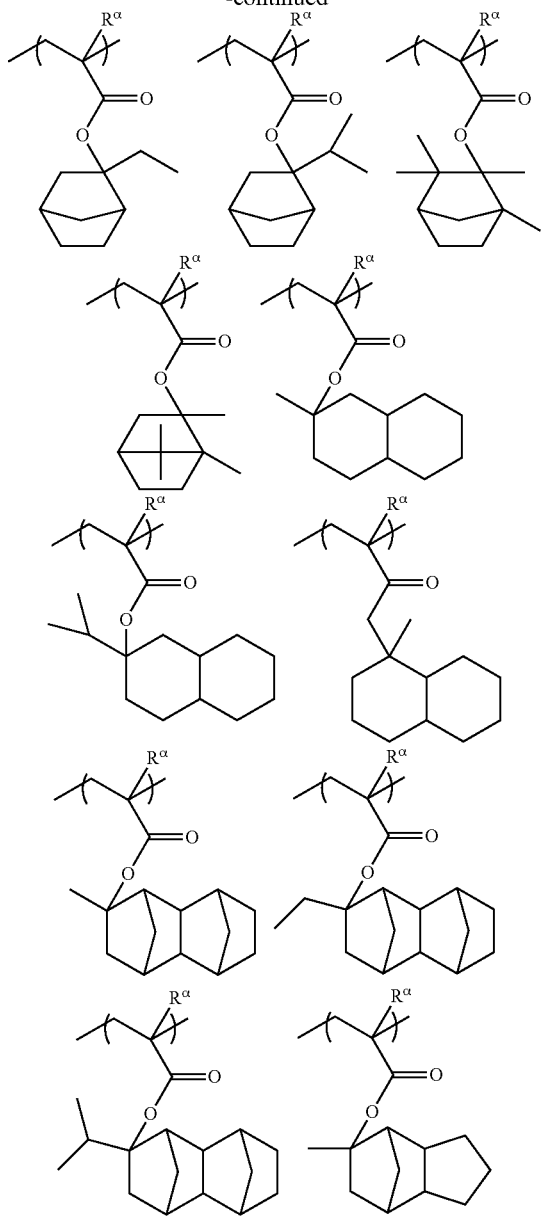
[Chemical Formula 12]
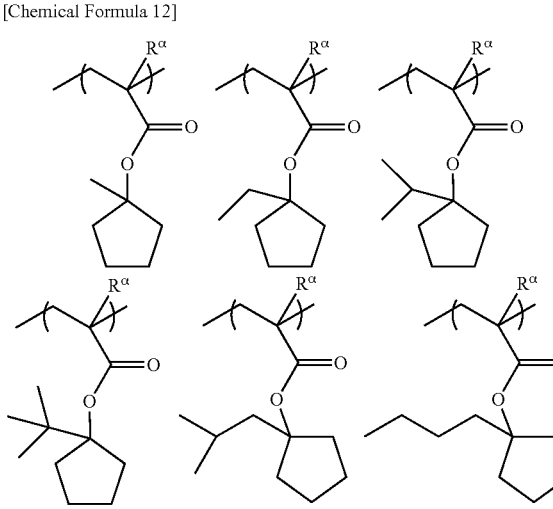
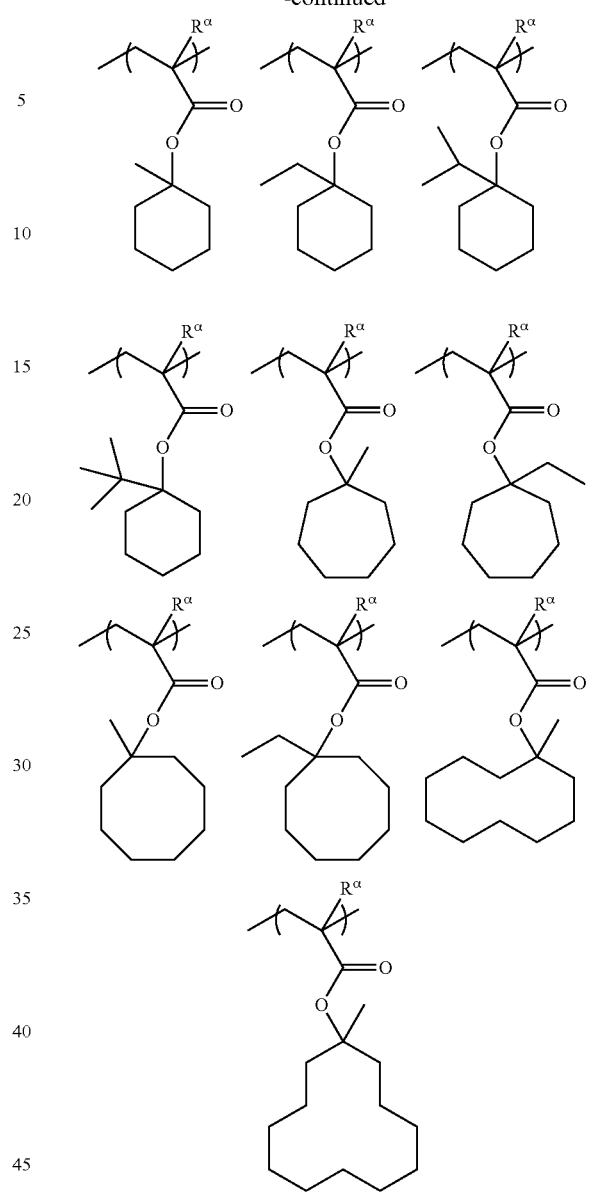
[Chemical Formula 13]

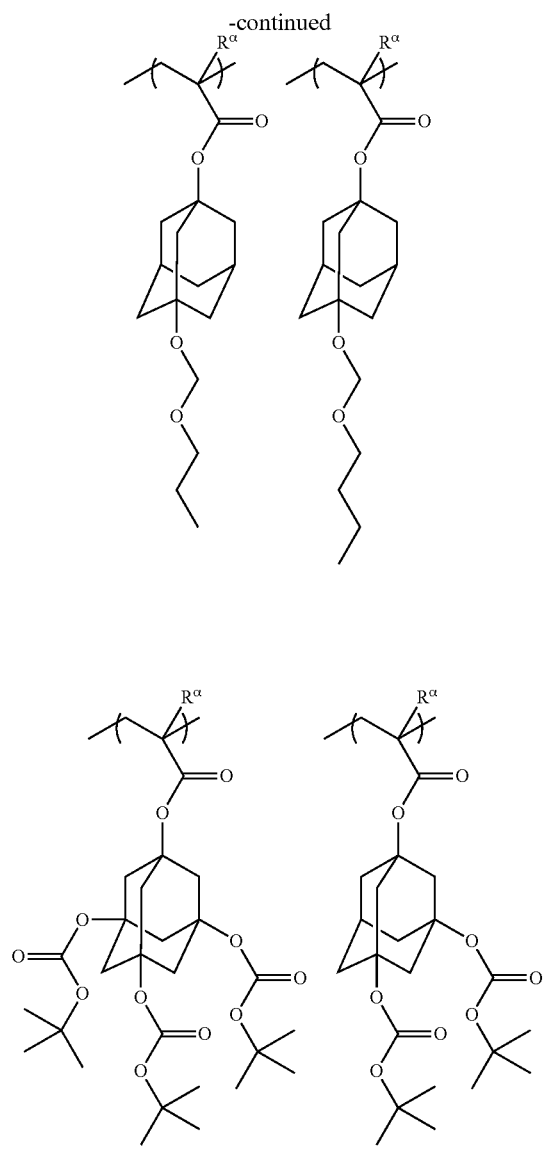
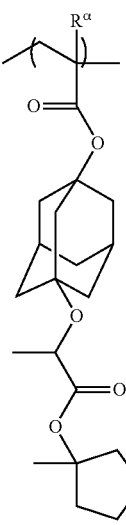
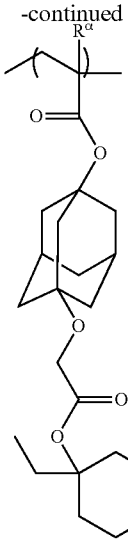
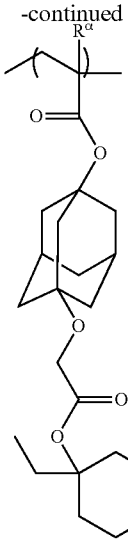
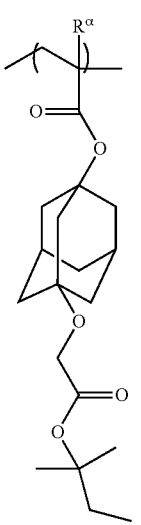
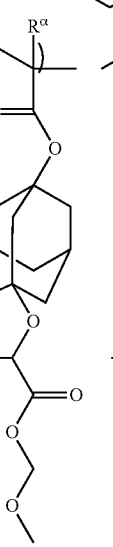
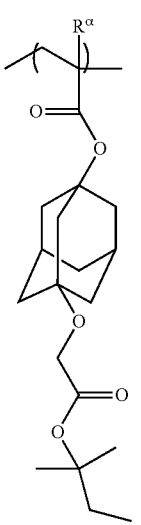
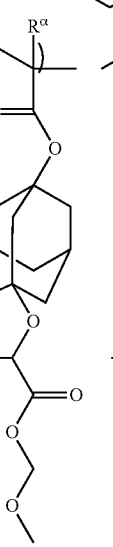
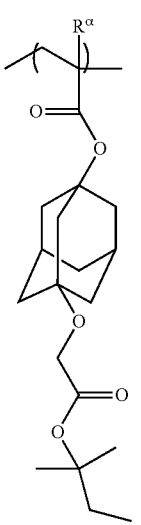
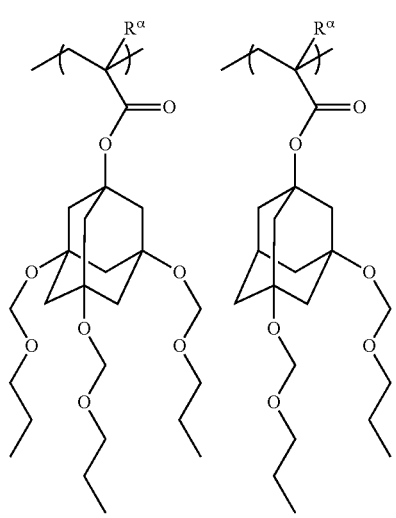

As the structural unit (a1) contained in the component (A1), 1 type of structural unit may be used, or 2 or more types may be used.

In the component (A1), the amount of the structural unit (a1) based on the combined total of all structural units constituting the component (A1) is preferably 20 to 80 mol %, more preferably 20 to 75 mol %, and still more preferably 25 to 70 mol %. When the amount of the structural unit (a1) is at least as large as the lower limit of the above-mentioned range, various lithography properties (such as sensitivity, resolution and LWR) can be improved. On the other hand, when the amount of the structural unit (a1) is no more than the upper limit of the above-mentioned range, a good balance can be reliably achieved with the other structural units.

Structural Unit (a2):

The structural unit (a2) is a structural unit which contains a lactone-containing cyclic group, an —SO$_2$— containing cyclic group or a carbonate-containing cyclic group.

When the component (A1) is used for forming a resist film, the lactone-containing cyclic group, the —SO$_2$— containing cyclic group or the carbonate-containing cyclic group within the structural unit (a2) is effective in improving the adhesion between the resist film and the substrate.

The aforementioned structural unit (a1) which contains a lactone-containing cyclic group, an —SO$_2$— containing cyclic group or a carbonate-containing cyclic group falls under the definition of the structural unit (a2); however, such a structural unit is regarded as a structural unit (a1), and does not fall under the definition of the structural unit (a2).

The term "lactone-containing cyclic group" refers to a cyclic group including a ring containing a —O—C(=O)— structure (lactone ring) in the ring skeleton thereof. The term "lactone ring" refers to a single ring containing a —O—C(=O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

As the lactone-containing cyclic group, there is no particular limitation, and an arbitrary group may be used.

Specific examples include structural units represented by general formulas (a2-r-1) to (a2-r-7) shown below.

[Chemical Formula 14]

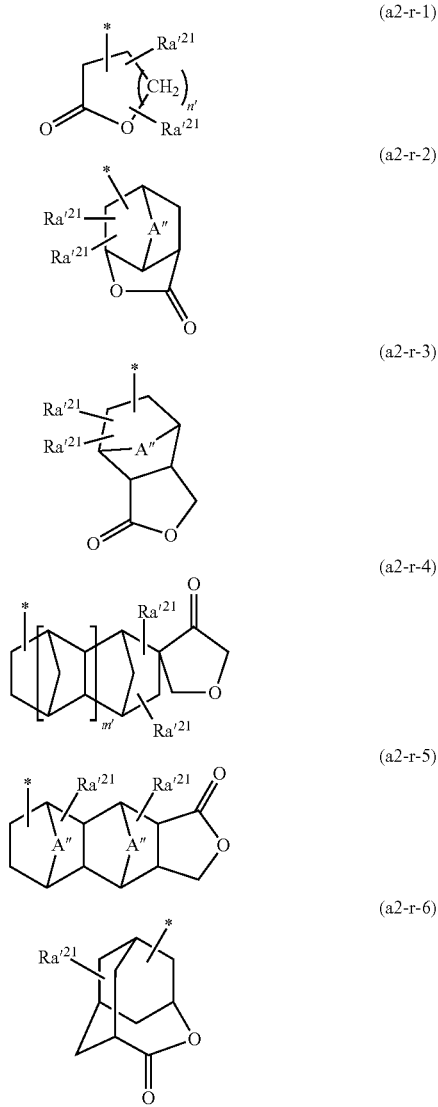

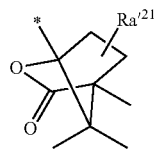

In the formulas, each Ra'$^{21}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom, an alkyl group, a lactone-containing cyclic group, a carbonate-containing cyclic group or an —SO$_2$— containing cyclic group; A" each independently represents an oxygen atom, a sulfur atom or an alkylene group of 1 to 5 carbon atoms which may contain an oxygen atom or a sulfur atom; n' represents an integer of 0 to 2; and m' represents 0 or 1.

In general formulas (a2-r-1) to (a2-r-7), A" represents an oxygen atom, a sulfonyl group or an alkylene group of 1 to 5 carbon atoms which may contain an oxygen atom (—O—) or a sulfur atom (—S—). As the alkylene group of 1 to 5 carbon atoms for A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$— and —CH$_2$—S—CH$_2$—. As A", an alkylene group of 1 to 5 carbon atoms or —O— is preferable, more preferably an alkylene group of 1 to 5 carbon atoms, and most preferably a methylene group.

In the formulae (a2-r-1) to (a2-r-7), the alkyl group for Ra'$^{21}$ is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or an ethyl group is preferable, and a methyl group is particularly desirable.

The alkoxy group for Ra'$^{21}$ is preferably an alkoxy group of 1 to 6 carbon atoms.

Further, the alkoxy group is preferably a linear or branched alkoxy group. Specific examples of the alkoxy groups include the aforementioned alkyl groups for Ra'$^{21}$ having an oxygen atom (—O—) bonded thereto.

As examples of the halogen atom for Ra'$^{21}$, a fluorine atom, chlorine atom, bromine atom and iodine atom can be given. Among these, a fluorine atom is preferable.

Examples of the halogenated alkyl group for Ra'$^{21}$ include groups in which part or all of the hydrogen atoms within the aforementioned alkyl groups for Ra'$^{21}$ has been substituted with the aforementioned halogen atoms. As the halogenated alkyl group, a fluorinated alkyl group is preferable, and a perfluoroalkyl group is particularly desirable.

With respect to —COOR" and —OC(=O)R" for Ra'$^{21}$, R" represents a hydrogen atom, an alkyl group, a lactone-containing cyclic group, a carbonate-containing cyclic group or an —SO$_2$— containing cyclic group.

The alkyl group for R" may be linear, branched or cyclic, and preferably has 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. Specific examples include groups in which one or more hydrogen atoms have been removed from a monocycloalkane or a polycycloalkane such as a bicycloalkane, tricycloalkane or tetracycloalkane which may or may not be substituted with a fluorine atom or a fluorinated alkyl group. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

As the lactone-containing cyclic group for R", the groups as those represented by the aforementioned general formulae (a2-r-1) to (a2-r-7) can be mentioned.

As the carbonate-containing cyclic group for R", the same groups as those described later for carbonate-containing cyclic groups can be mentioned, and specific examples thereof includes groups represented by the aforementioned general formulae (ax3-r-1) to (ax3-r-3) described later can be mentioned.

As the —SO$_2$— containing cyclic group for R", the same groups as those described later for —SO$_2$— containing cyclic groups can be mentioned, and specific examples thereof includes groups represented by the aforementioned general formulae (a5-r-1) to (a5-r-4) described later can be mentioned.

The hydroxyalkyl group for Ra'$^{21}$ preferably has 1 to 6 carbon atoms, and specific examples thereof include the aforementioned alkyl groups for Ra'$^{21}$ in which at least one hydrogen atom has been substituted with a hydroxy group.

In the formulas (a2-r-2), (a2-r-3) and (a2-r-5), as the alkylene group of 1 to 5 carbon atoms for A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S —CH$_2$— and —CH$_2$—S—CH$_2$—. As A", an alkylene group of 1 to 5 carbon atoms or —O— is preferable, more preferably an alkylene group of 1 to 5 carbon atoms, and most preferably a methylene group.

Specific examples of the group represented by the aforementioned general formulas (a2-r-1) to (a2-r-7) are shown below.

[Chemical Formula 15]

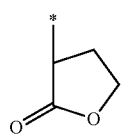
(r-Ic-1-1)

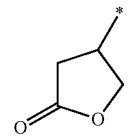
(r-Ic-1-2)

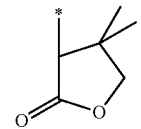
(r-Ic-1-3)

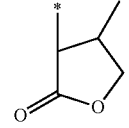
(r-Ic-1-4)

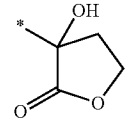
(r-Ic-1-5)

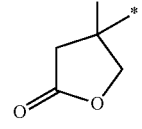
(r-Ic-1-6)

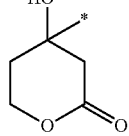
(r-Ic-1-7)

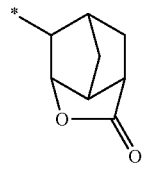
(r-Ic-2-1)

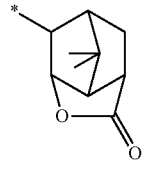
(r-Ic-2-2)

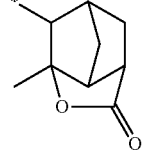
(r-Ic-2-3)

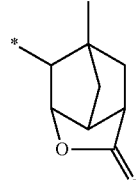
(r-Ic-2-4)

(r-Ic-2-5)
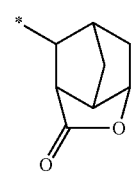
(r-Ic-2-6)
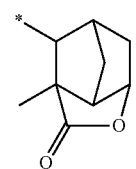
(r-Ic-2-7)
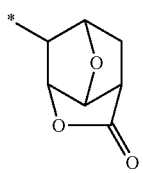
(r-Ic-2-8)
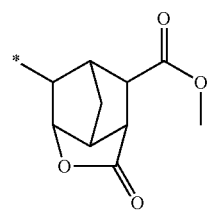
(r-Ic-2-9)
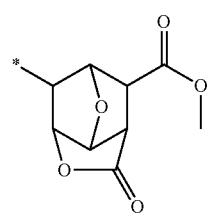
(r-Ic-2-10)
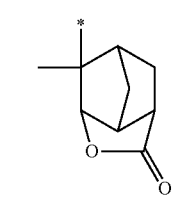
(r-Ic-2-11)
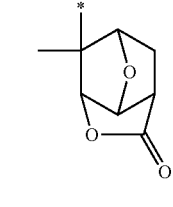
(r-Ic-2-12)
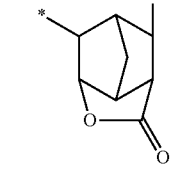
(r-Ic-2-13)
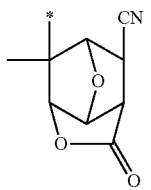
(r-Ic-3-1)
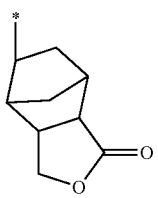
(r-Ic-3-2)
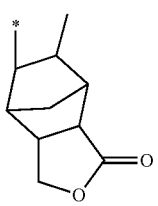
(r-Ic-3-3)
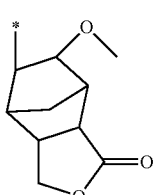
(r-Ic-3-4)
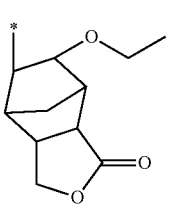
(r-Ic-3-5)
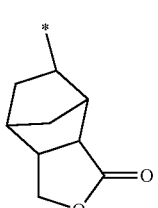
[Chemical Formula 16]
(r-Ic-4-1)
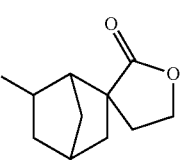
(r-Ic-4-2)
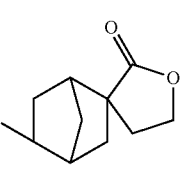

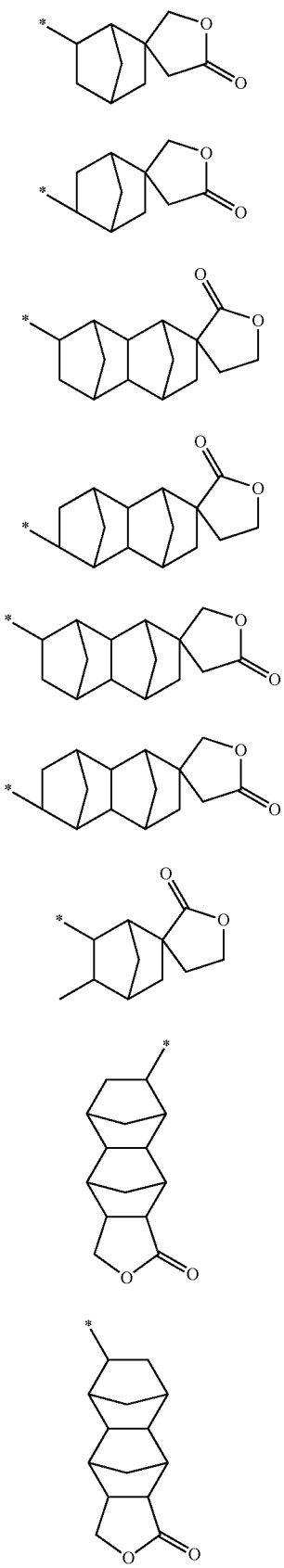
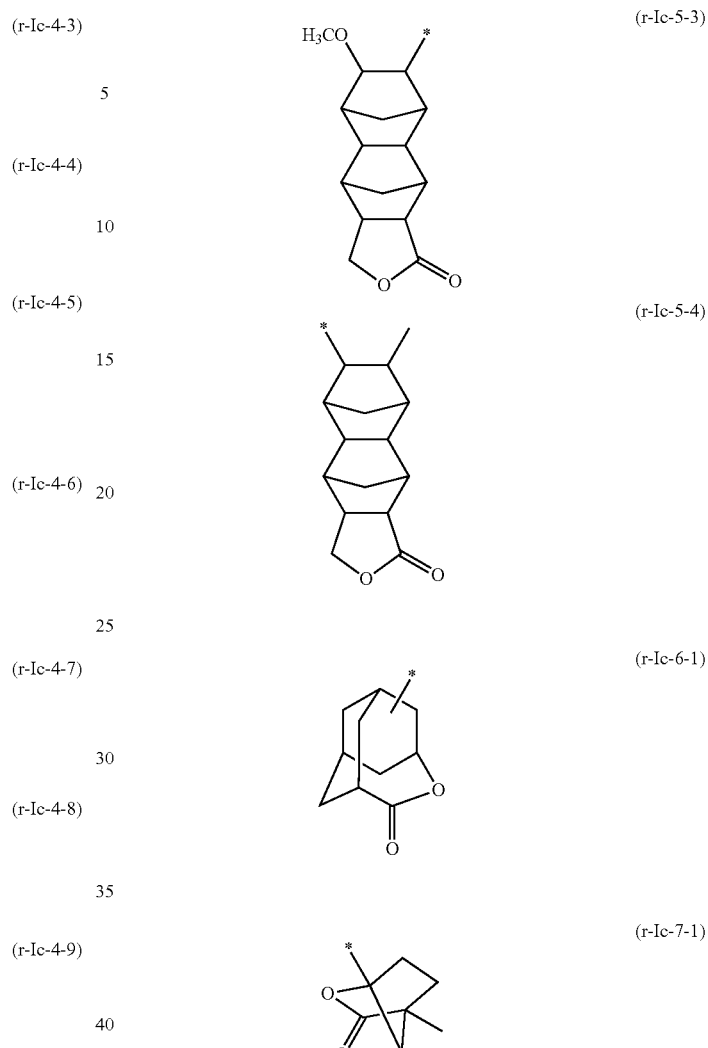

An "—SO₂— containing cyclic group" refers to a cyclic group having a ring containing —SO₂— within the ring structure thereof, i.e., a cyclic group in which the sulfur atom (S) within —SO₂— forms part of the ring skeleton of the cyclic group. The ring containing —SO₂— within the ring skeleton thereof is counted as the first ring. A cyclic group in which the only ring structure is the ring that contains —SO₂— in the ring skeleton thereof is referred to as a monocyclic group, and a group containing other ring structures is described as a polycyclic group regardless of the structure of the other rings. The —SO₂— containing cyclic group may be either a monocyclic group or a polycyclic group.

As the —SO₂— containing cyclic group, a cyclic group containing —O—SO₂— within the ring skeleton thereof, i.e., a cyclic group containing a sultone ring in which —O—S— within the —O—SO₂— group forms part of the ring skeleton thereof is particularly desirable. More specific examples of the —SO₂— containing cyclic group include groups represented by general formulas (a5-r-1) to (a5-r-4) shown below.

[Chemical Formula 17]

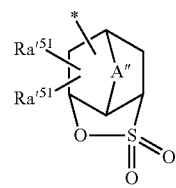
(a5-r-1)

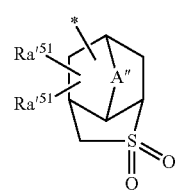
(a5-r-2)

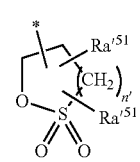
(a5-r-3)

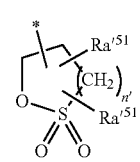
(a5-r-4)

In the formulas, each $Ra'^{51}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom, an alkyl group, a lactone-containing cyclic group, a carbonate-containing cyclic group or an —$SO_2$— containing cyclic group; A" each independently represents an oxygen atom, a sulfur atom or an alkylene group of 1 to 5 carbon atoms which may contain an oxygen atom or a sulfur atom; and n' each independently represents an integer of 0 to 2.

In general formulas (a5-r-1) to (a5-r-4), A" is the same as defined for A" in general formulas (a2-r-1) to (a2-r-7). Examples of the alkyl group, alkoxy group, halogen atom, halogenated alkyl group, —COOR", —OC(=O)R" and hydroxyalkyl group for $Ra'^{51}$ include the same groups as those described above in the explanation of $Ra'^{21}$ in the general formulas (a2-r-1) to (a2-r-7).

Specific examples of the group represented by the aforementioned general formulas (a5-r-1) to (a5-r-4) are shown below. In the formulas shown below, "Ac" represents an acetyl group.

[Chemical Formula 18]

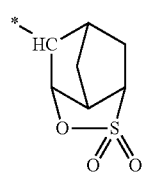
(r-sI-1-1)

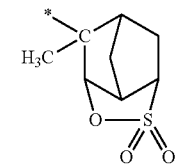
(r-sI-1-2)

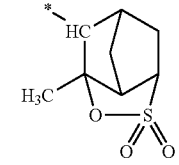
(r-sI-1-3)

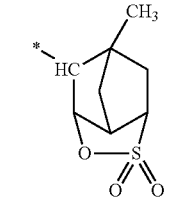
(r-sI-1-4)

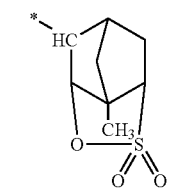
(r-sI-1-5)

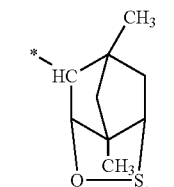
(r-sI-1-6)

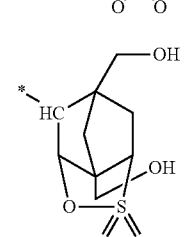
(r-sI-1-7)

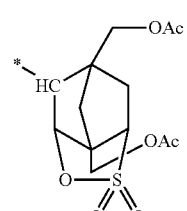
(r-sI-1-8)

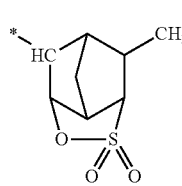
(r-sI-1-9)

-continued
(r-sI-1-10)
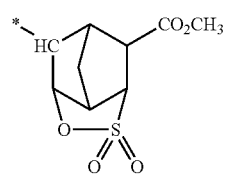
(r-sI-1-11)
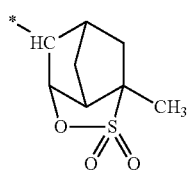
(r-Si-1-12)
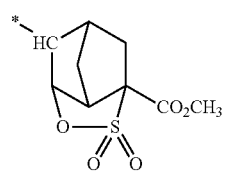
(r-sI-1-13)
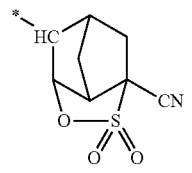
(r-sI-1-14)
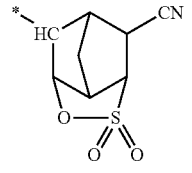
(r-sI-1-15)
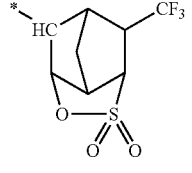
(r-sI-1-16)
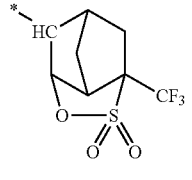
(r-sI-1-17)
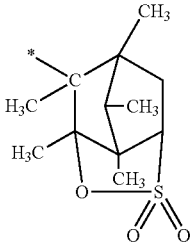
-continued
(r-sI-1-18)
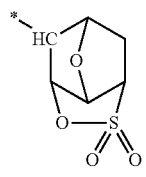
(r-sI-1-19)
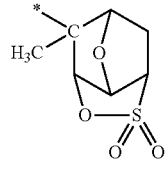
(r-sI-1-20)
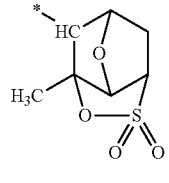
(r-sI-1-21)
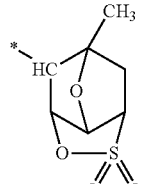
[Chemical Formula 19]
(r-sI-1-22)
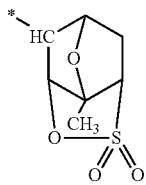
(r-sI-1-23)
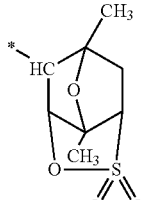
(r-sI-1-24)
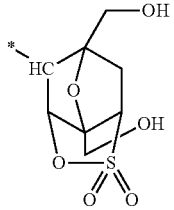
(r-sI-1-25)
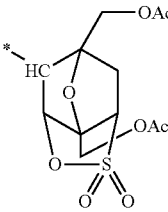

(r-sI-1-26) 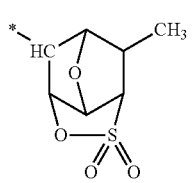

(r-sI-1-27) 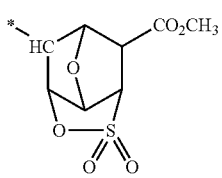

(r-sI-1-28) 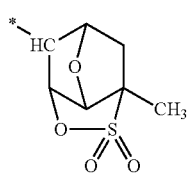

(r-sI-1-29) 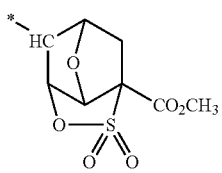

(r-sI-1-30) 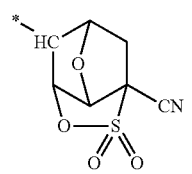

(r-sI-1-31) 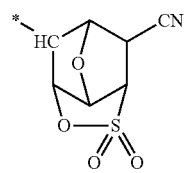

(r-sI-1-32) 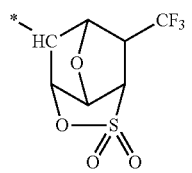

(r-sI-1-33) 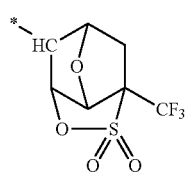

[Chemical Formula 20]

(r-sI-2-1) 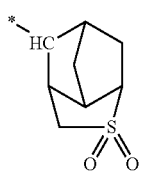

(r-sI-2-2) 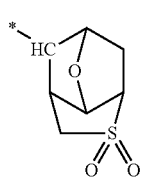

(r-Si-3-1) 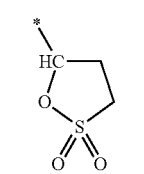

(r-sI-4-1) 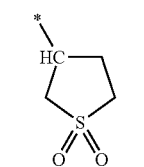

As the —$SO_2$— containing cyclic group, a group represented by the aforementioned general formula (a5-r-1) is preferable, at least one member selected from the group consisting of groups represented by the aforementioned chemical formulas (r-s1-1-1), (r-s1-1-18), (r-s1-3-1) and (r-s1-4-1) is more preferable, and a group represented by chemical formula (r-s1-1-1) is most preferable.

The term "carbonate-containing cyclic group" refers to a cyclic group including a ring containing a —O—C(=O)—O— structure (carbonate ring) in the ring skeleton thereof. The term "carbonate ring" refers to a single ring containing a —O—C(=O)—O— structure, and this ring is counted as the first ring. A carbonate-containing cyclic group in which the only ring structure is the carbonate ring is referred to as a monocyclic group, and groups containing other ring structures are described as polycyclic groups regardless of the structure of the other rings. The carbonate-containing cyclic group may be either a monocyclic group or a polycyclic group.

The carbonate-containing cyclic group is not particularly limited, and an arbitrary group may be used. Specific examples include groups represented by general formulas (ax3-r-1) to (ax3-r-3) shown below.

[Chemical Formula 21]

(ax3-r-1) 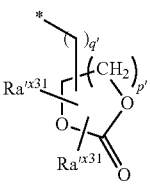

(ax3-r-2) 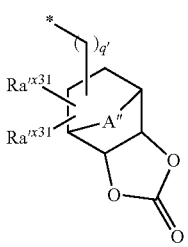

(ax3-r-3)

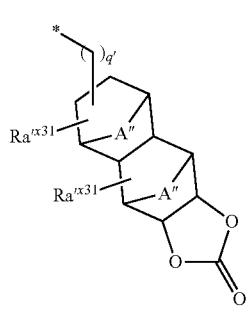

In the formulas, each Ra'^{x31} independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom, an alkyl group, a lactone-containing cyclic group, a carbonate-containing cyclic group or an —SO$_2$— containing cyclic group; A" each independently represents an oxygen atom, a sulfur atom or an alkylene group of 1 to 5 carbon atoms which may contain an oxygen atom or a sulfur atom; p' represents an integer of 0 to 3; and q' each independently represents 0 or 1.

In general formulas (ax3-r-1) to (ax3-r-3), A" is the same as defined for A" in general formulas (a2-r-1) to (a2-r-7).

Examples of the alkyl group, alkoxy group, halogen atom, halogenated alkyl group, —COOR", —OC(=O)R" and hydroxy alkyl group for Ra'^{31} include the same groups as those exemplified for Ra'^{2'} in the formulas (a2-r-1) to (a2-r-7).

Specific examples of the group represented by the aforementioned general formulae (ax3-r-1) to (ax3-r-3) are shown below.

[Chemical Formula 22]

(r-cr-1-1)

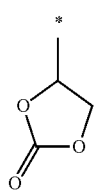

(r-cr-1-2)

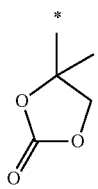

(r-cr-1-3)

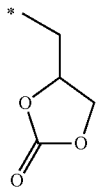

(r-cr-1-4)

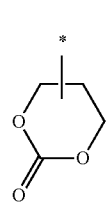

(r-cr-1-5)

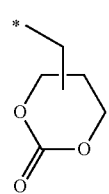

(r-cr-1-6)

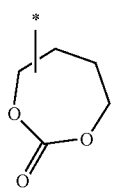

(r-cr-1-6)

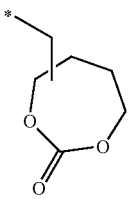

(r-cr-2-1)

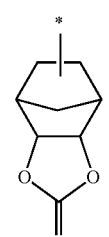

(r-cr-2-2)

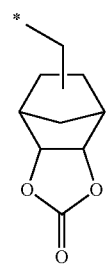

(r-cr-2-3)

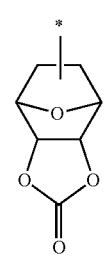

(r-cr-2-4)
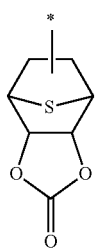

(r-cr-3-1)
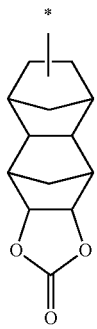

(r-cr-3-2)
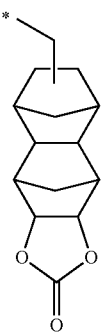

(r-cr-3-3)
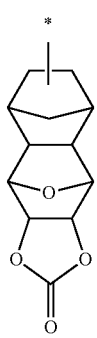

(r-cr-3-4)
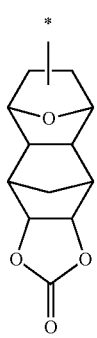

(r-cr-3-5)
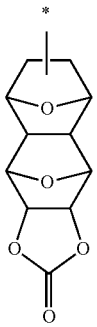

Among the examples shown above, a lactone-containing cyclic group or an —SO$_2$-containing cyclic group is preferable, and a lactone-containing cyclic group is more preferable. Specifically, a group represented by the general formulae (a2-r-1), (a2-r-2) or (a5-r-1) is more preferable, and a group represented by any one of the chemical structures (r-1c-1-1) to (r-1c-1-7), (r-1c-2-1) to (r-1c-2-13), (r-s1-1-1) and (r-s1-1-18) is still more preferable.

As the structural unit (a2), a structural unit derived from an acrylate ester which may have the hydrogen atom bonded to the carbon atom on the α-position substituted with a substituent is preferable.

The structural unit (a2) is preferably a structural unit represented by general formula (a2-1) shown below.

[Chemical Formula 23]

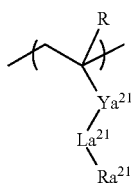
(a2-1)

In the formula, R represents a hydrogen atom, an alkyl group of 1 to 5 carbon atoms or a halogenated alkyl group of 1 to 5 carbon atoms; Ya$^{21}$ represents a single bond or a divalent linking group; La$^{21}$ represents —O—, —CO—, —COO—, —OCO—; and R' represents a hydrogen atom or a methyl group, provided that when La$^{21}$ represents —O—, Ya$^{21}$ does not represents —CO—; and Ra$^{21}$ represents a lactone-containing cyclic group, a carbonate-containing cyclic group or an —SO$_2$— containing cyclic group.

The divalent linking group for Ya$^{21}$ is not particularly limited, and preferable examples thereof include a divalent hydrocarbon group with or without a substituent and a divalent linking group containing a hetero atom.

Divalent Hydrocarbon Group with or without a Substituent

The hydrocarbon group as a divalent linking group may be either an aliphatic hydrocarbon group or an aromatic hydrocarbon group.

An "aliphatic hydrocarbon group" refers to a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof can be given. Specific examples thereof include the same group as exemplified above for $Va^1$ in the aforementioned formula (a1-1).

The linear or branched aliphatic hydrocarbon group may or may not have a substituent. Examples of the substituent include a fluorine atom, a fluorinated alkyl group of 1 to 5 carbon atoms, and a carbonyl group.

The cyclic aliphatic hydrocarbon group as an aliphatic hydrocarbon group containing a ring in the structure thereof may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group of 1 to 5 carbon atoms, and a methyl group, an ethyl group, a propyl group, an n-butyl group or a tert-butyl group is most desirable.

The alkoxy group as the substituent is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

In the cyclic aliphatic hydrocarbon group, part of the carbon atoms constituting the ring structure thereof may be substituted with a substituent containing a hetero atom. The substituent containing a hetero atom is preferably —O—, —C(=O)—O—, —S—, —S(=O)$_2$— or —S(=O)$_2$—O—.

Specific examples of the aromatic hydrocarbon group as a divalent hydrocarbon group include the same group as exemplified above for $Va^1$ in the aforementioned formula (a1-1).

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and a methyl group, an ethyl group, a propyl group, an n-butyl group or a tert-butyl group is most desirable.

As the alkoxy group, the halogen atom and the halogenated alkyl group for the substituent, the same groups as the aforementioned substituent groups for substituting a hydrogen atom within the cyclic aliphatic hydrocarbon group can be used.

Divalent Linking Group Containing a Hetero Atom

With respect to a divalent linking group containing a hetero atom, a hetero atom is an atom other than carbon and hydrogen, and examples thereof include an oxygen atom, a nitrogen atom, a sulfur atom and a halogen atom.

In the case where $Ya^{21}$ represents a divalent linking group containing a hetero atom, preferable examples of the linking group include —O—, —C(=O)—O—, —C(=O)—, —O—C(=O)—O—, —C(=O)—NH—, —NH—, —NH—C(=NH)— (wherein H may be substituted with a substituent such as an alkyl group or an acyl group), —S—, —S(=O)$_2$—, —S(=O)$_2$—O—, and a group represented by general formula —Y$^{21}$—O—Y$^{22}$—, —Y$^{21}$—O—, —Y$^{21}$—C(=O)—O—Y$^{21}$, —[Y$^{21}$—C(=O)—O]$_{m'}$—Y$^{22}$— or —Y$^{21}$—O—C(=O)—Y$^{22}$— [in the formulas, each of Y$^{21}$ and Y$^{22}$ independently represents a divalent hydrocarbon group with or without a substituent, O represents an oxygen atom, and m' represents an integer of 0 to 3].

When the divalent linking group containing a hetero atom represents —C(=O)—NH—, —NH—, or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In formula —Y$^{21}$—O—Y$^{22}$—, —Y$^{21}$—O—, —Y$^{21}$—C(O)—O—, —C(=O)—O—Y$^{21}$—, —[Y$^{21}$—C(=O)—O]$_{m'}$—Y$^{22}$— or —Y$^{21}$—O—C(=O)—Y$^{22}$—, Y$^{21}$ and Y$^{22}$ each independently represents a divalent hydrocarbon group with or without a substituent. Examples of the divalent hydrocarbon group include the same groups as those described above as the "divalent hydrocarbon group with or without a substituent" in the explanation of the aforementioned divalent linking group.

As Y$^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As Y$^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[Y$^{21}$—C(=O)—O]$_{m'}$—Y$^{22}$—, m' represents an integer of 0 to 3, preferably an integer of 0 to 2, more preferably 0 or 1, and particularly preferably 1. Namely, it is particularly desirable that the group represented by the formula —[Y$^{21}$—C(=O)—O]$_{m'}$—Y$^{22}$— is a group represented by general formula —Y$^{21}$—C(=O)—O—Y$^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

Ya$^{21}$ preferably represents an ester bond [—C(=O)—O—], an ether bond (—O—), a linear or branched alkylene group, a combination of these, or a single bond.

In the formula (a2-1), Ra$^{21}$ represents a lactone-containing cyclic group, a carbonate-containing cyclic group or an —SO$_2$— containing cyclic group, a lactone-containing cyclic group and an —SO$_2$— containing cyclic group are preferable, and a lactone-containing cyclic group is particularly preferable.

As the structural unit (a2) contained in the component (A1), 1 type of structural unit may be used, or 2 or more types may be used.

When the component (A1) contains the structural unit (a2), the amount of the structural unit (a2) based on the combined total of all structural units constituting the component (A1) is preferably 1 to 80 mol %, more preferably 5 to 70 mol %, still more preferably 10 to 65 mol %, and particularly preferably 10 to 60 mol %.

When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units, and various lithography properties and pattern shape can be improved.

Structural Unit (a3):

The structural unit (a3) is a structural unit containing a polar group-containing aliphatic hydrocarbon group (provided that the structural units that fall under the definition of structural units (a1) and (a2) are excluded).

When the component (A1) includes the structural unit (a3), the hydrophilicity of the component (A1) is enhanced, thereby contributing to improvement in resolution.

Examples of the polar group include a hydroxyl group, a cyano group, a carboxyl group, or a hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups may be either monocyclic or polycyclic, and can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that includes an aliphatic polycyclic group that contains a hydroxyl group, a cyano group, a carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, a group in which two or more hydrogen atoms have been removed from adamantane, a group in which two or more hydrogen atoms have been removed from norbornane or a group in which two or more hydrogen atoms have been removed from tetracyclododecane are preferred industrially.

As the structural unit (a3), there is no particular limitation as long as it is a structural unit containing a polar group-containing aliphatic hydrocarbon group, and an arbitrary structural unit may be used.

The structural unit (a3) is preferably a structural unit derived from an acrylate ester which may have the hydrogen atom bonded to the carbon atom on the α-position substituted with a substituent and contains a polar group-containing aliphatic hydrocarbon group.

When the hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulae (a3-1), (a3-2) and (a3-3) shown below are preferable.

[Chemical Formula 24]

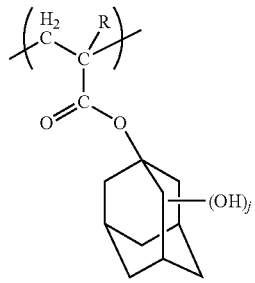
(a3-1)

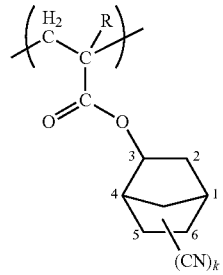
(a3-2)

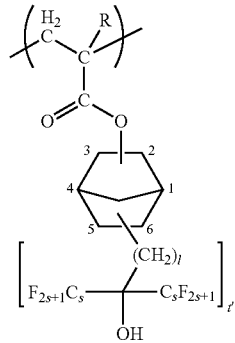
(a3-3)

In the formulae, R is as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2) k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3) contained in the component (A1), 1 type of structural unit may be used, or 2 or more types may be used.

When the component (A1) contains the structural unit (a3), the amount of the structural unit (a3) based on the combined total of all structural units constituting the component (A1) is preferably 1 to 40 mol %, more preferably 2 to 30 mol %, still more preferably 5 to 25 mol %, and particularly preferably 10 to 20 mol %.

When the amount of the structural unit (a3) is at least as large as the lower limit of the above-mentioned range, the resolution obtainable in the formation of a resist pattern can be further enhanced. On the other hand, when the amount of the structural unit represented by the general formula (a3) is no more than the upper limit of the above-mentioned range, a good balance can be reliably achieved with the other structural units.

Structural Unit (a4):

The structural unit (a4) is a structural unit containing an acid non-dissociable, aliphatic cyclic group.

When the component (A1) includes the structural unit (a4), the hydrophobicity of the component (A) is enhanced.

Increase in the hydrophobicity contributes to improvement in terms of resolution, shape of the resist pattern and the like, particularly in an organic solvent developing process (in a negative-tone developing process during the step (1) of the present invention).

An "acid non-dissociable, aliphatic cyclic group" in the structural unit (a4) refers to a cyclic group which is not dissociated by the action of the acid (e.g., acid generated from the component (B) described later) upon exposure, and remains in the structural unit.

As the structural unit (a4), a structural unit which contains a non-acid-dissociable aliphatic cyclic group, and is also derived from an acrylate ester is preferable. As the aliphatic polycyclic group, any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include structural units represented by general formulas (a4-1) to (a4-7) shown below.

[Chemical Formula 25]

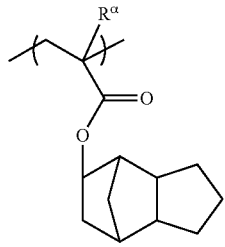
(a4-1)

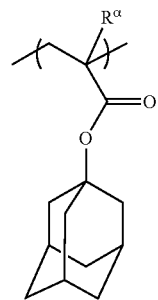
(a4-2)

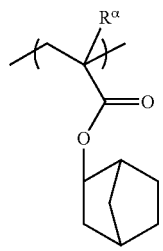
(a4-3)

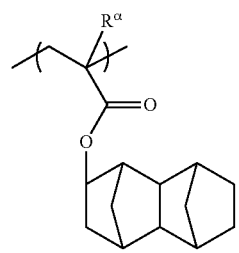
(a4-4)

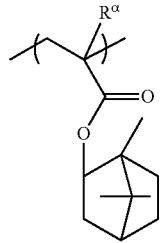
(a4-5)

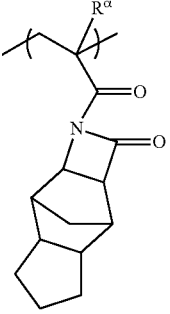
(a4-6)

(a4-7)

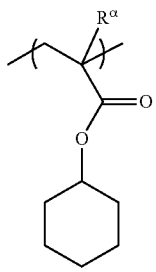

In the formulas, $R^\alpha$ is the same as defined above.

As the structural unit (a4) contained in the component (A1), 1 type of structural unit may be used, or 2 or more types may be used.

When the component (A1) includes the structural unit (a4), the amount of the structural unit (a4) based on the combined total of all structural units constituting the component (A1) is preferably 1 to 40 mol %, and more preferably 5 to 20 mol %.

When the amount of the structural unit (a4) is at least as large as the lower limit of the above-mentioned range, the effect of using the structural unit (a4) can be satisfactorily achieved. On the other hand, when the amount of the structural unit (a4) is no more than the upper limit of the above-mentioned range, a good balance can be achieved with the other structural units.

In the first resist composition, the component (A) preferably contains a polymeric compound (A1) having a structural unit (a1). Specific examples of the component (A1) include a polymeric compound consisting of a repeating structure of the structural unit (a1) and the structural unit (a2); a polymeric compound consisting of a repeating structure of the structural unit (a1) and the structural unit (a3); and a polymeric compound consisting of a repeating structure of the structural unit (a1), the structural unit (a2) and the structural unit (a3).

The weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,000 to 20,000.

When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, the cross-sectional shape of the resist pattern becomes satisfactory.

Further, the dispersity (Mw/Mn) of the component (A1) is not particularly limited, but is preferably 1.0 to 5.0, more preferably 1.0 to 4.0, and most preferably 1.0 to 3.0. Here, Mn is the number average molecular weight.

As the component (A1), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount is 25% by weight or more, the resolution of a pattern can be enhanced, and process margin such as exposure latitude (EL margin), depth of focus (DOF) and the like can be assured.

In the resist composition of the present invention, the component (A) may contain "a base component which exhibits changed solubility in a developing solution under action of acid" other than the component (A1) (hereafter, referred to as "component (A2)").

The component (A2) is not particularly limited, and any of the multitude of conventional base components used within chemically amplified resist compositions (e.g., base resins used within chemically amplified resist compositions for ArF excimer lasers or KrF excimer lasers, preferably ArF excimer lasers) can be used. As the component (A2), one type of base component may be used, or two or more types of base components may be used in combination.

In the resist composition of the present embodiment, as the component (A), one type may be used, or two or more types may be used in combination.

In the resist composition of the present embodiment, the amount of the component (A) can be appropriately adjusted depending on the thickness of the resist film to be formed, and the like.

<<Other Components>>

The resist composition of the present embodiment may contain a component other than the component (A), in addition to the component (A). As the component other than the component (A), a component (B), a component (D), a component (E), a component (F) and a component (S) described below can be mentioned.

Component (B)

The resist composition of the present embodiment may further include an acid generator component (B) (hereinafter, referred to as "component (B)") in addition to the component (A).

As the component (B), there is no particular limitation, and any of the known acid generators used in conventional chemically amplified resist compositions can be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators. Among these, onium salt acid generators are preferably used.

Examples of the onium salt acid generators include a compound represented by general formula (b-1) shown below (hereafter, sometimes referred to as "component (b-1)"), a compound represented by general formula (b-2) shown below (hereafter, sometimes referred to as "component (b-2)") and a compound represented by general formula (b-3) shown below (hereafter, sometimes referred to as "component (b-3)").

[Chemical Formula 26]

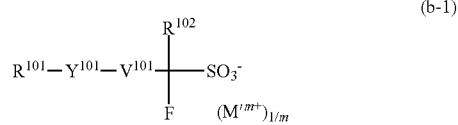

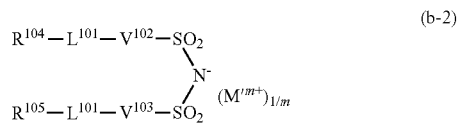

-continued

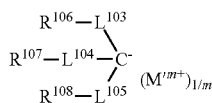

(b-3)

In the formulas, $R^{101}$ and $R^{104}$ to $R^{1'''}$ each independently represents a cyclic group with or without a substituent, a chain-like alkyl group with or without a substituent or a chain-like alkenyl group with or without a substituent, provided that, $R^{104}$ and $R^{105}$ may be mutually bonded to form a ring;

$R^{102}$ represents a fluorine atom or a fluorinated alkyl group of 1 to 5 carbon atoms; $Y^{101}$ represents a single bond or a divalent linking group containing an oxygen atom; $V^{101}$ to $V^{103}$ each independently represents a single bond, an alkylene group or a fluorinated alkylene group; $L^{101}$ and $L^{102}$ each independently represents a single bond or an oxygen atom; $L^{103}$ to $L^{105}$ each independently represents a single bond, —CO— or —SO$_2$—; and m each independently represents an integer of 1 or more; and $M'^{m+}$ each independently represents an onium cation having a valency of m.

{Anion Moiety}

Anion Moiety of Component (b-1)

In the formula (b-1), $R^{101}$ represents a cyclic group with or without a substituent, a chain-like alkyl group with or without a substituent or a chain-like alkenyl group with or without a substituent.

Cyclic Group with or without a Substituent:

The cyclic group is preferably a cyclic hydrocarbon group, and the cyclic hydrocarbon group may be either an aromatic hydrocarbon group or an aliphatic hydrocarbon group. An "aliphatic hydrocarbon group" refers to a hydrocarbon group that has no aromaticity. The aliphatic hydrocarbon group may be either saturated or unsaturated, but in general, the aliphatic hydrocarbon group is preferably saturated.

The aromatic hydrocarbon group for $R^{101}$ is a hydrocarbon group having an aromatic ring. The aromatic hydrocarbon group preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group for $R^{101}$ include benzene, biphenyl, fluorene, naphthalene, anthracene and phenanthrene; and aromatic hetero rings in which part of the carbon atoms constituting these aromatic rings has been substituted with a hetero atom. Examples of the hetero atom within the aromatic hetero rings include an oxygen atom, a sulfur atom and a nitrogen atom.

Specific examples of the aromatic hydrocarbon group for $R^{101}$ include a group in which one hydrogen atom has been removed from the aforementioned aromatic ring (aryl group such as a phenyl group and a naphthyl group); and a group in which one hydrogen atom of the aforementioned aromatic ring has been substituted with an alkylene group (an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atoms, more preferably 1 or 2, and most preferably 1.

Examples of the cyclic aliphatic hydrocarbon group for $R^{101}$ include an aliphatic hydrocarbon group containing a ring in the structure thereof.

As examples of the aliphatic hydrocarbon group containing a ring in the structure thereof, an alicyclic hydrocarbon group (a group in which one hydrogen atom has been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed within a linear or branched aliphatic hydrocarbon group, can be given.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic alicyclic hydrocarbon group, a group in which one or more hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the polycycloalkane preferably has 7 to 30 carbon atoms. Among these, as polycycloalkanes, polycycloalkanes containing a bridged ring-type polycyclic skeleton such as damantane, norbornane, isobornane, tricyclodecane or tetracyclododecane, and polycycloalkanes containing a condensed ring-type polycyclic skeleton such as a cyclic group containing a steroid skeleton can be mentioned.

In the present specification, the term "steroid skeleton" means a skeleton (st) in which three 6-membered rings and one 5-membered ring have been linked, and the structure thereof is shown below.

[Chemical Formula 27]

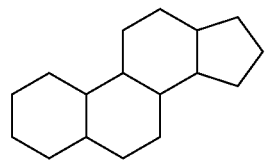

(st)

Among these, as the cyclic aliphatic hydrocarbon group for $R^{101}$, a group in which one or more hydrogen atoms have been removed from a monocycloalkane or a polycycloalkane is preferable, and a group in which one hydrogen atom has been removed from a polycycloalkane is more preferable, an adamantyl group and a norbornyl group are particularly preferable, and an adamantyl group is most preferable.

The linear or branched aliphatic hydrocarbon group which may be bonded to the alicyclic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable, and specific examples include a methylene group [—CH$_2$—], an ethylene group [—(CH$_2$)$_2$—], a trimethylene group [—(CH$_2$)$_3$—], a tetramethylene group [—(CH$_2$)$_4$-] and a pentamethylene group [—(CH$_2$)$_5$—].

As the branched aliphatic hydrocarbon group, a branched alkylene group is preferable, and specific examples include alkylalkylene groups, e.g., alkylmethylene groups such as —CH(CH₃)—, —CH(CH₂CH₃)—, —C(CH₃)₂—, —C(CH₃)(CH₂CH₃)—, —C(CH₃)(CH₂CH₂CH₃)—, and —C(CH₂CH₃)₂—; alkylethylene groups such as —CH(CH₃)CH₂—, —CH(CH₃)CH(CH₃)—, —C(CH₃)₂CH₂—, —CH(CH₂CH₃)CH₂—, and —C(CH₂CH₃)₂—CH₂—; alkyltrimethylene groups such as —CH(CH₃)CH₂CH₂—, and —CH₂CH(CH₃)CH₂—; and alkyltetramethylene groups such as —CH(CH₃)CH₂CH₂CH₂—, and —CH₂CH(CH₃)CH₂CH₂—. As the alkyl group within the alkylalkylene group, a linear alkyl group of 1 to 5 carbon atoms is preferable.

Further, the cyclic hydrocarbon group for $R^{101}$ may contain a hetero atom, like as a heterocycle. Specific examples thereof include lactone-containing cyclic groups represented by the aforementioned general formulae (a2-r-1) to (a2-r-7), —SO₂— containing cyclic groups represented by the aforementioned formulae (a5-r-1) to (a5-r-4) and heterocycles shown below.

[Chemical Formula 28]

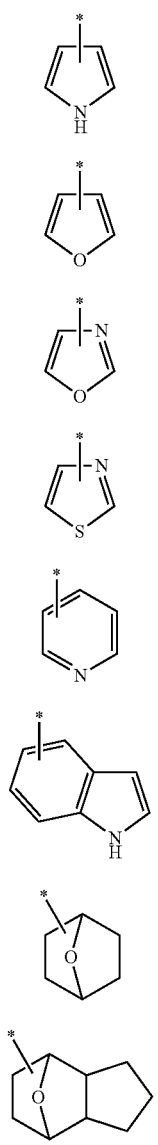

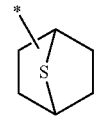
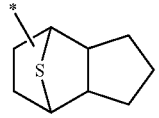
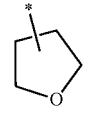
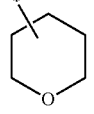
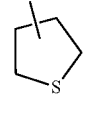
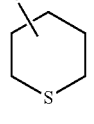
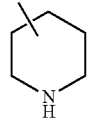
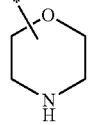

As the substituent for substituting the cyclic hydrocarbon group for $R^{101}$, an alkyl group, an alkoxy group, a halogen atom, a halogenated alkyl group, a hydroxyl group, a carbonyl group, a nitro group or the like can be used.

The alkyl group as the substituent is preferably an alkyl group of 1 to 5 carbon atoms, and a methyl group, an ethyl group, a propyl group, an n-butyl group or a tert-butyl group is most desirable.

The alkoxy group as the substituent is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent include a fluorine atom, a chlorine atom, a bromine atom and an iodine atom, and a fluorine atom is preferable.

Example of the halogenated alkyl group as a substituent includes a group in which a part or all of the hydrogen atoms within an alkyl group of 1 to 5 carbon atoms such as a methyl group, an ethyl group, a propyl group, an n-butyl group or a tert-butyl group have been substituted with the aforementioned halogen atoms.

The carbonyl group as a substituent is a group to substitute a methylene group (—$CH_2$—) constituting a cyclic hydrocarbon group.

Chain-like alkyl group with or without a substituent:

The chain-like alkyl group for $R^{101}$ may be either linear or branched.

The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

Chain-like alkenyl group with or without a substituent:

The chain-like alkenyl group for $R^{101}$ may be linear or branched, and preferably has 2 to 10 carbon atoms, more preferably 2 to 5 carbon atoms, still more preferably 2 to 4 carbon atoms, and particularly preferably 3 carbon atoms. Examples of linear alkenyl groups include a vinyl group, a propenyl group (an allyl group) and a butynyl group. Examples of branched alkenyl groups include a 1-methylvinyl group, 2-methylvinyl group, a 1-methylpropenyl group and a 2-methylpropenyl group.

Among the above-mentioned examples, as the chain-like alkenyl group, a linear alkenyl group is preferable, a vinyl group and a propenyl group are more preferable, and a vinyl group is particularly desirable.

As the substituent for substituting the chain-like alkyl group or alkenyl group for $R^{101}$, an alkoxy group, a halogen atom, a halogenated alkyl group, a hydroxyl group, a carbonyl group, a nitro group, an amino group, the same cyclic group as described above for $R^{101}$ or the like can be used.

Among these, as a cyclic group with or without a substituent is preferable, and a cyclic hydrocarbon group with or without a substituent is more preferable. Specific examples include a group in which one or more hydrogen atoms have been removed from a phenyl group, a naphthyl group or a polycycloalkane, lactone-containing cyclic groups represented by the aforementioned formulae (a2-r-1) to (a2-r-7) and —$SO_2$— containing cyclic groups represented by the aforementioned formulae (a5-r-1) to (a5-r-4) and the like.

In the formula (b-1), $Y^{101}$ represents a single bond or a divalent linking group containing an oxygen atom.

In the case where $Y^{101}$ is a divalent linking group containing an oxygen atom, $Y^{101}$ may contain an atom other than an oxygen atom. Examples of atoms other than an oxygen atom include a carbon atom, a hydrogen atom, a sulfur atom and a nitrogen atom.

Examples of divalent linkage groups containing an oxygen include non-hydrocarbon, oxygen atom-containing linking groups such as an oxygen atom (an ether bond; —O—), an ester bond (—C(=O)—O—), an oxycarbonyl group (—O—C(=O)—), an amide bond (—C(=O)—NH—), a carbonyl group (—C(=O)—) and a carbonate group (—O—C(=O)—O—); and a combination of any of the aforementioned non-hydrocarbon, oxygen atom-containing linking groups with an alkylene group. Furthermore, the combinations may have a sulfonyl group (—$SO_2$—) bonded thereto. As the divalent linking group containing an oxygen atom, linking groups represented by general formulae (y-a1-1) to (y-a1-7) shown below can be mentioned.

[Chemical Formula 29]

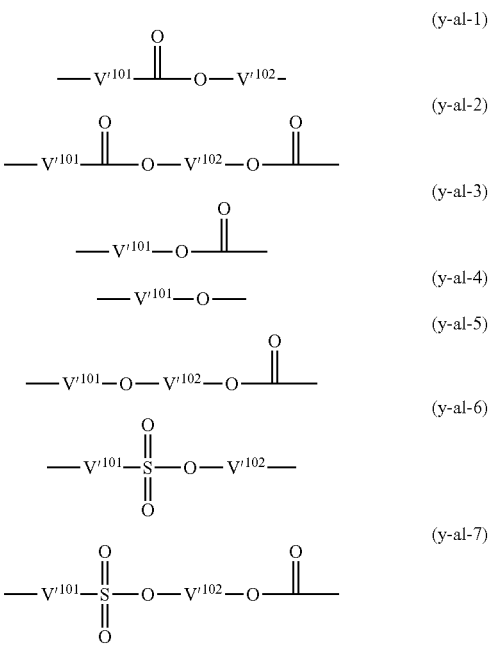

In the formulae, $V'^{101}$ represents a single bond or an alkylene group of 1 to 5 carbon atoms; $V'^{102}$ represents a divalent saturated hydrocarbon group of 1 to 30 carbon atoms.

As the divalent saturated hydrocarbon group for $V'^{102}$, an alkylene group of 1 to 30 carbon atoms is preferable, an alkylene group of 1 to 10 carbon atom is more preferable, and an alkylene group of 1 to 5 carbon atoms is still more preferable.

As the alkylene group for $V'^{101}$ and $V'^{102}$, a linear alkylene group or a branched alkylene group can be used, and a linear alkylene group is preferable.

Specific examples of the alkylene group for $V'^{101}$ and $V'^{102}$ include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; alkylethylene groups such as —CH($CH_3$)$CH_2$—, —CH($CH_3$)CH($CH_3$)—, —C($CH_3$)$_2CH_2$— and —CH($CH_2CH_3$)$CH_2$—; a trimethylene group (n-propylene group)[—$CH_2CH_2CH_2$—]; alkyltrimethylene groups such as —CH($CH_3$)$CH_2CH_2$— and —$CH_2$CH($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

Further, part of methylene group within the alkylene group for $V'^{101}$ and $V'^{102}$ may be substituted with a divalent aliphatic cyclic group of 5 to 10 carbon atoms. The aliphatic cyclic group is preferably a divalent group in which one hydrogen atom has been removed from the cyclic aliphatic hydrocarbon group (e.g., monocyclic aliphatic hydrocarbon group or polycyclic aliphatic hydrocarbon group) described above for $Ra'^3$ in the aforementioned formula (a1-r-1), and a cyclohexylene group, 1,5-adamantylene group or 2,6-adamantylene group is more preferable.

$Y^{101}$ is preferably a divalent linking group containing an ether bond or an ester bond, and linking groups represented by the aforementioned formulas (y-a1-1) to (y-a1-5) are preferable.

In the formula (b-1), $V^{101}$ represents a single bond, an alkylene group or a fluorinated alkylene group. The alkylene group or fluorinated alkylene group for $V^{101}$ preferably has 1 to 4 carbon atoms. As the fluorinated alkylene group for $V^{101}$, a group in which part or all of the hydrogen atoms within the aforementioned alkylene group for $V^{101}$ has been substituted with fluorine atoms can be used. Among these, $V^{101}$ is preferably a single bond or a fluorinated alkylene group of 1 to 4 carbon atoms.

In the formula (b-1), $R^{102}$ represents a fluorine atom or a fluorinated alkyl group of 1 to 5 carbon atoms. $R^{102}$ is preferably a fluorine atom or a perfluoroalkyl group of 1 to 5 carbon atoms, and is more preferably a fluorine atom.

As specific examples of anion moieties in the compound (b-1), when $Y^{101}$ is a single bond, fluorinated alkylsulfonate anions such as a trifluoromethanesulfonate anion or a perfluorobutanesulfonate anion can be mentioned; and when $Y^{101}$ is a divalent linking group containing an oxygen atom, anions represented by formulae (an-1) to (an-3) shown below can be mentioned.

[Chemical Formula 30]

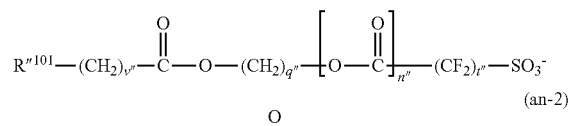
(an-1)

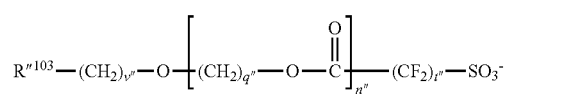
(an-2)

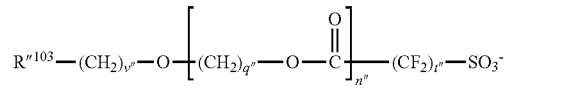
(an-3)

In the formulas, $R''^{101}$ represents an aliphatic cyclic group with or without a substituent, a group represented by any one of the aforementioned formulas (r-hr-1) to (r-hr-6) or a chain-like alkyl group with or without a substituent; $R''^{102}$ represents an aliphatic cyclic group with or without a substituent, a lactone-containing cyclic group represented by any one of the aforementioned formulas (a2-r-1) to (a2-r-7) or an —$SO_2$-containing cyclic group represented by any one of the aforementioned formulas (a5-r-1) to (a5-r-4); $R''^{103}$ represents an aromatic cyclic group with or without a substituent, an aliphatic cyclic group with or without a substituent or a chain-like alkenyl group with or without a substituent; v" represents an integer of 0 to 3; q" represents an integer of 1 to 20; t" each independently represents an integer of 1 to 3; and n" each independently represents 0 or 1.

As the aliphatic cyclic group for $R''^{101}$, $R''^{102}$ and $R''^{103}$ with or without a substituent, the same groups as the cyclic aliphatic hydrocarbon group for $R^{101}$ described above are preferable. As the substituent, the same groups as those described above for substituting the cyclic aliphatic hydrocarbon group for $R^{101}$ can be mentioned.

As the aromatic cyclic group for $R''^{103}$ with or without a substituent, the same groups as the aromatic hydrocarbon group exemplified as a cyclic hydrocarbon group for $R^{101}$ described above are preferable. As the substituent, the same groups as those described above for substituting the aromatic hydrocarbon group for $R^{101}$ can be mentioned.

As the chain-like alkyl group for $R''^{101}$ with or without a substituent, the same groups exemplified as the chain-like alkyl group for $R^{101}$ are preferable. As the chain-like alkenyl group for $R''^{103}$ with or without a substituent, the same groups exemplified above as the chain-like alkenyl group for $R^{101}$ are preferable.

Anion Moiety of Component (b-2)

In formula (b-2), $R^{104}$ and $R^{105}$ each independently represents a cyclic group with or without a substituent, a chain-like alkyl group with or without a substituent or a chain-like alkenyl group with or without a substituent, and is the same groups as those defined above for $R^{101}$ in the aforementioned formula (b-1), provided that, $R^{104}$ and $R^{105}$ may be mutually bonded to form a ring.

As $R^{104}$ and $R^{105}$, a chain-like alkyl group with or without a substituent is preferable, and a linear or branched alkyl group or a linear or branched fluorinated alkyl group is more preferable.

The chain-like alkyl group preferably has 1 to 10 carbon atoms, preferably 1 to 7, and more preferably 1 to 3. The smaller the number of carbon atoms of the chain-like alkyl group for $R^{104}$ and $R^{105}$ within the above-mentioned range of the number of carbon atoms, the more the solubility in a resist solvent is improved. Further, in the chain-like alkyl group for $R^{104}$ and $R^{105}$, it is preferable that the number of hydrogen atoms substituted with fluorine atoms is as large as possible because the acid strength increases and the transparency to high energy radiation of 200 nm or less or electron beam is improved.

The fluorination ratio of the chain-like alkyl group is preferably from 70 to 100%, more preferably from 90 to 100%, and it is particularly desirable that the chain-like alkyl group be a perfluoroalkyl group in which all hydrogen atoms are substituted with fluorine atoms.

In formula (b-2), $V^{102}$ and $V^{103}$ each independently represents a single bond, an alkylene group or a fluorinated alkylene group, and is the same groups as those defined above for $V^{101}$ in the aforementioned formula (b-1).

In the formula (b-2), $L^{101}$ and $L^{102}$ each independently represents a single bond or an oxygen atom.

Anion Moiety of Component (b-3)

In formula (b-3), $R^{106}$ to $R^{108}$ each independently represents a cyclic group with or without a substituent, a chain-like alkyl group with or without a substituent or a chain-like alkenyl group with or without a substituent, and is the same groups as those defined above for $R^{101}$ in the aforementioned formula (b-1), $L^{103}$ to $L^{105}$ each independently represents a single bond, —CO— or —$SO_2$—.

{Cation Moiety}

In the formulas (b-1), (b-2) and (b-3), m represents an integer of 1 or more, and $M^{m+}$ represents an onium cation having a valency of m. As an onium cation, a sulfonium cation or an iodonium cation can be preferably mentioned, and cation moieties represented by general formulae (ca-1) to (ca-4) shown below are particularly preferable.

[Chemical Formula 31]

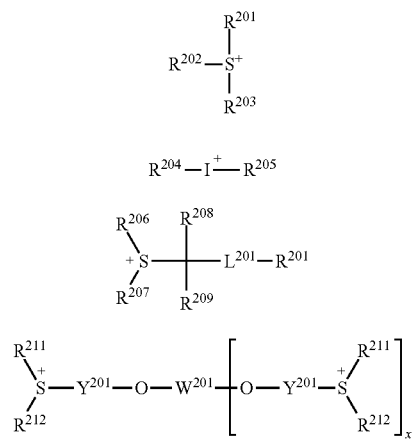

(ca-1)
(ca-2)
(ca-3)
(ca-4)

In the formulas, each of $R^{201}$ to $R^{207}$, $R^{211}$ and $R^{212}$ independently represents an aryl group with or without a substituent, an alkyl group with or without a substituent or an alkenyl group with or without a substituent; $R^{201}$ to $R^{203}$, $R^{206}$, $R^{207}$, $R^{211}$ and $R^{212}$ may be mutually bonded to form a ring with the sulfur atom; $R^{208}$ and $R^{209}$ each represents a hydrogen atom or an alkyl group of 1 to 5 carbon atoms; $R^{210}$ represents an aryl group with or without a substituent, an alkyl group with or without a substituent, an alkenyl group with or without a substituent or an —$SO_2$— containing cyclic group with or without a substituent; $L^{201}$ represents —C(=O)— or —C(=O)—O—; $Y^{201}$ each independently represents an arylene group, an alkylene group or an alkenylene group; x represents 1 or 2; and $W^{201}$ represents a linking group having a valency of (x+1).

As the aryl group for $R^{201}$ to $R^{207}$, $R^{211}$ and $R^{212}$, an unsubstituted aryl group of 6 to 20 carbon atoms can be mentioned, and a phenyl group or a naphthyl group is preferable.

As the alkyl group for $R^{201}$ to $R^{207}$, $R^{211}$ and $R^{212}$, a chain-like or cyclic alkyl group of 1 to 30 carbon atoms is preferable.

The alkenyl group for $R^{201}$ to $R^{207}$, $R^{211}$ and $R^{212}$ preferably has 2 to 10 carbon atoms.

Specific examples of the substituent which $R^{201}$ to $R^{207}$, $R^{210}$ and $R^{212}$ may have include an alkyl group, a halogen atom, a halogenated alkyl group, a carbonyl group, a cyano group, an amino group, an aryl group and groups represented by formulas (ca-r-1) to (ca-r-7) shown below.

[Chemical Formula 32]

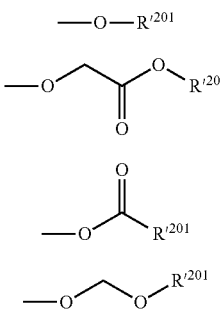

[ca-r-1]
[ca-r-2]
[ca-r-3]
[ca-r-4]

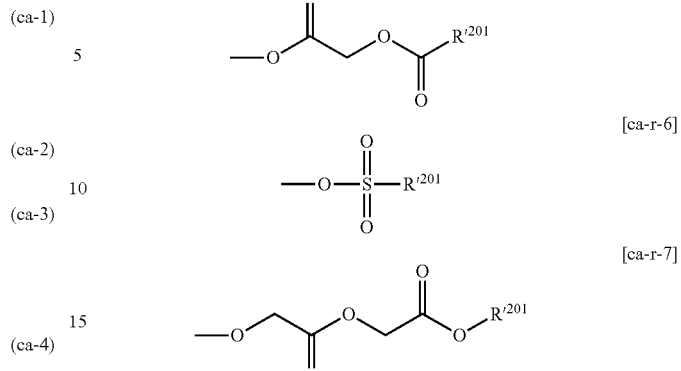

[ca-4-5]
[ca-r-6]
[ca-r-7]

In the formulas, $R'^{201}$ each independently represents a hydrogen atom, a cyclic group with or without a substituent, a chain-like alkyl group with or without a substituent or a chain-like alkenyl group with or without a substituent.

As the cyclic group with or without a substituent, the chain-like alkyl group with or without a substituent and the chain-like alkenyl group with or without a substituent for $R'^{201}$, the same groups as those for $R^{101}$ in formula (b-1) described later can be mentioned. As the cyclic group with or without a substituent and chain-like alkyl group with or without a substituent, the same groups as those described above for the acid dissociable group represented by the aforementioned formula (a1-r-2) can be also mentioned.

When $R^{201}$ and $R^{203}$, $R^{206}$ and $R^{207}$, and $R^{211}$ and $R^{212}$ are mutually bonded to form a ring with the sulfur atom, these groups may be mutually bonded via a hetero atom such as a sulfur atom, an oxygen atom or a nitrogen atom, or a functional group such as a carbonyl group, —SO—, —$SO_2$—, —$SO_3$—, —COO—, —CONH— or —N($R_N$)— (wherein $R_N$ represents an alkyl group of 1 to 5 carbon atoms). As the ring to be formed, the ring containing the sulfur atom in the skeleton thereof is preferably a 3 to 10-membered ring, and particularly preferably a 5 to 7-membered ring. Examples of the formed ring include a thiophene ring, a thiazole ring, a benzothiophene ring, a thianthrene ring, a benzothiophene ring, a dibenzothiophene ring, a 9H-thioxanthene ring, a thioxanthone ring, a thianthrene ring, a phenoxathiin ring, a tetrahydrothiophenium ring and a tetrahydrothiopyranium ring.

$R^{208}$ and $R^{209}$ each independently represents a hydrogen atom or an alkyl group of 1 to 5 carbon atoms, is preferably a hydrogen atom or an alkyl group of 1 to 3 carbon atoms, and when $R^{208}$ and $R^{209}$ each represents an alkyl group, $R^{208}$ and $R^{209}$ may be mutually bonded to form a ring.

$R^{210}$ represents an aryl group with or without a substituent, an alkyl group with or without a substituent, an alkenyl group with or without a substituent or an —$SO_2$-containing cyclic group with or without a substituent.

As the aryl group for $R^{210}$, an unsubstituted aryl group of 6 to 20 carbon atoms can be mentioned, and a phenyl group or a naphthyl group is preferable.

As the alkyl group for $R^{210}$, a chain-like or cyclic alkyl group of 1 to 30 carbon atoms is preferable.

The alkenyl group for $R^{210}$ preferably has 2 to 10 carbon atoms.

As the —$SO_2$— containing cyclic group for $R^{210}$ with or without a substituent, the same groups as those described above for "—$SO_2$— containing cyclic group" can be mentioned, and the group represented by the aforementioned general formula (a5-r-1) is preferable.

$Y^{201}$ each independently represents an arylene group, an alkylene group or an alkenylene group.

As the arylene group for $Y^{201}$, a group in which one hydrogen atom has been removed from an aryl group exemplified as an aromatic hydrocarbon group for $R^{101}$ in the aforementioned formula (b-1) can be mentioned.

As the alkylene group and alkenylene group for $Y^{201}$, a group in which one hydrogen atom has been removed from a group exemplified as a chain-like alkyl group or chain-like alkenyl group for $R^{101}$ in the aforementioned general formula (b-1) can be mentioned.

In the formula (ca-4), x represents 1 or 2.

$W^{201}$ represents a linking group having a valency of (x+1), that is, a divalent or trivalent linking group.

As the divalent linking group for $W^{201}$, a divalent hydrocarbon groups with or without a substituent is preferable, and as examples thereof, the same groups as the divalent hydrocarbon group for $Ya^{21}$ with or without a substituent in the aforementioned general formula (a2-1) can be mentioned. The divalent linking group for $W^{201}$ may be linear, branched or cyclic, and cyclic is more preferable. Among these, an arylene group having two carbonyl groups, each bonded to the terminal thereof is preferable. As the arylene group, a phenylene group and a naphthylene group can be mentioned. Of these, a phenylene group is particularly desirable.

As the trivalent linking group for $W^{201}$, a group in which one hydrogen atom has been removed from the aforementioned divalent linking group for $W^{201}$, and a group in which the divalent linking group has been bonded to an another divalent linking group can be mentioned. The trivalent linking group for $W^{201}$ is preferably an arylene group having two carbonyl groups bonded thereto.

Specific examples of preferable cations represented by formula (ca-1) include cations represented by formulas (ca-1-1) to (ca-1-67) shown below.

[Chemical Formula 33]

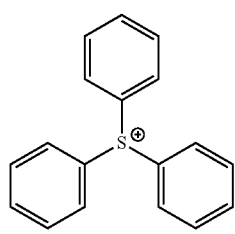

(ca-1-1)

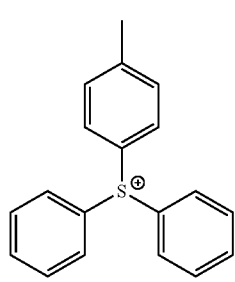

(ca-1-2)

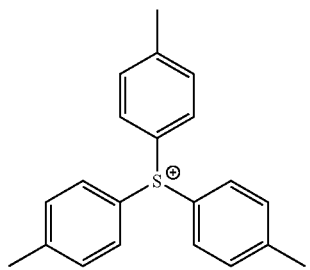

(ca-1-3)

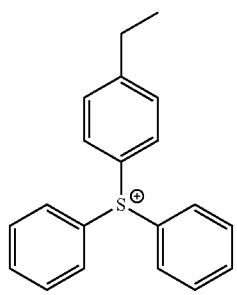

(ca-1-4)

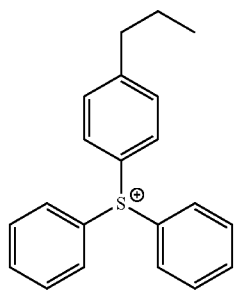

(ca-1-5)

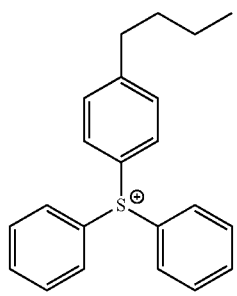

(ca-1-6)

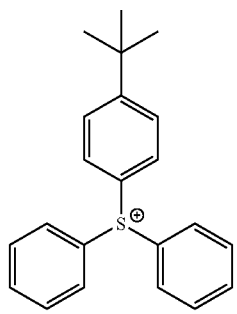

(ca-1-7)

(ca-1-8)
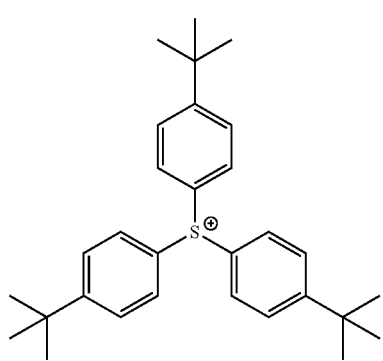
(ca-1-9)
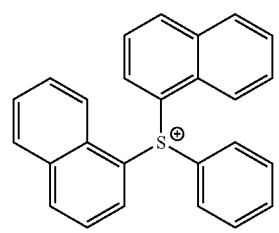
(ca-1-10)
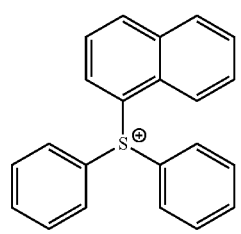
(ca-1-11)
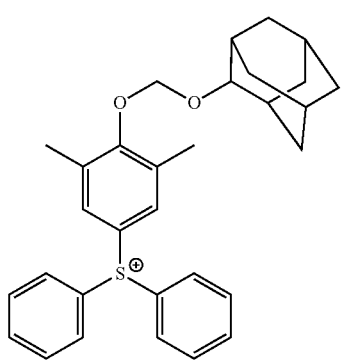
(ca-1-12)
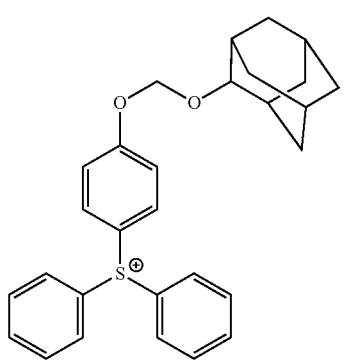
(ca-1-13)
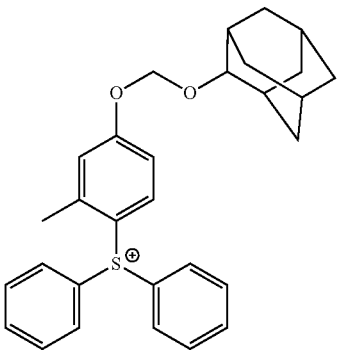
(ca-1-14)
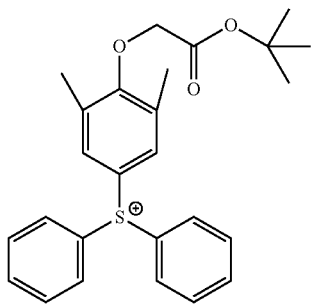
(ca-1-15)
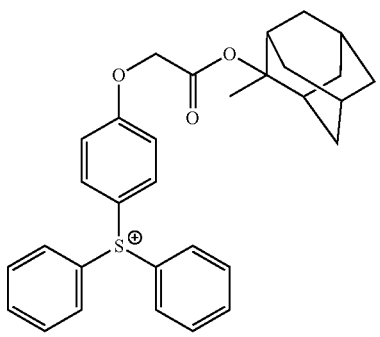
(ca-1-16)
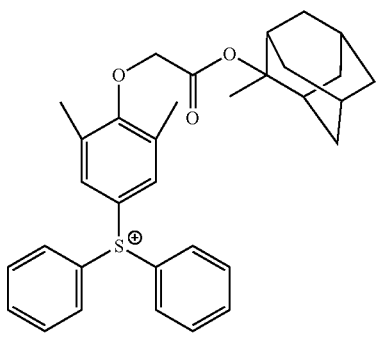

[Chemical Formula 34]
(ca-1-17)
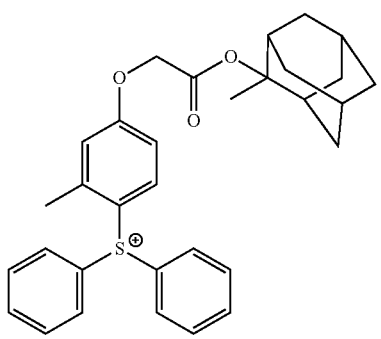
(ca-1-18)
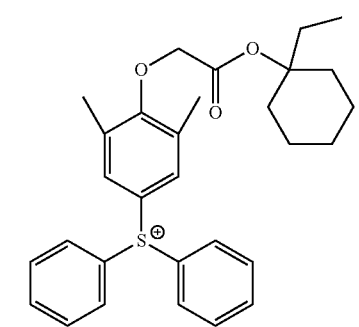
(ca-1-19)
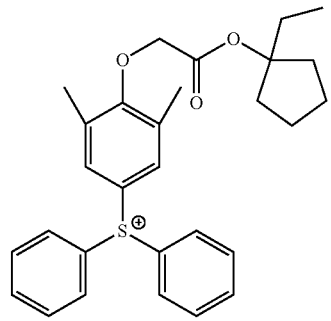
(ca-1-20)
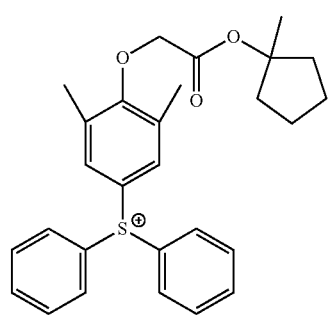
(ca-1-21)
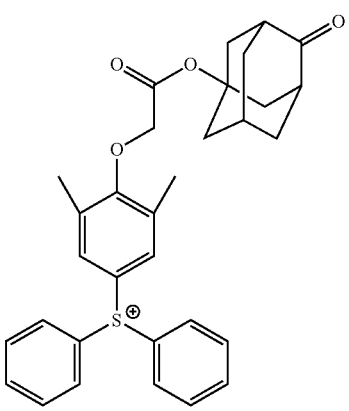
(ca-1-22)
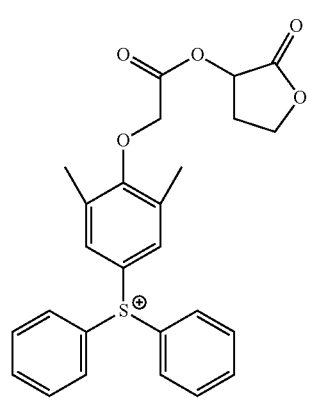
(ca-1-23)
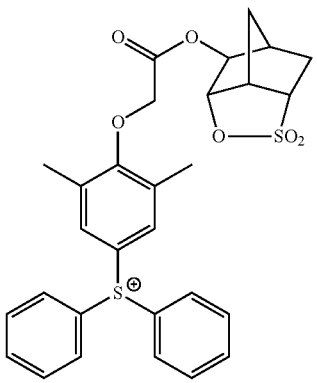
(ca-1-24)
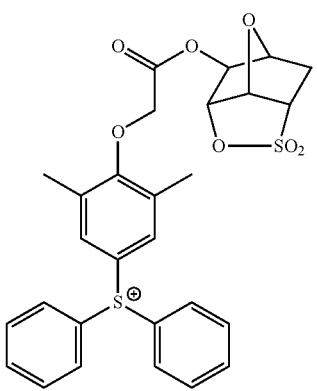

(ca-1-25) 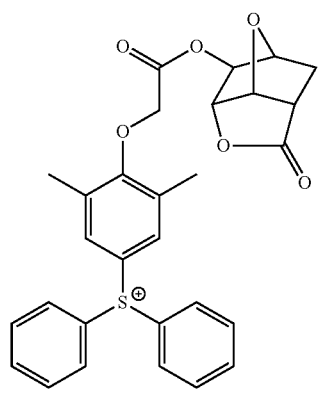
(ca-1-26) 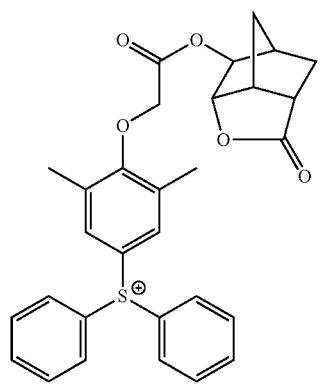
(ca-1-27) 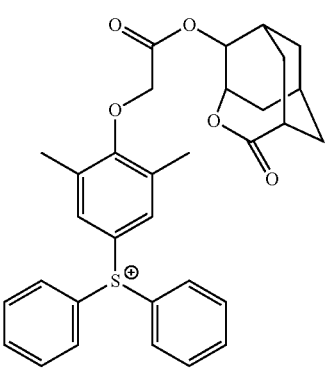
(ca-1-28) 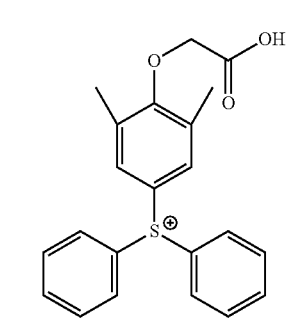
(ca-1-29) 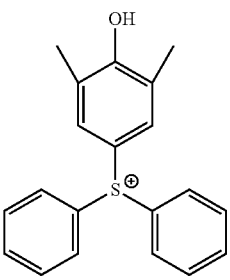
(ca-1-30) 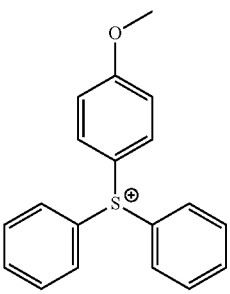
(ca-1-31) 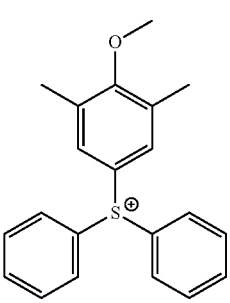
(ca-1-32) 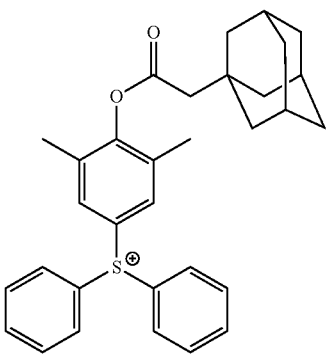
(ca-1-33) 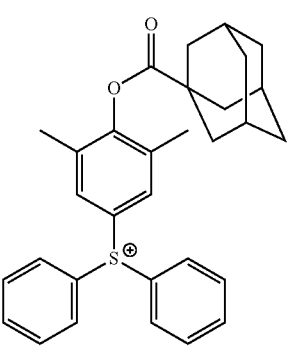

[Chemical Formula 35]
(ca-1-34)
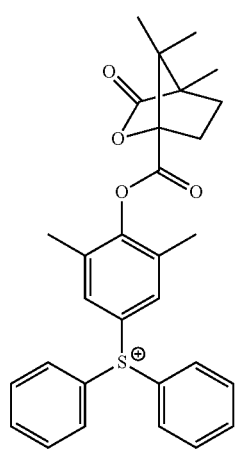
(ca-1-35)
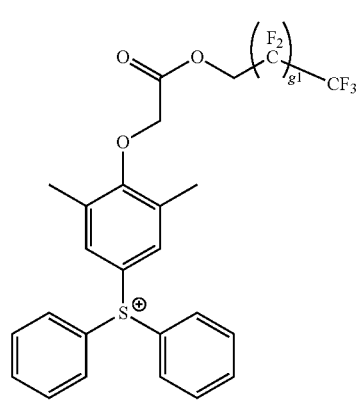
(ca-1-36)
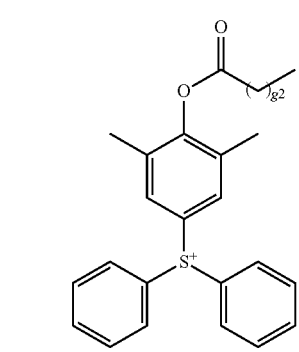
(ca-1-37)
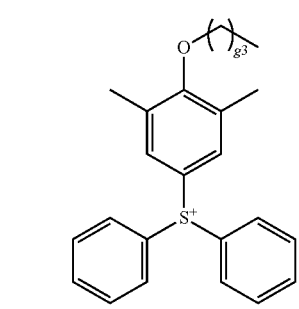
(ca-1-38)
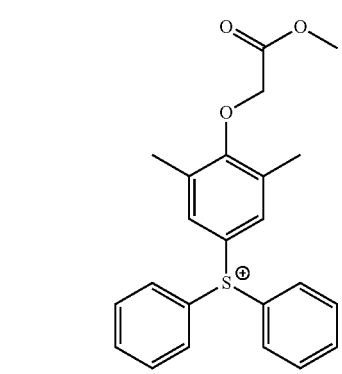
(ca-1-39)
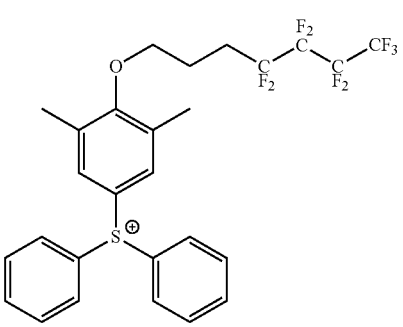
(ca-1-40)
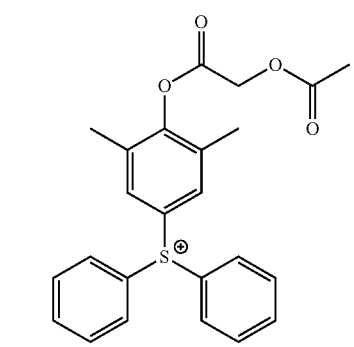
(ca-1-41)
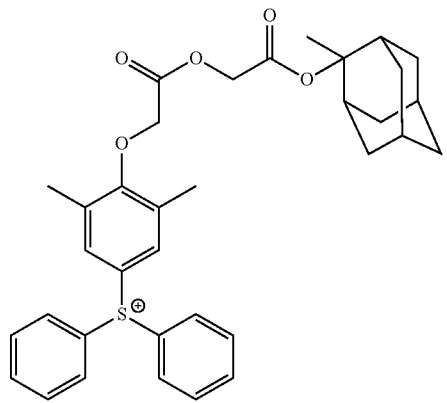

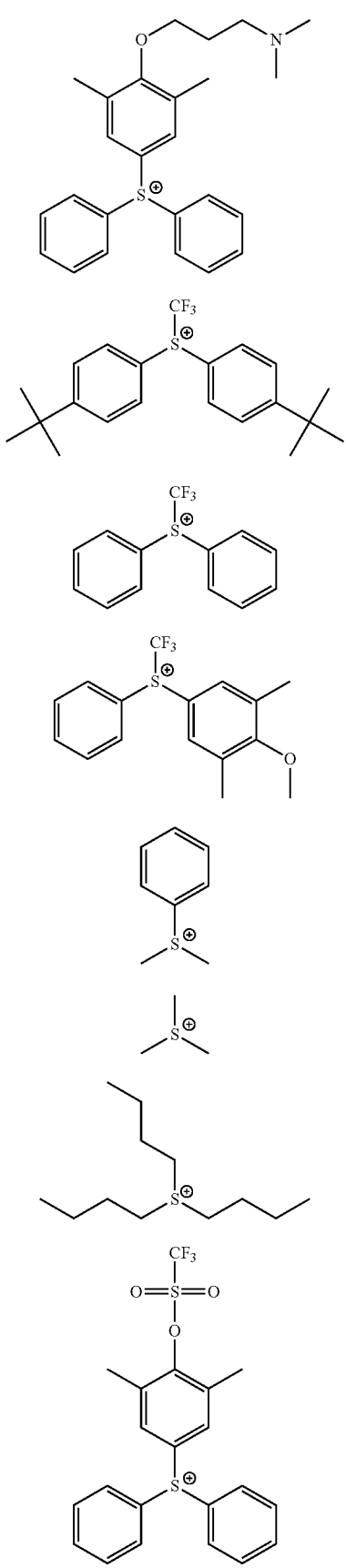
(ca-1-42)
(ca-1-43)
(ca-1-44)
(ca-1-45)
(ca-1-46)
(ca-1-47)
(ca-1-48)
(ca-1-49)
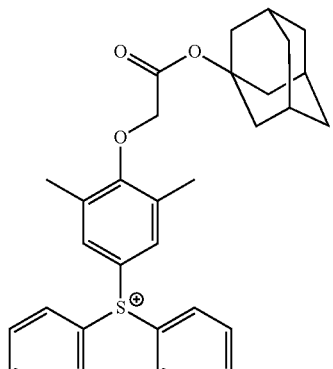
(ca-1-50)
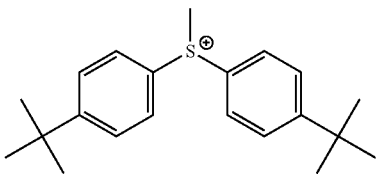
(ca-1-51)
In the formulas, g1, g2 and g3 represent recurring numbers, wherein g1 is an integer of 1 to 5, g2 is an integer of 0 to 20, and g3 is an integer of 0 to 20.
[Chemical Formula 36]
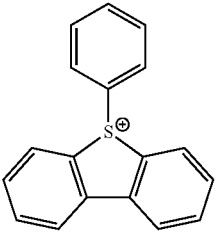
(ca-1-52)
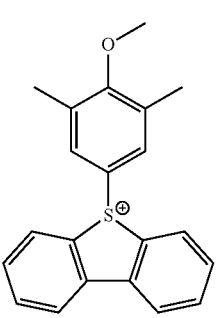
(ca-1-53)
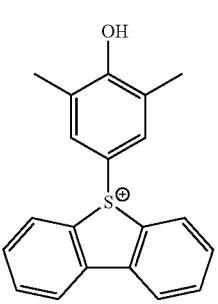
(ca-1-54)

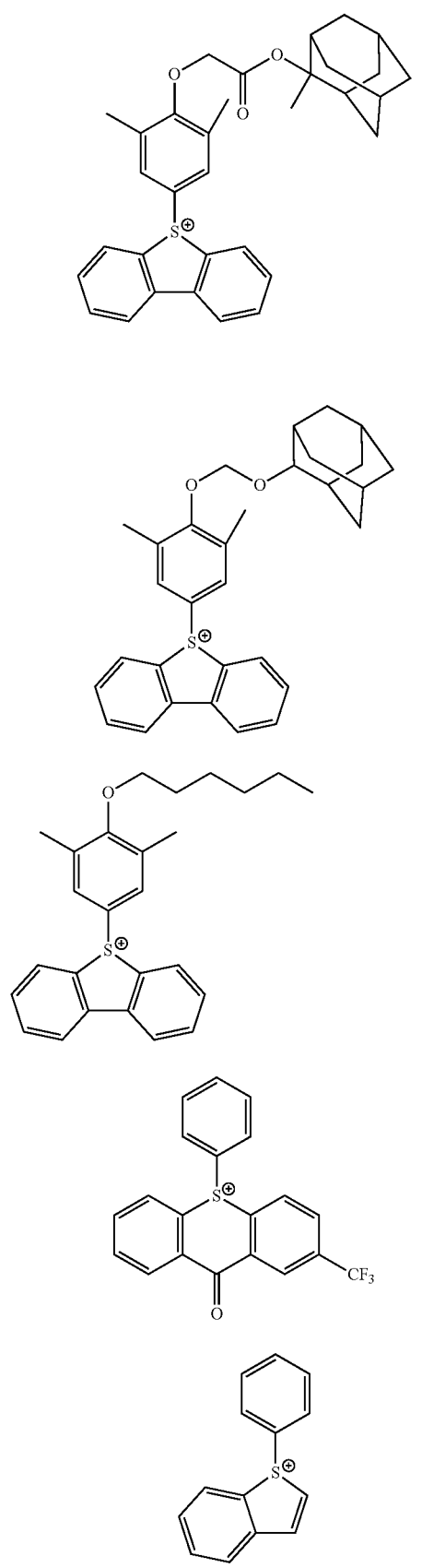
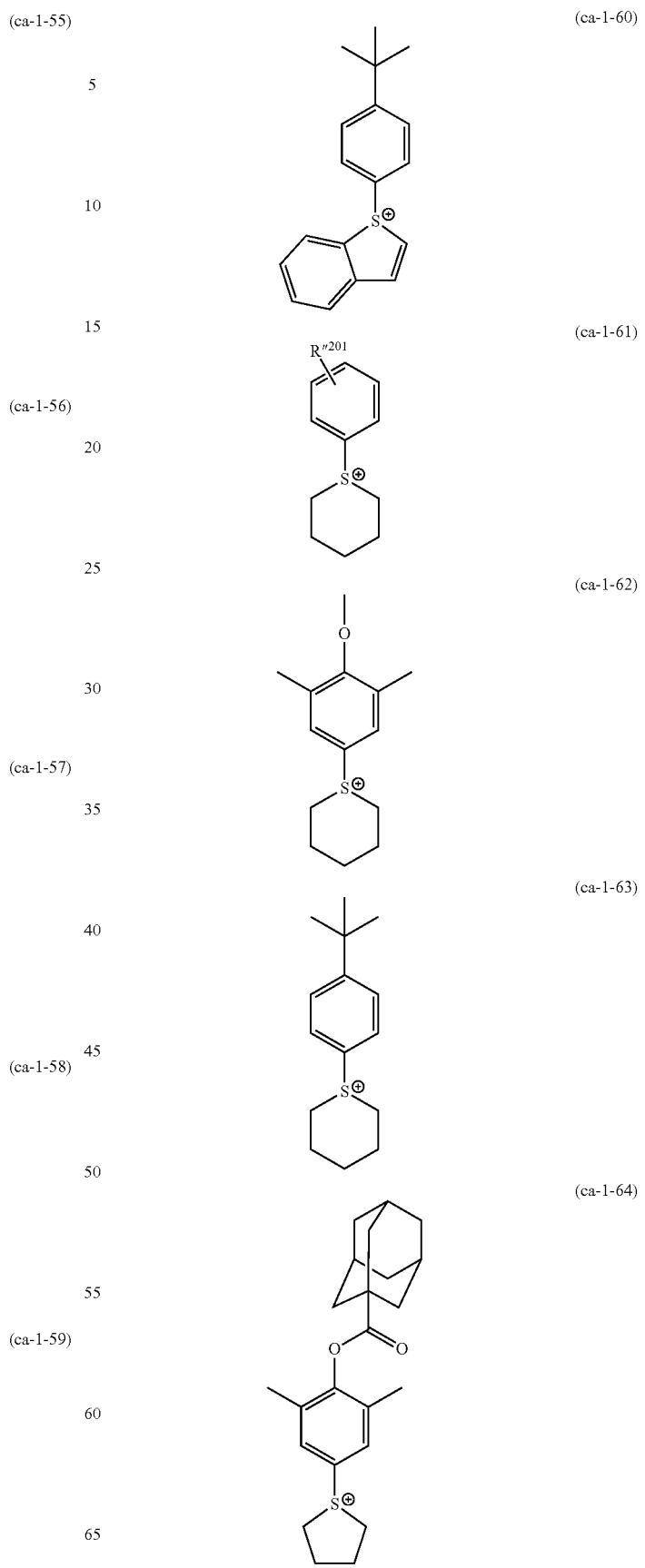

-continued (ca-1-65)

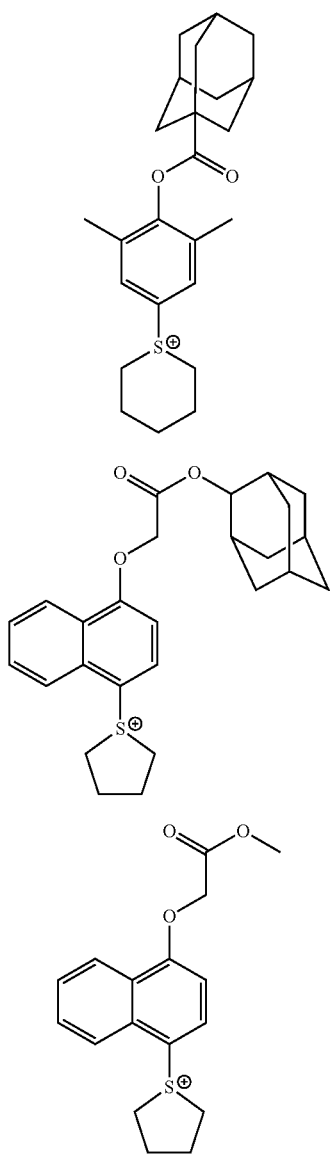

(ca-1-66)

(ca-1-67)

In the formulas, R''$^{201}$ represents a hydrogen atom or a substituent, and as the substituent, the same groups as those described above for substituting the R$^{201}$ to R$^{207}$ and R$^{210}$ to R$^{212}$ can be mentioned.

Specific examples of preferable cations represented by the formula (ca-2) include diphenyliodonium cation and bis(4-tert-butylphenyl)iodonium cation.

Specific examples of preferable cations represented by the formula (ca-3) include cations represented by formulae (ca-3-1) to (ca-3-6) shown below.

[Chemical Formula 37]

(ca-3-1)

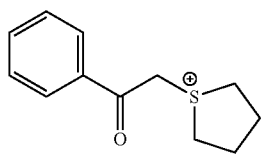

-continued (ca-3-2)

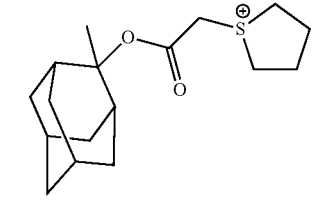

(ca-3-3)

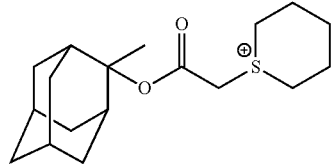

(ca-3-4)

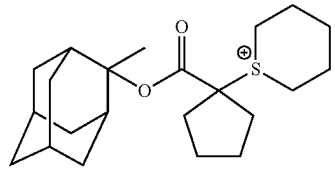

(ca-3-5)

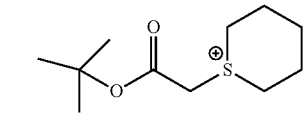

(ca-3-6)

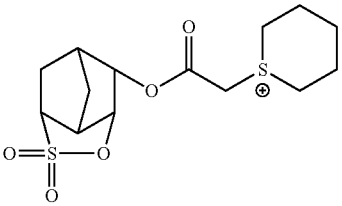

Specific examples of preferable cations represented by formula (ca-4) include cations represented by formulas (ca-4-1) to (ca-4-2) shown below.

[Chemical Formula 38]

(ca-4-1)

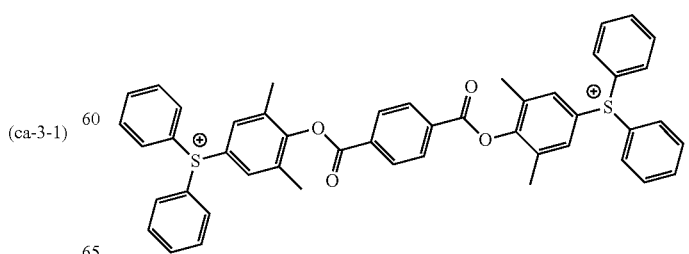

-continued (ca-4-2)

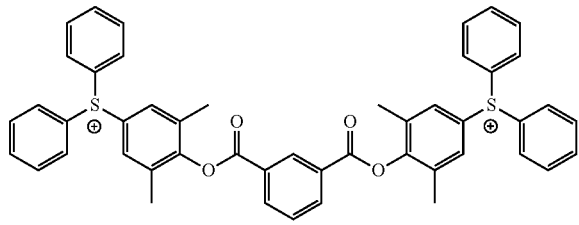

Among these, as the cation moiety [$(M^{m+})_{1/m}$], a cation moiety represented by general formula (ca-1) is preferable, and cation moieties represented by formulae (ca-1-1) to (ca-1-67) are more preferable.

As the component (13), one type of these acid generators may be used alone, or two or more types may be used in combination.

When the resist composition contains the component (B), the amount of the component (B) relative to 100 parts by weight of the component (A) is preferably within a range from 0.5 to 60 parts by weight, more preferably from 1 to 50 parts by weight, and still more preferably from 1 to 40 parts by weight.

When the amount of the component (B) is within the above-mentioned range, formation of a resist pattern can be satisfactorily performed. Further, by virtue of the above-mentioned range, when each of the components is dissolved in an organic solvent, an uniform solution can be obtained and the storage stability becomes satisfactory.

Component (D): Acid Diffusion Control Agent Component

Moreover, the resist composition of the present embodiment may include an acid diffusion control agent component (hereafter, referred to as "component (D)"), in addition to the component (A), or in addition to the component (A) and the component (B).

The component (D) functions as an acid diffusion control agent, i.e., a quencher which traps the acid generated upon exposure in a resist composition.

The component (D) may be a photodecomposable base (D1) (hereafter, referred to as "component (D1)") which is decomposed upon exposure and then loses the ability of controlling of acid diffusion, or a nitrogen-containing organic compound (D2) (hereafter, referred to as "component (D2)") which does not fall under the definition of component (D1).

Component (D1)

When a resist pattern is formed using a resist composition containing the component (D1), the contrast between exposed portions and unexposed portions is improved.

The component (D1) is not particularly limited, as long as it is decomposed upon exposure and then loses the ability of controlling of acid diffusion. As the component (D1), at least one compound selected from the group consisting of a compound represented by general formula (d1-1) shown below (hereafter, referred to as "component (d1-1)"), a compound represented by general formula (d1-2) shown below (hereafter, referred to as "component (d1-2)") and a compound represented by general formula (d1-3) shown below (hereafter, referred to as "component (d1-3)") is preferably used.

At exposed portions in a resist film, the components (d1-1) to (d1-3) are decomposed and then lose the ability of controlling of acid diffusion (i.e., basicity), and therefore the components (d1-1) to (d1-3) cannot function as a quencher, whereas at unexposed portions, the components (d1-1) to (d1-3) function as a quencher.

[Chemical Formula 39]

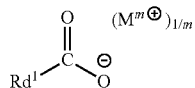

(d1-1)

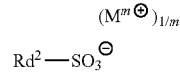

(d1-2)

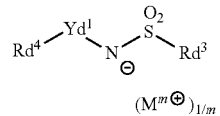

(d1-3)

wherein $Rd^1$ to $Rd^4$ each represents a cyclic group with or without a substituent, a chain-like alkyl group with or without a substituent or a chain-like alkenyl group with or without a substituent, provided that, in the formula (d1-2), the carbon atom within the $Rd^2$ adjacent to the sulfur atom has no fluorine atom bonded thereto; $Yd^1$ represents a single bond or a divalent linking group; and m each independently represents an integer of 1 or more; and $M^{m+}$ each independently represents an organic cation having a valency of m.

{Component (d1-1)}

Anion Moiety

In formula (d1-1), $Rd^1$ represents a cyclic group with or without a substituent, a chain-like alkyl group with or without a substituent or a chain-like alkenyl group with or without a substituent, and is the same groups as those defined above for $R^{101}$ in the formula (b-1).

Among these, as the group for $Rd^1$, an aromatic hydrocarbon group with or without a substituent, an aliphatic cyclic group with or without a substituent and a chain-like alkyl group with or without a substituent are preferable. Examples of the substituents include a hydroxy group, an oxo group, an alkyl group, an aryl group, a fluorine atom, a fluorinated alkyl group, a lactone-containing cyclic group represented by any one of general formulae (a2-r-1) to (a2-r-7), an ether bond, an ester bond or a combination of these groups. When $Rd^1$ has an ether bond or an ester bond as a substituent, an alkylene group may be interposed, and in the case, as the substituent, the linking groups represented by the general formulae (y-a1-1) to (y-a1-5) are preferable.

The aromatic hydrocarbon group is more preferably a phenyl group or a naphthyl group.

Examples of the aliphatic cyclic group include groups in which one or more hydrogen atoms have been removed from a polycycloalkane such as adamantane, norbornane, isobornane, tricyclodecane or tetracyclododecane.

The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl or a decyl group; and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group.

When the chain-like alkyl group is a fluorinated alkyl group containing a fluorine atom or a fluorinated alkyl group as a substituent, the fluorinated alkyl group preferably has 1 to 11 carbon atoms, more preferably 1 to 8, and still more preferably 1 to 4. The fluorinated alkyl group may contain an atom other than fluorine. Examples of the atom other than fluorine include an oxygen atom, a sulfur atom and a nitrogen atom.

As for $Rd^1$, a fluorinated alkyl group in which part or all of the hydrogen atoms constituting a linear alkyl group have been substituted with fluorine atom(s) is preferable, and a fluorinated alkyl group in which all of the hydrogen atoms constituting a linear alkyl group have been substituted with fluorine atoms (i.e., a linear perfluoroalkyl group) is more preferable.

Specific examples of preferable anion moieties for the component (d1-1) are shown below.

[Chemical Formula 40]

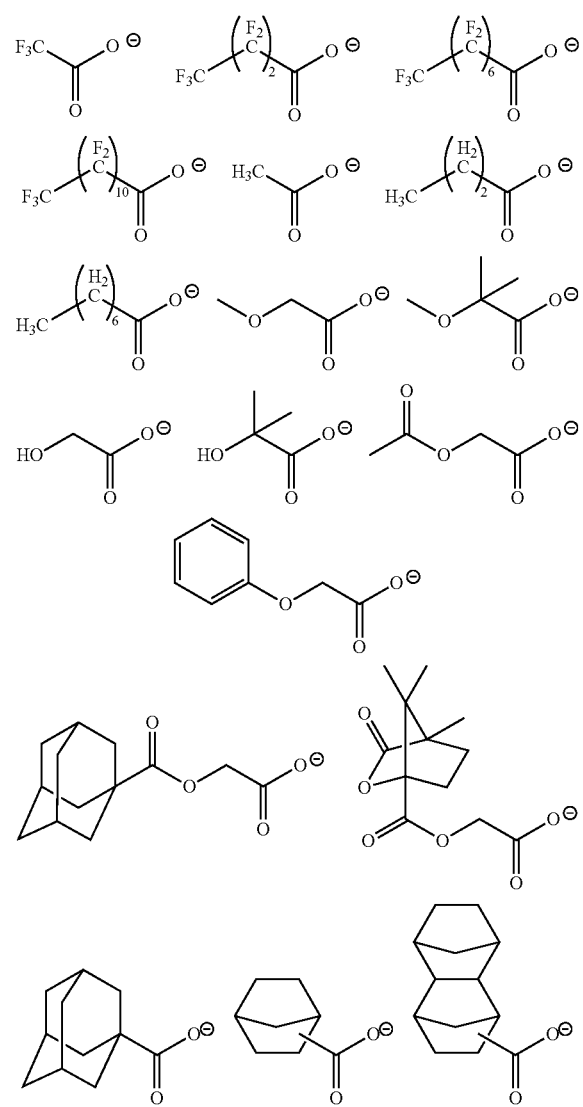

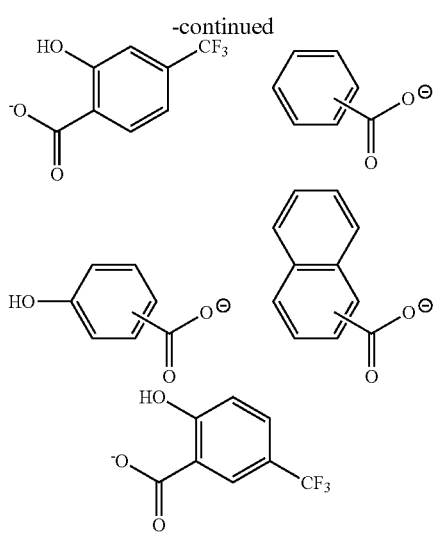

Cation Moiety

In formula (d1-1), $M^+$ represents an organic cation having a valency of m.

As the organic cation for $M^{m+}$, the same cation moieties as those represented by the aforementioned formulas (ca-1) to (ca-4) can be mentioned, a cation moiety represented by general formula (ca-1) is preferable, and cation moieties represented by the aforementioned formulas (ca-1-1) to (ca-1-67) are more preferable.

As the component (d1-1), one type of compound may be used, or two or more types of compounds may be used in combination.

{(Component (d1-2)}

Anion Moiety

In formula (d1-2), $Rd^2$ represents a cyclic group with or without a substituent, a chain-like alkyl group with or without a substituent or a chain-like alkenyl group with or without a substituent, and is the same groups as those defined above for $R^{101}$ in the formula (b-1), provided that, the carbon atom within $Rd^2$ group adjacent to the sulfur atom has no fluorine atom bonded thereto (i.e., the carbon atom within $Rd^2$ group adjacent to the sulfur atom is not substituted with a fluorine atom). As a result, the anion of the component (d1-2) becomes an appropriately weak acid anion, thereby improving the quenching ability of the component (D).

Among these, as $Rd^2$, a chain-like alkyl group with or without a substituent or an aliphatic cyclic group with or without a substituent is preferable. The chain-like alkyl group preferably has 1 to 10 carbon atoms, and more preferably 3 to 10 carbon atoms. As an aliphatic cyclic group, a group in which one or more hydrogen atoms have been removed from adamantane, norbornane, isobornane, tricyclodecane or tetracyclododecane (with or without a substituent); or a group in which one or more hydrogen atoms have been removed from camphor is more preferable.

The hydrocarbon group for $Rd^2$ may have a substituent. As the substituent, the same groups as those described above for substituting the hydrocarbon group (e.g., aromatic hydrocarbon group, aliphatic cyclic group, chain-like alkyl group) for $Rd^1$ in the formula (d1-1) can be mentioned.

Specific examples of preferable anion moieties for the component (d1-2) are shown below.

[Chemical Formula 41]

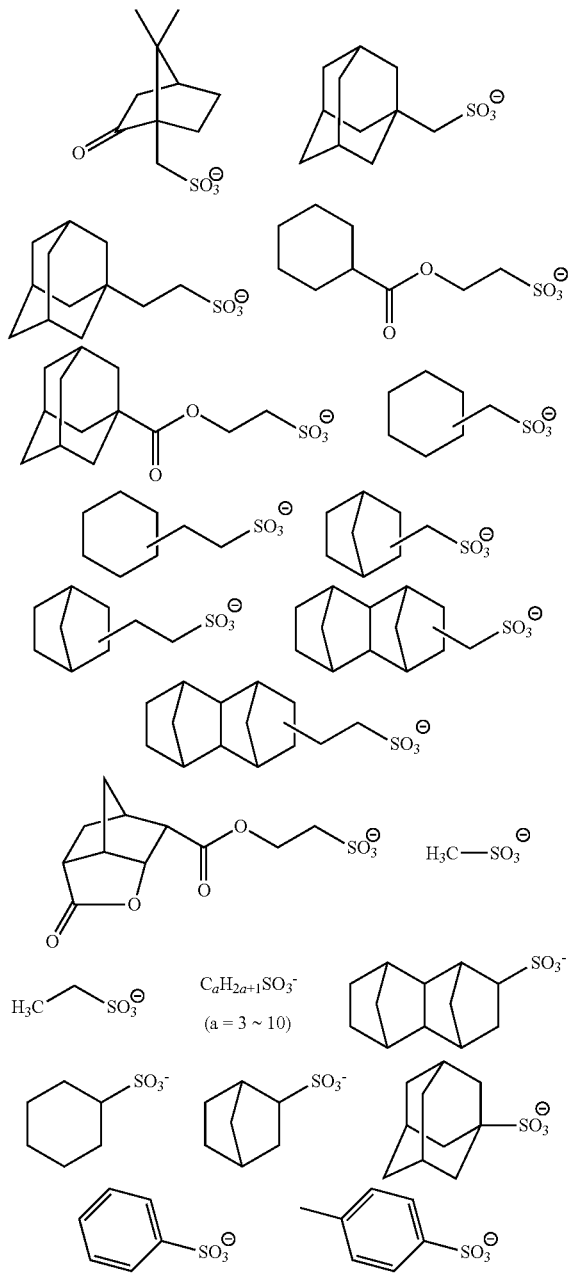

Cation Moiety

In formula (d1-2), M'''^m+ is an organic cation having a valency of m, and is the same as defined for M'^m+ in the aforementioned formula (d1-1).

As the component (d1-2), one type of compound may be used, or two or more types of compounds may be used in combination.

{(Component (d1-3)}
Anion Moiety

In formula (d1-3), $Rd^3$ represents a cyclic group with or without a substituent, a chain-like alkyl group with or without a substituent or a chain-like alkenyl group with or without a substituent, and is the same groups as those defined above for $R^{101}$ in the formula (b-1), and a cyclic group containing a fluorine atom, a chain-like alkyl group containing a fluorine atom or a chain-like alkenyl group containing a fluorine atom is preferable. Among these, a fluorinated alkyl group is preferable, and more preferably the same fluorinated alkyl groups as those described above for $Rd^1$.

In formula (d1-3), $Rd^4$ represents a cyclic group with or without a substituent, a chain-like alkyl group with or without a substituent or a chain-like alkenyl group with or without a substituent, and is the same groups as those defined above for $R^{101}$ in the formula (b-1).

Among these, an alkyl group with or without a substituent, an alkoxy group with or without a substituent, an alkenyl group with or without a substituent or a cyclic group with or without a substituent is preferable.

The alkyl group for $Rd^4$ is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group. Part of the hydrogen atoms within the alkyl group for $Rd^4$ may be substituted with a hydroxy group, a cyano group or the like.

The alkoxy group for $Rd^4$ is preferably an alkoxy group of 1 to 5 carbon atoms, and specific examples thereof include a methoxy group, an ethoxy group, an n-propoxy group, an iso-propoxy group, an n-butoxy group and a tert-butoxy group. Among these, a methoxy group and an ethoxy group are desirable.

As the alkenyl group for $Rd^4$, the same groups as those described above for $R^{101}$ in the formula (b-1) can be mentioned, and a vinyl group, a propenyl group (an allyl group), a 1-methylpropenyl group and a 2-methylpropenyl group are preferable. These groups may have an alkyl group of 1 to 5 carbon atoms or a halogenated alkyl group of 1 to 5 carbon atoms as a substituent.

As the cyclic group for $Rd^4$, the same groups as those described above for $R^{101}$ in the formula (b-1) can be mentioned. Among these, as the cyclic group, an alicyclic group (e.g., a group in which one or more hydrogen atoms have been removed from a cycloalkane such as cyclopentane, cyclohexane, adamantane, norbornane, isobornane, tricyclodecane or tetracyclododecane) or an aromatic group (e.g., a phenyl group or a naphthyl group) is preferable. When $Rd^4$ is an alicyclic group, the resist composition can be satisfactorily dissolved in an organic solvent, thereby improving the lithography properties. Alternatively, when $Rd^4$ is an aromatic group, the resist composition exhibits an excellent photoadsorption efficiency in a lithography process using EUV or the like as the exposure source, thereby resulting in the improvement of the sensitivity and the lithography properties.

In formula (d1-3), $Yd^1$ represents a single bond or a divalent linking group.

The divalent linking group for $Yd^1$ is not particularly limited, and examples thereof include a divalent hydrocarbon group (aliphatic hydrocarbon group, or aromatic hydrocarbon group) with or without a substituent and a divalent linking group containing a hetero atom. As these groups, the same groups as those described above for the divalent hydrocarbon group with or without a substituent and the divalent linking group containing a hetero atom in the explanation of the divalent linking group for $Ya^{21}$ in the formula (a2-1) can be mentioned.

As $Yd^1$, a carbonyl group, an ester bond, an amide bond, an alkylene group or a combination of these groups is preferable. As the alkylene group, a linear or branched alkylene group is more preferable, and a methylene group or an ethylene group is still more preferable.
Specific examples of preferable anion moieties for the component (d1-3) are shown below.
[Chemical Formula 42]
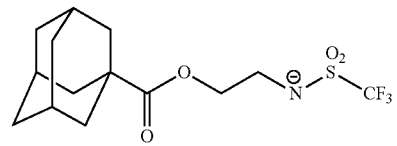
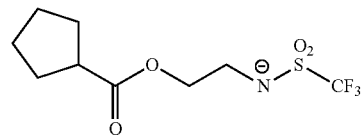
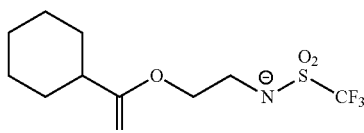
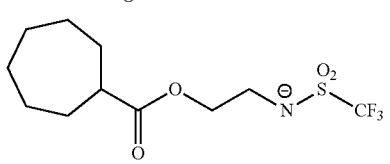
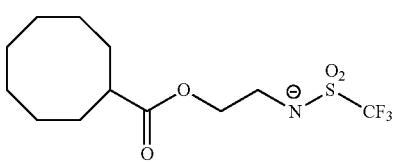
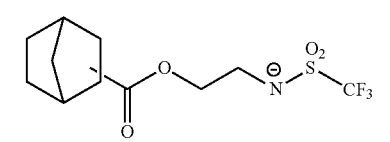
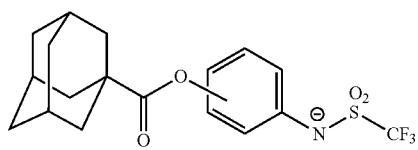
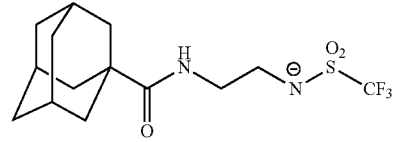
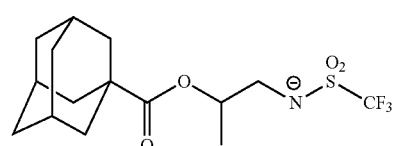
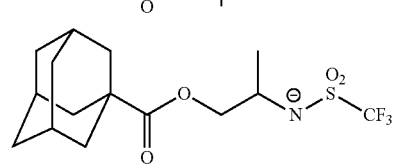
-continued
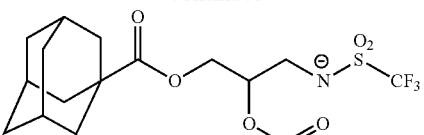
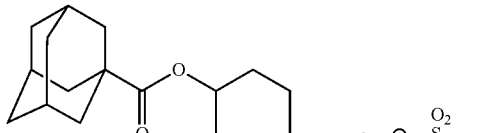
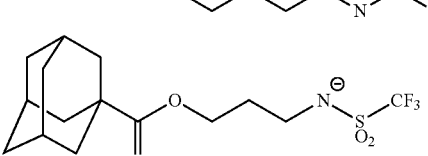
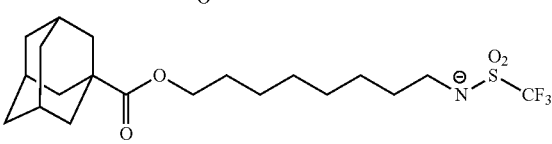
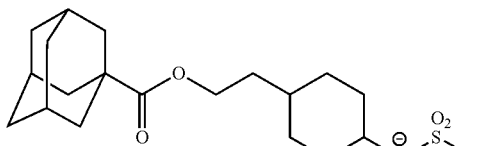
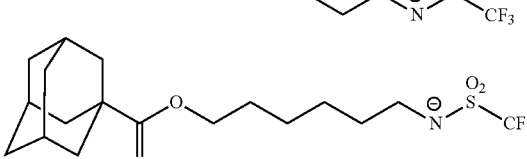
[Chemical Formula 43]
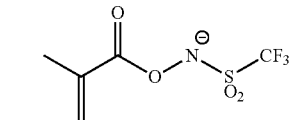
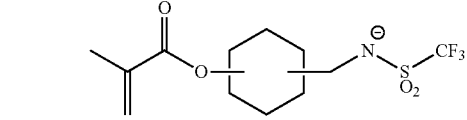
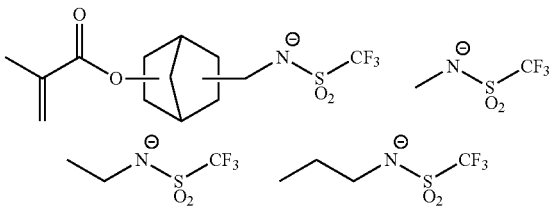

-continued

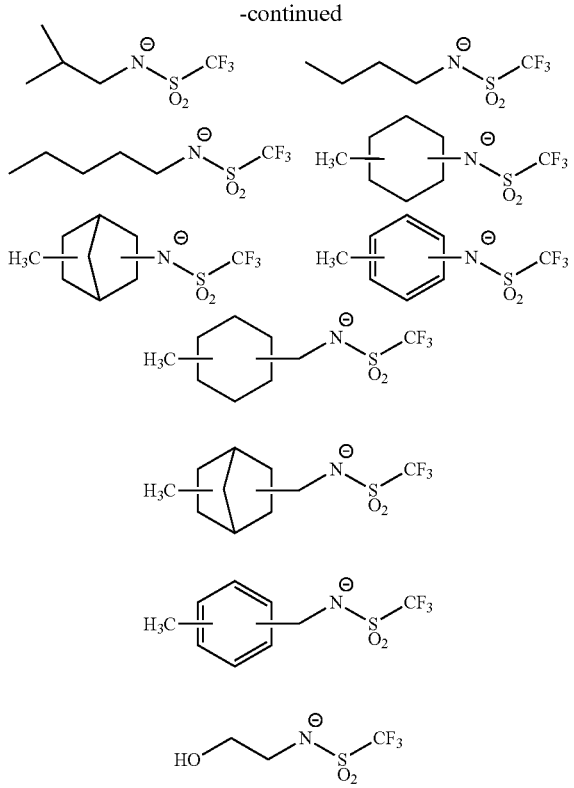

Cation Moiety

In formula (d1-3), $M^{m+}$ is an organic cation having a valency of m, and is the same as defined for $M^{m+}$ in the aforementioned formula (d1-1).

As the component (d1-3), one type of compound may be used, or two or more types of compounds may be used in combination.

As the component (D1), one type of the aforementioned components (d1-1) to (d1-3) can be used, or at least two types of the aforementioned components (d1-1) to (d1-3) can be used in combination.

When the resist composition contains the component (D1), the amount of the component (B) relative to 100 parts by weight of the component (A) is preferably within a range from 0.5 to 10 parts by weight, more preferably from 0.5 to 8 parts by weight, and still more preferably from 1 to 8 parts by weight.

When the amount of the component (D1) is at least as large as the lower limit of the above-mentioned range, excellent lithography properties and excellent resist pattern shape can be obtained. On the other hand, when the amount of the component (D1) is no more than the upper limit of the above-mentioned range, sensitivity can be maintained at a satisfactory level, and through-put becomes excellent.

Production Method of Component (D1):

The production methods of the components (d1-1) and (d1-2) are not particularly limited, and the components (d1-1) and (d1-2) can be produced by conventional methods.

The production methods of the component (d1-3) is not particularly limited, and for example, the component (d1-3) can be produced by a method described in US2012-0149916.

Component (D2)

As the acid diffusion control agent component, a nitrogen-containing organic compound (D2) (hereafter, referred to as "component (D2)") which does not fall under the definition of component (D1) may be used.

The component (D2) is not particularly limited, as long as it functions as an acid diffusion control agent, and does not fall under the definition of the component (D1). As the component (D2), any of the conventionally known compounds may be selected for use. Among these, an aliphatic amine is preferable, and a secondary aliphatic amine or tertiary aliphatic amine is particularly preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkylalcoholamines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxyl)ethyl}amine, tris{2-(2-methoxyethoxymethoxyl)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{ 2-(2-hydroxyethoxyl)ethoxy}ethyl]amine and triethanol amine tri acetate, and triethanolamine triacetate is preferable.

Further, as the component (D2), an aromatic amine may be used.

Examples of aromatic amines include 4-dimethylaminopyridine, pyrrole, indole, pyrazole, imidazole and derivatives thereof, as well as tribenzylamine, 2,6-diisopropyl aniline and N-tert-butoxycarbonylpyrrolidine.

As the component (D2), one type of compound may be used alone, or two or more types may be used in combination.

When the resist composition contains the component (D2), the amount of the component (D2) is used in an amount within a range from 0.01 to 5 parts by weight, relative to 100 parts by weight of the component (A). When the amount of the component (D2) is within the above-mentioned range, the shape of the resist pattern and the post exposure stability of the latent image formed by the pattern-wise exposure of the resist layer are improved.

Component (E): At Least One Compound Selected from the Group Consisting of Organic Carboxylic Acids, and Phosphorus Oxo Acids and Derivatives Thereof Furthermore, in the resist composition of the present embodiment, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of phosphorous oxo acid derivatives include esters in which a hydrogen atom within the above-mentioned phosphorous oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenyl phosphonate, diphenyl phosphonate and dibenzyl phosphonate.

Examples of phosphinic acid derivatives include phenylphosphinic acid and phosphinic acid esters.

As the component (E), one type may be used alone, or two or more types may be used in combination.

When the resist composition contains the component (E), the amount of the component (E) is used in an amount within a range from 0.01 to 5 parts by weight, relative to 100 parts by weight of the component (A).

Component (F): Fluorine Additive Component

In the present invention, the resist composition of the present embodiment may further include a fluorine additive component (hereafter, referred to as "component (F)") for imparting water repellency to the resist film.

As the component (F), for example, a fluorine-containing polymeric compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be used.

Specific examples of the component (F) include polymers having a structural unit (f1) represented by general formula (f1-1) shown below. As the polymer, a polymer (homopolymer) consisting of a structural unit (f1) represented by formula (f1-1) shown below; a copolymer of a structural unit (f1) and the aforementioned structural unit (a1); and a copolymer of a structural unit (f1), a structural unit derived from acrylic acid or methacrylic acid and the aforementioned structural unit (a1) are preferable. As the structural unit (a1) to be copolymerized with a structural unit (f1), a structural unit derived from 1-ethyl-1-cyclooctyl (meth)acrylate is preferable.

[Chemical Formula 44]

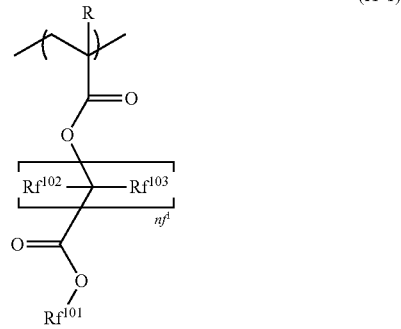

(f1-1)

In the formula, R is the same as defined above; $Rf^{102}$ and $Re^{103}$ each independently represents a hydrogen atom, a halogen atom, an alkyl group of 1 to 5 carbon atoms, or a halogenated alkyl group of 1 to 5 carbon atoms, provided that $Rf^{102}$ and $Rf^{103}$ may be the same or different; $nf^1$ represents an integer of 1 to 5; and $Rf^{101}$ represents an organic group containing a fluorine atom.

In formula (f1-1), R bonded to the carbon atom on the α-position is the same as defined above. As R, a hydrogen atom or a methyl group is preferable.

In formula (f1-1), examples of the halogen atom for $Rf^{102}$ and $Rf^{103}$ include a fluorine atom, a chlorine atom, a bromine atom and an iodine atom, and a fluorine atom is particularly desirable. Examples of the alkyl group of 1 to 5 carbon atoms for $Rf^{102}$ and $Rf^{103}$ include the same alkyl group of 1 to 5 carbon atoms as those described above for R, and a methyl group or an ethyl group is preferable. Specific examples of the halogenated alkyl group of 1 to 5 carbon atoms represented by $Rf^{102}$ and $Rf^{103}$ include groups in which part or all of the hydrogen atoms of the aforementioned alkyl groups of 1 to 5 carbon atoms have been substituted with halogen atoms.

Examples of the halogen atom include a fluorine atom, a chlorine atom, a bromine atom and an iodine atom, and a fluorine atom is particularly desirable. Among these, as $Rf^{102}$ and $R^{103}$, a hydrogen atom, a fluorine atom or an alkyl group of 1 to 5 carbon atoms is preferable, and a hydrogen atom, a fluorine atom, a methyl group or an ethyl group is more preferable.

In formula (f1-1), $nf^1$ represents an integer of 1 to 5, preferably an integer of 1 to 3, and more preferably 1 or 2.

In formula (f1-1), $Rf^{101}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $Rf^{101}$, a fluorinated hydrocarbon group of 1 to 5 carbon atoms is preferable, and a trifluoromethyl group, —CH$_2$—CF$_3$, —CH$_2$—CF$_2$—CF$_3$, —CH(CF$_3$)$_2$, —CH$_2$—CH$_2$—CF$_3$ and —CH$_2$—CH$_2$—CF$_2$—CF$_2$—CF$_2$—CF$_3$ are most preferable.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, the cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5.

As the component (F), one type may be used alone, or two or more types may be used in combination.

When the resist composition contains the component (F), the amount of the component (F) is used in an amount within a range from 0.5 to 10 parts by weight, relative to 100 parts by weight of the component (A).

If desired, other miscible additives can also be added to the resist composition of the present embodiment. Examples of such miscible additives include additive resins for improving the performance of the resist film, dissolution inhibitors, plasticizers, stabilizers, colorants, halation prevention agents, and dyes.

Component (S)

The resist composition according to the present embodiment can be prepared by dissolving the resist materials for the resist composition in an organic solvent component (hereafter, frequently referred to as "component (S)").

The component (S) may be any organic solvent which can dissolve the respective components to give a uniform solution, and any organic solvent can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

The component (S) can be used individually, or in combination as a mixed solvent.

Among these, PGMEA, PGME, γ-butyrolactone, EL and cyclohexanone are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL or cyclohexanone is mixed as the polar solvent, the PGMEA:EL weight ratio or PGMEA:cyclohexanone weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3. Furthermore, a mixed solvent of PGMEA, PGME and cyclohexanone is also preferable.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a resist solution to a substrate. For example, the solid content of the resist composition is appropriately adjusted depending on the film thickness to be formed. For example, the component (S) is used in an amount such that the solid content of the resist composition becomes within the range from 1 to 20% by weight, and preferably from 2 to 15% by weight.

<Pattern Reversing Composition>

The pattern reversing composition used in the method of forming a pattern according to the present invention includes an organic solvent which does not dissolve the first resist pattern (hereinafter referred to as "component (S')") and a base component (A") that forms a pattern reversing film (hereinafter referred to as "component (A")").

In addition, as a preferable pattern reversing composition, a composition capable of forming a pattern reversing film having a suitable dissolution rate in an alkali developing solution in the step (2) can be mentioned (in particular, the dissolution rate determined in accordance with the [Method of determining dissolution rate in alkaline developing solution] in alkali developing solution is 1.0 to 3.5 nm/s).

By including the component (S') in the pattern reversing composition, during applying the pattern reversing composition, the dissolution of the first resist pattern into an organic solvent contained in the pattern reversing composition can be suppressed, and the deterioration of the shape of the first resist pattern, the elimination of the first resist pattern and the mixing at the interface between the first resist pattern and the pattern reversing film can be suppressed.

<<Component (S')>>

The component (S') is an organic solvent that does not dissolve the first resist pattern.

With respect to the component (S'), the expression "does not dissolve the first resist pattern" means that, when a resist composition is applied to a substrate and dried at 23° C. to form a resist film having a film thickness of 0.2 μm, the resist film is not dissipated or the film thickness is not markedly changed by immersing the resist film in the organic solvent for 60 seconds (preferably, the film thickness of the resist film does not become 0.16 μm or less).

As the component (S'), a solvent which does not dissolve the first resist pattern but is capable of dissolving the components to be blended in the pattern reversing composition can be used. Among these, in terms of the coatability on the substrate and the solubility of the components to be blended in the pattern reversing composition, an alcohol organic solvent and an ester organic solvent are preferably used, and an ester organic solvent is more preferably used.

An "ester organic solvent" is an organic solvent containing C—C(=O)—O—C within the structure thereof. The term "alcohol organic solvent" refers to a compound in which at least one hydrogen atom within an aliphatic hydrocarbon has been substituted with a hydroxyl group, and is a liquid at normal temperature (room temperature) and normal pressure (atmospheric pressure). The structure of the main chain constituting the aforementioned aliphatic hydrocarbon may be a chain-like structure or a cyclic structure, or may include a cyclic structure within the chain-like structure, or may include an ether bond within the chain-like structure.

As the ester organic solvent, the same ester organic solvent as exemplified above in the expression of organic solvents contained in an organic developing solution can be mentioned. Among these, butyl acetate and ethyl-3-ethoxypropionate are preferably used.

As the alcohol organic solvent, a monohydric alcohol, a dihydric alcohol or a dihydric alcohol derivative is preferable.

Although it depends on the number of carbon atoms, as the monohydric alcohol, a primary or secondary alcohol is preferable, and a primary monohydric alcohol is particularly desirable.

The term "monohydric alcohol" refers to a compound in which a hydrocarbon compound composed of only carbon atom and hydrogen atom has one hydrogen atom substituted with a hydroxy group, and does not include polyhydric alcohol derivatives having two or more hydroxy groups. The hydrocarbon compound may have a chain-like structure or a ring structure.

The term "dihydric alcohol" refers to a compound in which the aforementioned hydrocarbon compound has two hydrogen atoms substituted with hydroxy groups, and does not include polyhydric alcohol derivatives having three or more hydroxy groups.

Examples of the dihydric alcohol derivative include compounds in which a dihydric alcohol has one hydroxy group substituted with a substituent (e.g., alkoxy group, alkoxyalkyloxy group or the like).

The boiling point of the alcohol organic solvent is preferably 80 to 250° C., and more preferably 90 to 220° C. In terms of coatability, stability of the composition during storage and the bake temperature, the boiling point is most preferably 100 to 200° C.

Specific examples of the alcohol organic solvent having a chain-like structure include propylene glycol (PG), 1-butoxy-2-propanol (PGB), n-hexanol, 2-heptanol, 3-heptanol, 1-heptanol, 5-methyl-1-hexanol, 6-methyl-2-heptanol, 1-octanol, 2-octanol, 3-octanol, 4-octanol, 2-ethyl-1-hexanol, 2-(2-butoxyethoxy)ethanol, n-pentylalcohol, s-pentylalcohol, t-pentylalcohol, isopentylalcohol, isobutanol (also referred to as isobutylalcohol or 2-methyl-1-propanol) (IBA), isopropylalcohol, 2-ethylbutanol, neopentylalcohol, n-butanol, s-butanol, t-butanol, 1-propanol, 2-methyl-1-butanol, 2-methyl-2-butanol and 4-methyl-2-pentanol (MIBC).

Further, specific examples of those having a ring structure include cyclopentane methanol, 1-cyclopentylethanol, cyclohexanol, cyclohexane methanol (CM), cyclohexane ethanol, 1,2,3,6-tetrahydrobenzyl alcohol, exo-norborneol, 2-methylcyclohexanol, cycloheptanol, 3,5-dimethylcyclohexanol, and benzyl alcohol.

Among alcohol organic solvents, a monohydric alcohol or a dihydric alcohol derivative having a chain-like structure is preferable, 1-butoxy-2-propanol (PGB), isobutanol (also referred to as isobutylalcohol or 2-methyl-1-propanol) (IBA), 4-methyl-2-pentanol (MIBC) and n-butanol are preferable, and isobutanol (2-methyl-1-propanol) and 1-butoxy-2-propanol (PGB) are most desirable.

As the component (S') used in the pattern reversing composition, one type of solvent may be used, or two or more types of solvents may be used.

The amount of the component (S') is not particularly limited, and is appropriately adjusted to a concentration which enables coating of a resist solution to a substrate. For example, the component (S') is used in an amount such that the amount of the base component (A") described later in the pattern reversing composition becomes within the range from 1 to 20% by weight, and preferably from 2 to 15% by weight.

Further, the pattern reversing composition may contain an organic solvent other than the component (S') (hereafter, referred to as "component (S")"), as long as the effects of using the component (S') are not impaired.

As the component (S"), a solvent capable of dissolving components contained in the pattern reversing composition is preferably used. Specifically, as the component (S"), the same as the component (S) described above in relation to the resist composition as a resist material to form the first resist pattern can be mentioned.

The amount of the component (S") based on the total amount of the organic solvent used in the pattern reversing composition is preferably 20% by weight or less, and 1 to 15% by weight is more preferable.

The total amount of the organic solvent used in the pattern reversing composition is not particularly limited, and in general, the amount to be a solution having a concentration which enables applying the pattern reversing composition onto the substrate is employed. For example, the component (S") is used in an amount such that the solid content of the pattern reversing composition becomes within the range of 1 to 30% by weight.

<<Component (A")>>

The component (A") is a base component which forms a pattern reversing film and is capable of forming a film.

As the component (A"), a base composition having the dissolution rate of 1.0 to 3.5 nm/s in alkali developing solution is preferably used, the dissolution rate is measured in the same method as the aforementioned [Method of determining dissolution rate in alkaline developing solution] except that the solution of the component (A") dissolved in solvent is used instead of a pattern reversing composition. As the solvent, the same examples as those described above for the component (S') can be mentioned.

Of these, the component (A") preferably includes the resin component (A"1) (hereinafter, sometimes referred to as "component (A"1)").

Component (A"1)

As the component (A"1), a resin that contains a structural unit having a polar group can be mentioned. By including a structural unit having a polar group, the solubility of the component (A"1) in the component (S') can be improved. Furthermore, the solubility in an alkali developing solution can be ensured.

Preferable examples of the component (A"1) include a resin component having a structural unit (a"1) which contains at least one polar group selected from the group constituting of a hydroxy group, a cyano group, a carboxy group, a base dissociable group, a group represented by general formula (f2-0-1) shown below, a group represented by general formula (f2-0-2) shown below and a group represented by general formula (f2-0-3) shown below.

[Chemical Formula 45]

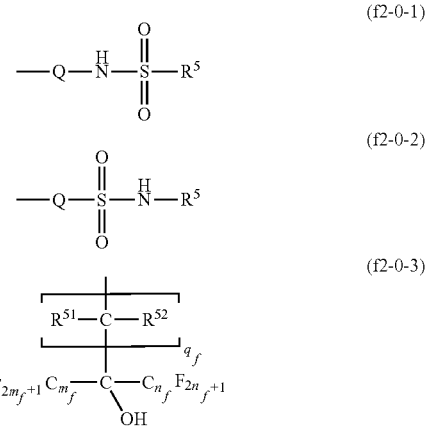

In the formulae (f2-0-1) and (f2-0-2), Q each independently represents a divalent linking group or a single bond; $R^5$ each independently represents a fluorinated alkyl group; in the formula (f2-0-3), $R^{51}$ and $R^{52}$ each independently represents a hydrogen atom, an alkyl group of 1 to 5 carbon atoms, a fluorine atom or a fluorinated alkyl group of 1 to 5 carbon atoms; $m_f$ and $n_f$ each independently represents an integer of 0 to 5, provided that $m_f+n_f\geq 1$; and $q_f$ represents an integer of 0 to 5.

Structural Unit (a"1):

The structural unit (a"1) is a structural unit that contains at least one polar group selected from the group constituting of a hydroxy group, a cyano group, a carboxy group, a base dissociable group, a group represented by the general formula (f2-0-1), a group represented by the general formula (f2-0-2) and a group represented by the general formula (f2-0-3).

[Base Dissociable Group]

In the present invention, the term "base dissociable group" refers to an organic group which can be dissociated from the structural unit by the action of a base. Examples of the base include alkali developing solutions generally used in the fields of lithography. That is, the "base dissociable group" refers to a group which is dissociated by the action of an alkali developing solution (for example, a 2.38% by weight aqueous solution of tetramethylammonium hydroxide (TMAH) at 23° C.).

A base dissociable group dissociates due to hydrolysis caused by the action of an alkali developing solution.

Therefore, a hydrophilic group is formed when the base dissociable group dissociates and the hydrophilicity of the component (A"1) is enhanced, and hence, the compatibility of the component (A"1) with the alkali developing solution is improved.

In the structural unit (a"1), the base dissociable group is not particularly limited as long as it is an organic group that satisfies the definition described above, and the base dissociable group may or may not contain a fluorine atom, although it preferably contains a fluorine atom. It is particularly desirable that the fluorine atom contained in the structural unit (a"1) is present only in the base dissociable group. If the base dissociable group contains a fluorine atom, since the fluorine atom contained in the base dissociable group is also dissociated from the structural unit (a"1) when the base dissociable group is dissociated by the action of an alkali developing solution, the affinity for the alkali developing solution is enhanced.

Specific examples of the base dissociable group include those represented by general formulas (II-1) to (II-5) shown below.

In the present invention, the base dissociable group is preferably at least one base dissociable group selected from those represented by general formulas (II-1) to (II-5) shown below. In consideration of the excellent characteristic of exhibiting hydrophobicity during exposure and hydrophilicity during development, and ease in synthesis, a group represented by general formula (II-1), (II-4) or (II-5) shown below is particularly desirable.

[Chemical Formula 46]

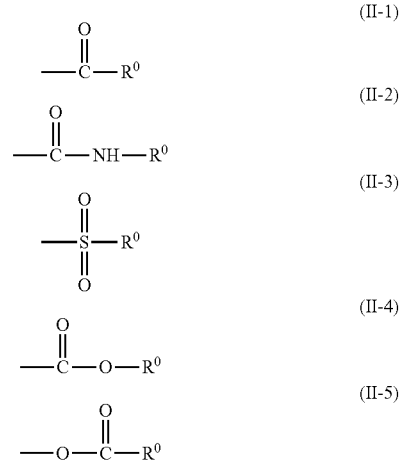

In the formulae, each $R^0$ independently represents an organic group with or without a fluorine atom.

In general formulas (II-1) to (II-5), each $R^0$ independently represents an organic group with or without a fluorine atom.

An "organic group" is a group containing at least one carbon atom.

The structure of $R^0$ may be linear, branched or cyclic, and is preferably linear or branched.

In $R^0$, the organic group preferably has 1 to 20 carbon atoms, more preferably 1 to 15 carbon atoms, still more preferably 1 to 10 carbon atoms, and most preferably 1 to 5 carbon atoms.

The fluorination ratio within $R^0$ is preferably 25% or more, more preferably 50% or more, and most preferably 60% or more, as the hydrophobicity of the resist film is enhanced.

The term "fluorination ratio" refers to the percentage (%) of the number of fluorine atoms based on the total number of hydrogen atoms and fluorine atoms contained within the organic group.

As a preferable example of $R^0$, a fluorinated hydrocarbon group which may or may not have a substituent such as a methyl group or an ethyl group can be given.

With respect to the fluorinated hydrocarbon group for $R^0$ with or without a substituent, the hydrocarbon group may be either an aliphatic hydrocarbon group or an aromatic hydrocarbon group, and an aliphatic hydrocarbon group is preferable.

An aliphatic hydrocarbon group refers to a hydrocarbon group having no aromaticity. The aliphatic hydrocarbon group may be either saturated or unsaturated, but in general, the aliphatic hydrocarbon group is preferably saturated.

As $R^0$, a fluorinated, saturated hydrocarbon group or a fluorinated, unsaturated hydrocarbon group is preferable, more preferably a fluorinated, saturated hydrocarbon group, and most preferably a fluorinated alkyl group.

Examples of fluorinated alkyl groups include groups in which part or all of the hydrogen atoms within the below described unsubstituted alkyl groups have been substituted with a fluorine atom. The fluorinated alkyl group may be either a group in which part of the hydrogen atoms within an unsubstituted alkyl group described below has been substituted with a fluorine atom, or a group in which all of the hydrogen atoms within an unsubstituted alkyl group described below has been substituted with a fluorine atom (i.e., a perfluoroalkyl group).

The unsubstituted alkyl group may be linear, branched or cyclic. Alternatively, the unsubstituted alkyl group may be a combination of a linear or branched alkyl group with a cyclic alkyl group.

The unsubstituted linear alkyl group preferably has 1 to 10 carbon atoms, and more preferably 1 to 8. Specific examples include a methyl group, an ethyl group, an n-propyl group, an n-butyl group, an n-pentyl group, an n-hexyl group, an n-heptyl group, an n-octyl group, an n-nonyl group and an n-decyl group.

The unsubstituted branched alkyl group preferably has 3 to 10 carbon atoms, and more preferably 3 to 8. As the branched alkyl group, a tertiary alkyl group is preferable.

As an example of an unsubstituted cyclic alkyl group, a group in which one hydrogen atom has been removed from a monocycloalkane or a polycycloalkane such as a bicycloalkane, tricycloalkane or tetracycloalkane can be given. Specific examples include monocycloalkyl groups such as a cyclopentyl group and a cyclohexyl group; and polycycloalkyl groups such as an adamantyl group, a norbornyl group, an isobornyl group, a tricyclodecyl group and a tetracyclododecyl group.

Examples of the combination of a linear or branched alkyl group with a cyclic alkyl group include groups in which a cyclic alkyl group as a substituent is bonded to a linear or branched alkyl group, and groups in which a linear or branched alkyl group as a substituent is bonded to a cyclic alkyl group.

Examples of substituents for the fluorinated hydrocarbon group include an alkyl group of 1 to 5 carbon atoms.

As the fluorinated alkyl group for $R^0$, a linear or branched fluorinated alkyl group is preferable. In particular, a group represented by general formula (III-1) or (III-2) shown below is desirable, and a group represented by general formula (III-1) is most preferable.

[Chemical Formula 47]

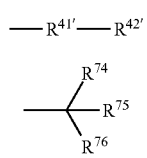

In general formula (III-1), $R^{41'}$ represents an unsubstituted alkylene group of 1 to 9 carbon atoms, and $R^{42'}$ represents a fluorinated alkyl group of 1 to 9 carbon atoms, provided that the total number of carbon atoms of $R^{41'}$ and $R^{42'}$ is no more than 10. In general formula (III-2), each of $R^{74}$ to $R^{76}$ independently represents a linear alkyl group of 1 to 5 carbon atoms, with the provision that at least one of $R^{74}$ to $R^{76}$ represents an alkyl group having a fluorine atom.

In general formula (III-1), the alkylene group for $R^{41'}$ may be linear, branched or cyclic, and is preferably linear or branched. Further, the number of carbon atoms within the alkylene group is preferably within a range of from 1 to 5.

As $R^{41'}$, a methylene group, an ethylene group or a propylene group is particularly desirable.

As $R^{42'}$, a linear or branched fluorinated alkyl group of 1 to 5 carbon atoms is preferable, and a perfluoroalkyl group is particularly desirable. Among perfluoroalkyl groups, a trifluoromethyl group ($—CF_3$), a tetrafluoroethyl group ($—C_2F_4H$) or $—C_2F_5$ is preferable.

In general formula (III-2), as the alkyl group for $R^{74}$ to $R^{76}$, an ethyl group or a methyl group is preferable, and a methyl group is particularly desirable. At least one of the alkyl groups for $R^{74}$ to $R^{76}$ is a fluorinated alkyl group, and all of the alkyl groups for $R^{74}$ to $R^{76}$ may be fluorinated alkyl groups.

[Group Represented by General Formula (f2-0-1)]

In the formula (f2-0-1), Q represents a divalent linking group or a single bond.

Examples of divalent linking groups include linear, branched or cyclic alkylene groups of 1 to 8 carbon atoms such as a methylene group, an ethylene group, a propylene group, an isopropylene group, a cyclopropylene group, an n-butylene group, an isobutylene group, a pentene group, an isopentene group, a neopentene group, a cyclopentylene group, a cyclohexylene group, a cycloheptylene group and a cyclooctylene group. The divalent group for Q may contain a hetero atom, and examples of such divalent linking groups include an ether group, an ester group and a group in which at least one hydrogen atom and/or carbon atom within the aforementioned alkylene group has been substituted with a hetero atom. Among these, in terms of ease in synthesis, a linear alkylene group is preferable, and a methylene group is particularly desirable.

$R^5$ represents a fluorinated alkyl group. The fluorinated alkyl group is a group in which part or all of the hydrogen atoms of a linear, branched or cyclic alkyl group have been substituted with fluorine atoms.

The linear or branched alkyl group is preferably an alkyl group of 1 to 10 carbon atoms, more preferably an alkyl group of 1 to 8 carbon atoms, and still more preferably an alkyl group of 1 to 5 carbon atoms. Examples of alkyl groups include a methyl group, an ethyl group, a propyl group, an isopropyl group, an n-butyl group, an isobutyl group, a pentyl group, an isopentyl group and a neopentyl group. Among these, a propyl group is particularly desirable.

The cyclic alkyl group preferably has 4 to 12 carbon atoms, more preferably 5 to 10 carbon atoms, and most preferably 6 to 10 carbon atoms.

The fluorination ratio within the fluorinated alkyl group is preferably from 10 to 100%, more preferably from 30 to 100%, still more preferably from 50 to 100%, and is most preferably 100%, meaning groups in which all the hydrogen atoms have been substituted with fluorine atoms are the most preferred. When the fluorination ratio is 10% or more, the hydrophilicity of the surface of the pattern reversing film is enhanced, and hence, the dissolution rate within the alkali developing solution can be controlled.

Among these examples, the fluorinated alkyl group for $R^5$ is preferably a linear or branched fluorinated alkyl group, more preferably a fluorinated alkyl group of 1 to 5 carbon atoms, and most preferably a perfluoroalkyl group in which all of the hydrogen atoms within the alkyl group have been substituted with fluorine atoms. Specific examples of such perfluoroalkyl groups include a trifluoromethyl group and a pentafluoroethyl group, and a trifluoromethyl group is particularly desirable.

[Group Represented by General Formula (f2-0-2)]

In the general formula (f2-0-2), Q and $R^5$ are the same as defined for Q and $R^5$ in the general formula (f2-0-1).

[Group Represented by General Formula (f2-0-3)]

In the general formula (f2-0-3), $R^{5'}$ and $R^{52}$ each independently represents a hydrogen atom, an alkyl group of 1 to 5 carbon atoms, a fluorine atom or a fluorinated alkyl group of 1 to 5 carbon atoms.

As the alkyl group of 1 to 5 carbon atoms for $R^{51}$ and $R^{52}$, a linear or branched alkyl group is preferable, and specific examples thereof include a methyl group, an ethyl group, a propyl group, an isopropyl group, an n-butyl group, an isobutyl group, a tert-butyl group, a pentyl group, an isopentyl group and a neopentyl group. Among these, a methyl group is particularly desirable.

As the fluorinated alkyl group for $R^{5'}$ and $R^{52}$, a group in which at least one hydrogen atom within the alkyl group exemplified for $R^{51}$ or $R^{52}$ has been substituted with a fluorine atom.

Among these, as $R^{51}$ and $R^{52}$, a hydrogen atom is preferable, and it is particularly preferable that both $R^{51}$ and $R^{52}$ are hydrogen atom.

$m_f$ and $n_f$ each independently represents an integer of 0 to 5, provided that $m_f+n_f \geq 1$, and is preferably an integer of 1 to 3. In terms of dissolution rate in an alkali developing solution, it is preferably preferable that both of $m_f$ and $n_f$ are 1.

$q_f$ is an integer of 0 to 5, more preferably an integer of 0 to 3, still more preferably 0 or 1, and most preferably 1.

As the structural unit having a group represented by the general formula (f2-0-3), a structural unit having a group represented by general formula (f2-0-3-1) shown below can be mentioned.

[Chemical Formula 48]

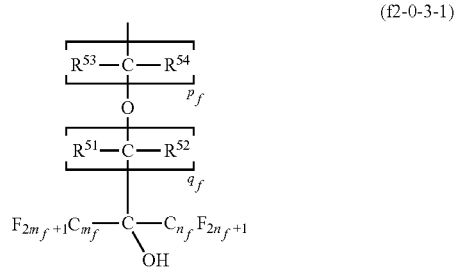

(f2-0-3-1)

In the formula, $R^{51}$, $R^{52}$, $m_f$, $n_f$ and $q_f$ are the same as defined above; $R^{53}$ and $R^{54}$ each independently represents an hydrogen atom, an alkyl group of 1 to 5 carbon atoms, a fluorine atom or a fluorinated alkyl group of 1 to 5 carbon atoms; and $p_f$ represents an integer of 1 to 5.

In the formula (f2-0-3-1), $R^{53}$ and $R^{54}$ are the same as defined for $R^{51}$ and $R^{52}$.

Among these, a hydrogen atom is preferable, and it is most preferable that both of $R^{53}$ and $R^{54}$ are hydrogen atom.

$p_f$ represents an integer of 1 to 5, more preferably 1 to 3, still more preferably 1 or 2, and particularly preferably 2.

Among these, as the polar group in the structural unit (a"1), at least one group selected from the group consisting of a hydroxy group and a group represented by the general formula (f2-0-3) is particularly preferable.

Examples of the structural unit (a"1) include a structural unit derived from hydroxystyrene, a structural unit in which the main chain has a cyclic structure (hereinafter, referred to as "cyclic-main chain structural unit") or a structural unit which is derived from acrylate ester and may have a hydrogen atom bonded to the carbon atom on the α-position substituted with a substituent. It is particularly preferable that the structural unit (a"1) is a structural unit derived from hydroxystyrene or a structural unit which is derived from acrylate ester and may have a hydrogen atom bonded to the carbon atom on the α-position substituted with a substituent.

In the present invention, a "cyclic-main chain structural unit" refers to a structural unit having a monocyclic or polycyclic ring structure, and at least one carbon atom within the ring structure, preferably two or more carbon atoms within the ring structure constitutes the main chain. By including a cyclic-main chain structural unit, the pattern reversing film having a high hydrophobicity at the surface thereof is obtained, and the etching resistance is improved. The reason is presumed that the density of carbon atom is enhanced since the main chain has a cyclic structure.

Examples of the cyclic-main chain structural unit include a structural unit derived from polycycloorefin, and a structural unit derived from bicyclo[2.2.1]-2-heptene(norbornene), a structural unit derived from tetracyclo[4.4.0.1$^{2,5}$.1$^{7,10}$]-3-dodecene or a structural unit having a substituent on the ring skeleton thereof may be employed.

Specific examples of the cyclic-main chain structural unit include a structural unit having at least one group selected from the group consisting of a group represented by the general formula (f2-0-1), a group represented by the general formula (f2-0-2) or a group represented by the general formula (f2-0-3) at a specific position on the ring structure of the structural unit exemplified above.

Preferable examples of the structural unit (a"1) include a structural unit represented by general formula (a"11-1) shown below (hereinafter, referred to as "structural unit (a"11-1)").

Structural Unit (a"11):

As the structural unit (a"1), a structural unit represented by general formula (a"11-1) shown below (hereinafter, referred to as "structural unit (a"11)" is preferable because the solubility in the component (S') becomes excellent, the solubility in an alkali developing solution is increased, and the etching resistance becomes excellent.

[Chemical Formula 49]

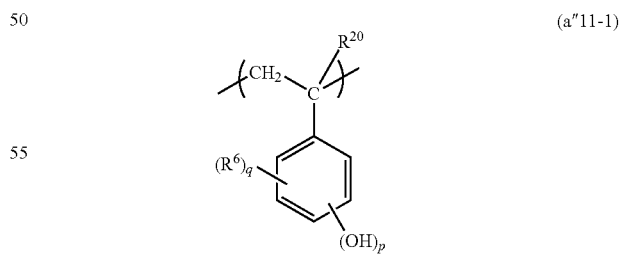

(a"11-1)

In the formula, $R^{20}$ represents a hydrogen atom or an alkyl group of 1 to 5 carbon atoms; $R^6$ represents an alkyl group of 1 to 5 carbon atoms; p represents an integer of 1 to 3; and q represents an integer of 0 to 2.

In the formula (a"11-1), specific examples of the alkyl group of 1 to 5 carbon atoms for $R^{20}$ include linear or branched alkyl groups such as a methyl group, an ethyl group, a propyl group, an isopropyl group, an n-butyl group, an isobutyl group, a tert-butyl group, a pentyl group, an isopentyl group and a neopentyl group.

As $R^{20}$, a hydrogen atom or a methyl group is preferable.

p represents an integer of 1 to 3, and is preferably 1.

The bonding position of the hydroxy group may be any of the o-position, m-position and p-position of the phenyl group. When p is 1, the p-position is preferable in terms of availability and low cost. When p is 2 or 3, a desired combination of the bonding positions can be employed.

q represents an integer of 0 to 2. q is preferably 0 or 1, and most preferably 0 from industrial viewpoint.

As the alkyl group for $R^6$, the same alkyl groups as those for $R^{20}$ can be mentioned.

When q is 1, the bonding position of $R^6$ may be any of the o-position, the m-position and the p-position. When q is 2, a desired combination of the bonding positions can be used. Here, the plurality of the $R^6$ group may be the same or different from each other.

As the structural unit (a'11), one type of structural unit may be used alone, or two or more types of structural units may be used in combination.

In the component (A"1), the amount of the structural unit (a"11) based on the combined total of all structural units constituting the component (A"1) is preferably 40 to 75 mol %, more preferably 50 to 70 mol %, and still more preferably 55 to 65 mol %.

In the case where the amount of the structural unit (a"11) is at least as large as the lower limit of the above-mentioned range, when the component (A"1) is used in a pattern reversing composition, a predetermined alkali solubility can be reliably achieved. On the other hand, when the amount of the structural unit (a"11) is no more than the upper limit of the above-mentioned range, a good balance can be achieved with the other structural units.

As the structural unit (a"1), one type of structural unit may be used alone, or two or more types of structural units may be used in combination.

In the component (A"1), the amount of the structural unit (a"1) based on the combined total of all structural units constituting the component (A"1) is preferably 40 to 75 mol %, more preferably 50 to 70 mol %, and still more preferably 55 to 65 mol %.

Structural Unit (a"2):

The component (A"1) may include a structural unit other than the structural unit (a"1) (hereafter, referred to as "structural unit (a"2)"), as long as the effects of the present invention are not impaired.

As the structural unit (a"2), any other structural unit which cannot be classified as one of the above structural units (a"1) can be used without any particular limitation, and any of the multitude of conventional structural units used within resist resins for ArF excimer lasers or KrF excimer lasers (and particularly for ArF excimer lasers) can be used.

Examples of the structural unit (a"2) include the structural unit derived from styrene, the structural unit (a1), the structural unit (a4), a structural unit derived from polycycloolefin having no substrate, and a structural unit derived from a polycycloolefin having a polycyclic alicyclic group as a substituent.

Examples of the structural unit derived from a polycycloorefin having no substituent include bicyclo[2.2.1]-2-heptene(norbornene), tetracyclo[4.4.0.12.5.1.7.10]-3-dodecene and the like.

Examples of the structural unit derived from a polycycloolefin having a polycyclic alicyclic group as a substituent include a structural unit having a polycyclic group such as a tricyclodecanyl group an adamantly group and a tetracyclododecanyl group as a substituent bonding on the ring structure of the structural unit derived from the polycycloolefin having no substituent.

In terms of controlling solubility in an alkali developing solution, as the structural unit (a"2), a structural unit derived from styrene or the structural unit (a1) is preferably used.

The component (A"1) preferably includes a structural unit derived from styrene or styrene derivatives (hereinafter, sometimes referred to as "structural unit (a"21)") as a structural unit (a"2), in addition to the structural unit (a"1).

By including the structural unit (a21") as the structural unit (a2"), the solubility in an alkali developing solution can be easily controlled. Further, when the component (A"1) is used in a pattern reversing film, the heat resistance and the dry etching resistance are improved.

Specific examples of the structural unit (a"21) include the structural units represented by general formula (a"21-1) shown below.

[Chemical Formula 50]

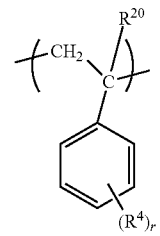

(a"21 -1)

In the formula, $R^{20}$ is the same as defined above; $R^4$ represents an alkyl group of 1 to 5 carbon atoms; and r represents an integer of 1 to 3.

In general formula (a"21-1), $R^{20}$ is the same as defined above for $R^{20}$ in the aforementioned general formula (a"11-1).

In the formula (a"21-1), as the alkyl group for $R^4$, the same alkyl groups as those for $R^6$ in the aforementioned formula (a"11-1) can be mentioned.

r represents an integer of 0 to 3, preferably 0 or 1, and most preferably 0 in terms of industry.

When r represents 1, the substitution position of $R^4$ may be any of o-position, m-position or p-position of the phenyl group. When r is 2 or 3, a desired combination of the bonding positions can be used.

Here, the plurality of the $R^4$ group may be the same or different from each other.

As the structural unit (a"21), one type of structural unit may be used alone, or two or more types of structural units may be used in combination.

In the component (A"1), the amount of the structural unit (a"21) based on the combined total of all structural units constituting the component (A"1) is preferably 10 to 25 mol %, more preferably 10 to 20 mol %, and still more preferably 10 to 15 mol %.

In the case where the amount of the structural unit (a"21) is no more than the upper limit of the above-mentioned range, when the component (A"1) is used in a pattern reversing composition, a predetermined alkali solubility can be reliably achieved. On the other hand, when the amount of the structural unit (a"21) is at least as large as the lower limit of the above-mentioned range, a good balance can be achieved with the other structural units.

Further, the component (A"1) preferably includes the structural unit (a1), in addition to the structural unit (a"1), or in addition to the structural unit (a"1) and the structural unit (a"21).

By including the structural unit (a1) as the structural unit (a2"), the solubility in an alkali developing solution can be easily controlled. Furthermore, the resolution is enhanced, and a reversed pattern having an excellent shape can be reliably obtained.

Examples of the structural unit (a1) in the component (A"1) include a structural unit derived from an acrylate ester which may have the hydrogen atom bonded to the carbon atom on the α-position substituted with a substituent and contains an acid decomposable group which exhibits increased polarity by the action of acid (hereinafter, sometimes referred to as "structural unit (a"22-1)"); and a structural unit derived from hydroxystyrene or a hydroxystyrene derivative in which at least a part of the hydrogen atom of the hydroxy group is protected with a substituent containing an acid decomposable group (hereinafter, sometimes referred to as "structural unit (a"22-2)").

When the structural unit (a1) in the component (A"1) is the structural unit (a"22-1), the structural unit represented by the general formula (a1-r-2) containing an acid dissociable group is preferably used, and the structural unit represented by the general formula (a1-r2-2) is more preferably used.

When the structural unit (a1) in the component (A"1) is the structural unit (a"22-2), the structural unit represented by the general formula (a1-r-1) containing an acid dissociable group (acetal-type acid dissociable group) is preferably used.

In the component (A"1), as the structural unit (a1), one type of structural unit may be used, or two or more types may be used in combination.

In the component (A"1), the amount of the structural unit (a1) based on the combined total of all structural units constituting the component (A"1) is preferably 20 to 50 mol %, more preferably 20 to 45 mol %, and still more preferably 20 to 40 mol %.

In the case where the amount of the structural unit (a1) is at least as large as the lower limit of the above-mentioned range, when the component (A"1) is used in a pattern reversing composition, a predetermined alkali solubility can be reliably achieved. Furthermore, the resolution is enhanced, and a reversed pattern having an excellent shape can be reliably obtained. On the other hand, when the amount is no more than the upper limit of the above-mentioned range, a good balance can be achieved with the other structural units.

In the component (A"1), the amount of the structural unit (a"22-1) based on the combined total of all structural units constituting the component (A"1) is preferably 20 to 40 mol %, more preferably 20 to 35 mol %, and still more preferably 20 to 30 mol %.

In the component (A"1), the amount of the structural unit (a"22-2) based on the combined total of all structural units constituting the component (A"1) is preferably 30 to 50 mol %, more preferably 30 to 45 mol %, and still more preferably 30 to 40 mol %.

As the structural unit (a"2), one type of structural unit may be used alone, or two or more types of structural units may be used in combination.

In the component (A"1), the amount of the structural unit (a"2) based on the combined total of all structural units constituting the component (A"1) is preferably 25 to 60 mol %, more preferably 30 to 50 mol %, and still more preferably 35 to 45 mol %.

As the component (A"1), a resin component (hereinafter, referred to as "component (A"1-1)") which contains the structural unit (a"1) is preferable.

Preferable examples of the component (A"1-1) includes a copolymer containing the structural unit (a"1) and the structural unit (a"2).

Examples of the copolymer containing the structural unit (a"1) and the structural unit (a"2) include a copolymer containing the structural unit (a"11) and the structural unit (a"21) and a copolymer containing the structural unit (a"11) and the structural unit (a1). Among these, a copolymer containing the structural unit (a"11), the structural unit (a"21-1) and the structural unit (a"22-1), and a copolymer containing the structural unit (a"11) and the structural unit (a"22-2) are particularly preferable.

When the component (A"1) is a copolymer containing a structural unit (a"1) and a structural unit (a"2), the molar ratio of each of the structural units, represented by [number of moles of structural unit (a"1)]: [number of moles of structural unit (a"2)] is preferably 40:60 to 75:25, and more preferably 50:50 to 70:3.

When the component (A"1) is a copolymer containing a structural unit (a1) and a structural unit (a"21) as structural units (a"2), the molar ratio of each of the structural units, represented by [number of moles of structural unit (a1)]: [number of moles of structural unit (a"21)] is preferably 70:30 to 90:10, and more preferably 75:25 to 85:15.

As the component (A1"), one type may be used alone, or two or more may be used in combination.

As the component (A"1), a copolymer that includes a combination of structural units such as that shown below is particularly desirable.

[Chemical Formula 51]

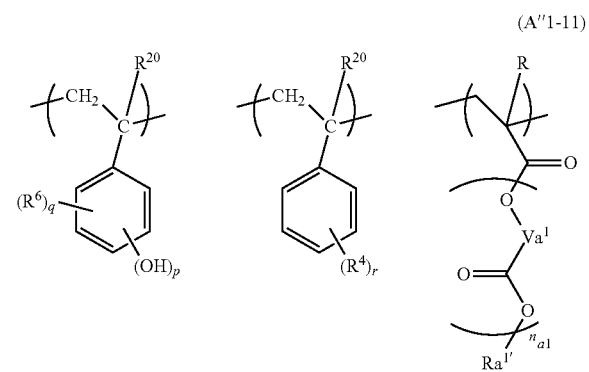

(A"1-11)

In the formula (A"1-11), $R^{20}$, $R^6$, p and q are the same as defined above for $R^{20}$, $R^6$, p and q in the formula (a"11-1), respectively. $R^4$ and r are the same as defined above for $R^4$ and r in the formula (a"21-1). wherein the plurality of $R^{20}$ may be the same or different from each other;

R, $Va^1$ and $n_{a1}$ are the same as defined above for R, $Va^1$ and $n_{a1}$ in the formula (a1-1), respectively. $Ra^{1'}$ is an acid dissociable group represented by the formula (a1-r-2).

[Chemical Formula 52]

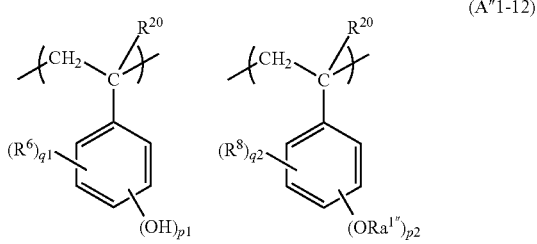

(A"1-12)

In the formula (A"1-12), $R^{20}$, $R^6$, p1 and q1 are the same as defined above for $R^{20}$, $R^6$, p and q in the formula (a"11-1), respectively.

$Ra^{1''}$ is an acid dissociable group represented by the formula (a1-r-1).

$R^8$, p2 and q2 are the same as defined for $R^6$, p and q, respectively.

The plurality of $R^{20}$ may be the same or different from each other.

The weight average molecular weight (Mw) (the polystyrene equivalent value determined by gel permeation chromatography) of the component (A"1) is not particularly limited, but is preferably 1,000 to 50,000, more preferably 1,500 to 30,000, and most preferably 2,000 to 20,000. When the weight average molecular weight is no more than the upper limit of the above-mentioned range, the resin component exhibits a sufficient solubility in an organic solvent so that the resin component can use in the pattern reversing film. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (A"1) is not particularly limited, but is preferably 1.0 to 5.0, more preferably 1.0 to 3.0, and most preferably 1.0 to 2.5.

The component (A"1) can be obtained, for example, by a conventional radical polymerization or the like of the monomers corresponding with each of the structural units, using a radical polymerization initiator such as azobisisobutyronitrile (AIBN).

Further, when the polymer (A"1) has a cyclic-main chain structural unit, the polymer (A"1) can be synthesized, for example, by a method described in Japanese Unexamined Patent Application, First Publication No. 2006-291177.

Further, the component (A") may contain a base component (resin or low-molecular compound) other than the compound (A"1).

In the pattern reversing composition used in the present invention, as the component (A"), one type may be used, or two or more types of compounds may be used in combination.

In the pattern reversing composition, the amount of the component (A") can be appropriately adjusted depending on the thickness of the pattern reversing film to be formed, and the like.

<<Other Components>>

If desired, other miscible additives can also be added to the pattern reversing composition according to the present invention, in addition to the component (S") and the component (A"). Examples of such miscible additives include additive resins for improving the performance of the resist film, surfactants for improving the applicability, dissolution inhibitors, plasticizers, stabilizers, colorants, halation prevention agents, and dyes.

By using a dissolution inhibitor in combination with the base component (A"), the dissolution rate of pattern reversing film in an alkali developing solution can be controlled.

Dissolution Inhibitor

As examples of the dissolution inhibitor, the same onium salt acid generator as exemplified above in the explanation of the component (B) to be blended into the resist composition can be mentioned. Among these, in terms of the effect of the dissolution suppression in an alkali developing solution, and the controllability of the dissolution rate in the predetermined range, the compound represented by the general formula (b-1) is preferably used.

As the dissolution inhibitor, one type may be used alone, or two or more types may be used in combination.

In the pattern reversing composition, the amount of the dissolution inhibitor relative to 100 parts by weight of the component (A") is preferably 25 parts by weight or less, more preferably 0.1 to 20 parts by weight, and most preferably from 0.5 to 18 parts by weight. When the amount of the dissolution inhibitor is within the above-mentioned range, the dissolution rate of the pattern reversing film in an alkali developing solution can be easily controlled. Further, by virtue of the above-mentioned range, a uniform solution can be obtained and the storage stability becomes satisfactory.

EXAMPLES

As follows is a description of examples of the present invention, although the scope of the present invention is by no way limited by these examples.

<Preparation of Resist Composition for Forming First Resist Film>

The components shown in Table 1 were mixed together and dissolved to obtain a chemically amplified resist composition.

TABLE 1

| | Component (A) | Component (B) | Component (D) | Additive | Component (S) |
|---|---|---|---|---|---|
| Resist composition (1-1) | (A)-1 [100] | (B)-1 [6.0] | (D)-1 [3.0] | (E)-1 [0.50] (F)-1 [1.50] | (S)-1 [100] (S)-2 [3370] |

In Table 1, the reference characters indicate the following. Further, the values in brackets [ ] indicate the amount (in terms of parts by weight) of the component added.

(A)-1: a polymeric compound represented by chemical formula (A)-1 shown below. The weight average weight (Mw) and the dispersity (Mw/Mn) in terms of the polystyrene equivalent value measured by gel permeation chromatography (GPC) were 12,000 and 1.94, respectively. Further, as a result of an analysis by $^{13}$C-NMR, it was found that the copolymer compositional ratio (ratio (molar ratio) of the respective structural units within the structural formula) was l/m/n=30/60/10.

(B)-1: an acid generator consisting of a compound represented by chemical formula (B)-1 shown below (D)-1: an acid diffusion control agent consisting of a compound represented by chemical formula (D)-1 shown below (E)-1: salicylic acid (F)-1: a fluorine-containing polymeric compound represented by formula (F)-1 shown below; The weight average molecular weight (Mw) and the dispersity (Mw/Mn) in terms of the polystyrene equivalent value measured by gel permeation chromatography (GPC) were 23,100 and 1.78, respectively. Further, as a result of an analysis by $^{13}$C-NMR, it was found that the copolymer compositional ratio (ratio (molar ratio) of the respective structural units within the structural formula) was l/m=77/23.

(S)-1: γ-butyrolactone (S)-2: a mixed solvent of propylene glycol monomethyl ether acetate/propylene glycol monomethyl ether/cyclohexanone=45/30/25 (weight ratio)

[Chemical Formula 53]

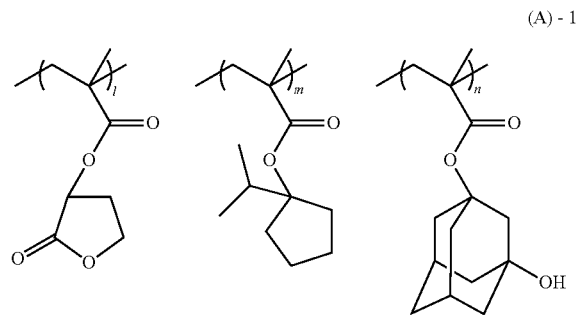

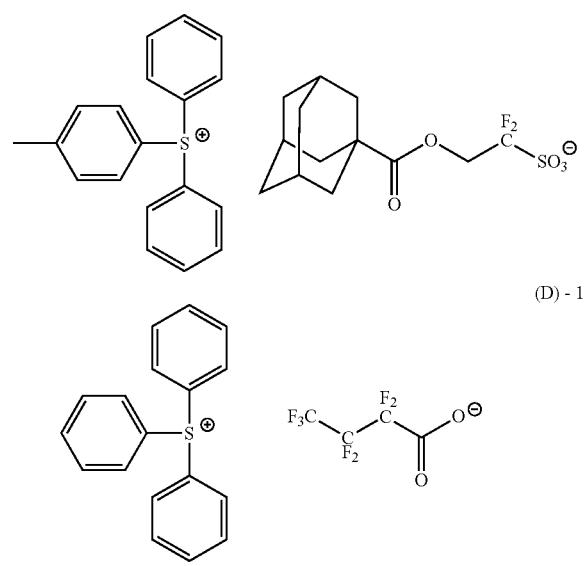

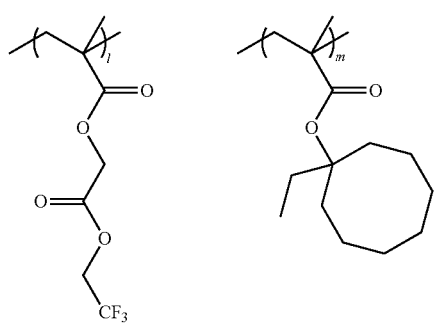

<Preparation of Pattern Reversing Composition>

To each of the following organic solvents (S-1 to S-4), each of resin components (P-1 to P-12) was added and dissolved, thereby obtaining each of the pattern reversing compositions.

Organic Solvent

S-1: butyl acetate (BuAc)

S-2: dibutyl ether (DBE)

S-3: ethyl-3-ethoxypropionate (EEP)

S-4: 4-methyl-2-pentanol (MIBC)

Resin Component

The Mw of the following resin components was determined by the polystyrene equivalent value as measured by gel permeation chromatography (GPC). The copolymer compositional ratio (the molar ratio of the respective structural units constituting the copolymer) was determined by carbon 13 nuclear magnetic resonance spectroscopy (600 MHz $^{13}$C-NMR).

P-1: a novolac resin (GTR-B6) having a weight average molecular weight (Mw) of 4,700, which was obtained by adding oxalic acid and formaldehyde to a mixture of m-cresol (molar ratio: 80 mol %), 3,4-dimethylphenol (molar ratio: 20 mol %), so as to conduct a condensation reaction.

P-2: a novolac resin (GTR-A5) having a weight average molecular weight (Mw) of 3,900, which was obtained by adding oxalic acid and formaldehyde to a mixture of m-cresol (molar ratio: 40 mol %), p-cresol (molar ratio: 20 mol %) and 2,5-dimethylphenol (molar ratio: 40 mol %), so as to conduct a condensation reaction.

P-3: a copolymer (FaHOa) represented by chemical formula (P-3) shown below; the weight average molecular weight (Mw)=7,000; the copolymer compositional ratio (molar ratio): l/m/n=50/20/30

P-4: a copolymer (A07) represented by chemical formula (P-4) shown below; the weight average molecular weight (Mw)=14,500; the copolymer compositional ratio (molar ratio): l/m=60.5/39.5

P-5: a copolymer (E25) represented by chemical formula (P-5) shown below; the weight average molecular weight (Mw)=10,000; the copolymer compositional ratio (molar ratio): l/m=74/26

[Chemical Formula 54]

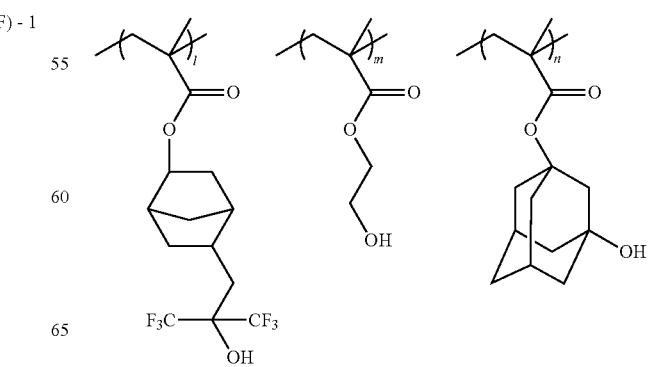

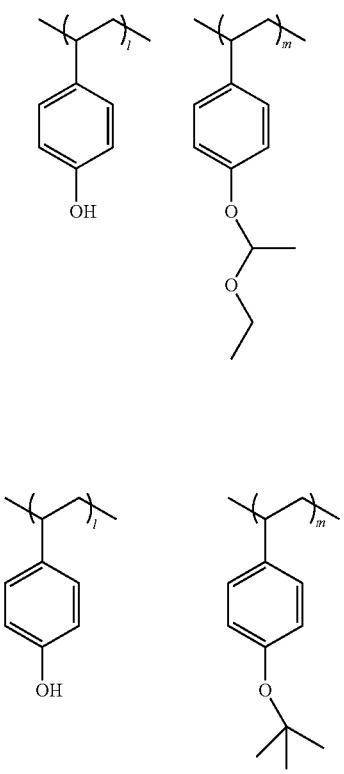

(P-4)

(P-5)

P-6: a copolymer (TT-05H) represented by a common chemical formula shown below; the weight average molecular weight (Mw)=10,000; the copolymer compositional ratio (molar ratio): l/m/n=60/35/5

P-7: a copolymer (TT-15H) represented by the common chemical formula shown below; the weight average molecular weight (Mw)=10,000; the copolymer compositional ratio (molar ratio): l/m/n=60/25/15

P-8: a copolymer (TT-15C) represented by the common chemical formula shown below; the weight average molecular weight (Mw)=10,000; the copolymer compositional ratio (molar ratio): l/m/n=65/20/15

P-9: a copolymer (TT-15L) represented by the common chemical formula shown below; the weight average molecular weight (Mw)=10,000; the copolymer compositional ratio (molar ratio): l/m/n=70/15/15

P-10: a copolymer (TT-25H) represented by the common chemical formula shown below; the weight average molecular weight (Mw)=10,000; the copolymer compositional ratio (molar ratio): l/m/n=60/15/25

P-11: a copolymer (TT-25C) represented by the common chemical formula shown below; the weight average molecular weight (Mw)=10,000; the copolymer compositional ratio (molar ratio): l/m/n=62/13/25

P-12: a copolymer (TT-25L) represented by the common chemical formula shown below; the weight average molecular weight (Mw)=10,000; the copolymer compositional ratio (molar ratio): l/m/n=70/5/25

[Chemical Formula 55]

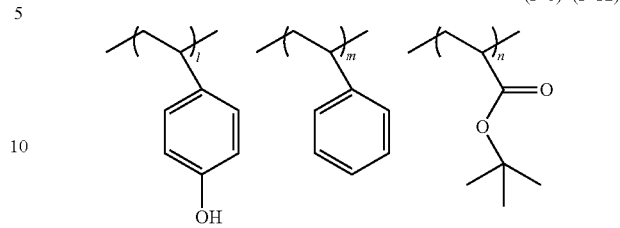

(P-6)~(P-12)

The obtained pattern reversing composition having a resin concentration of 3% by weight, and the dissolution rate (nm/second) in an alkali developing solution of the pattern reversing film formed using the pattern reversing composition are shown in Tables 2 to 4.

When the resin components P-1 to P-5 were mixed with dibutyl ether (DBE; organic solvent S-2) as an organic solvent, these resin components could not be dissolved in the organic solvent S-2, and hence, a pattern reversing composition could not be prepared. Therefore, in the case of mixing the organic solvent S-2 with any one of resin components P-6 to P-12, preparation of a pattern reversing composition was not conducted.

[Determination of Dissolution Rate of Pattern Reversing Film in Alkaline Developing Solution]

The aforementioned pattern reversing composition was applied to an 8-inch silicon wafer by spin-coating (1,500 rpm), and was then baked on a hotplate at 90° C. for 60 seconds and dried, thus forming a pattern reversing film having a film thickness of 100 nm.

Thereafter, alkali developing of the pattern reversing film was conducted for 30 seconds at 23° C. with a 2.38% by weight aqueous solution of tetramethylammonium hydroxide (TMAH) (product name: NMD-3; manufactured by Tokyo Ohka Kogyo Co., Ltd.) using an LD nozzle.

The thickness of each of the films before and after alkali development was measured using Nanospec (manufactured by Nanometrics Inc.), and the dissolution rate (i.e., reduced film thickness per unit time, unit: nm/s) of each of the pattern reversing films in an alkali developing solution was calculated. The results are shown in Tables 2 to 4.

TABLE 2

| Pattern reversing composition | Resin component | Organic solvent | Dissolution ratio of pattern reversing film in alkali developing solution (nm/s) |
|---|---|---|---|
| (2-1) | P-1 | S-1 | 7.42 |
| (2-2) | P-2 | | 6.07 |
| (2-3) | P-3 | | 7.49 |
| (2-4) | P-4 | | 1.44 |
| (2-5) | P-5 | | 5.35 |
| (2-6) | P-6 | | 0.28 |
| (2-7) | P-7 | | 0.63 |
| (2-8) | P-8 | | 4.56 |
| (2-9) | P-9 | | 8.99 |
| (2-10) | P-10 | | 1.38 |
| (2-11) | P-11 | | 2.26 |
| (2-12) | P-12 | | 9.09 |

TABLE 3

| Pattern reversing composition | Resin component | Organic solvent | Dissolution ratio of pattern reversing film of alkali developing solution (nm/s) |
|---|---|---|---|
| (2-13) | P-1 | S-3 | 3.89 |
| (2-14) | P-2 | | 3.62 |
| (2-15) | P-3 | | 3.73 |
| (2-16) | P-4 | | 1.19 |
| (2-17) | P-5 | | 4.73 |
| (2-18) | P-6 | | 0.23 |
| (2-19) | P-7 | | 0.52 |
| (2-20) | P-8 | | 3.76 |
| (2-21) | P-9 | | 7.42 |
| (2-22) | P-10 | | 1.14 |
| (2-23) | P-11 | | 1.86 |
| (2-24) | P-12 | | 7.49 |

TABLE 4

| Pattern reversing composition | Resin component | Organic solvent | Dissolution ratio of pattern reversing film in alkali developing solution (nm/s) |
|---|---|---|---|
| (2-25) | P-1 | S-4 | Pattern reversing composition could not be prepared (resin component could not be dissolved in organic solvent). |
| (2-26) | P-2 | | 5.66 |
| (2-27) | P-3 | | Pattern reversing compositon could not be prepared (resin component could not be dissolved in organic solvent). |
| (2-28) | P-4 | | 1.67 |
| (2-29) | P-5 | | 7.28 |
| (2-30) | P-6 | | 0.32 |
| (2-31) | P-7 | | 0.72 |
| (2-32) | P-8 | | 5.29 |
| (2-33) | P-9 | | 10.43 |
| (2-34) | P-10 | | 1.60 |
| (2-35) | P-11 | | 2.62 |
| (2-36) | P-12 | | 10.53 |

<Formation of Reversed Pattern (1)>

Using the resist composition (1-1) as a resist composition, and each of pattern reversing compositions (2-1) to (2-36) as a pattern reversing composition, formation of a reversed pattern of the resist pattern having the shape of a space and line pattern (hereinafter, referred to as "SL pattern") was conducted as a following manner.

Examples 1 to 9, Comparative Examples 1 to 27

Step (1)

An organic antireflection film composition (product name: ARC29A, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 89 nm.

The aforementioned resist composition (1-1) was then applied to the organic anti-reflection film using a spinner, and was then prebaked (PAB) and dried on a hotplate at 110° C. for 50 seconds, thus forming a resist film (i.e., first resist film) having a film thickness of 85 nm.

Subsequently, the first resist film was selectively irradiated with an ArF excimer laser (193 nm) through a photomask (6% halftone), using an immersion lithography ArF exposure apparatus NSR-S609B (manufactured by Nikon Corporation; NA (numerical aperture)=1.07; Annular in 0.78/out 0.97, Ratio 0.80; immersion medium: water).

Then, a post exposure bake (PEB) treatment was conducted at 90° C. for 50 seconds.

Next, a solvent development was conducted for 13 seconds at 23° C. using butyl acetate as a developing solution, followed by drying by shaking.

As a result, an SL pattern having a space width of 55 nm, a pitch of 110 nm was formed with a thickness of the film of 85 nm.

Step (2)

Next, the ratio of the film thickness t2 of the pattern reversing film to the film thickness t1 of SL pattern was set to the value indicated under "thickness t2/thickness t1" in Table 5, and then, formation of a pattern reversing film was conducted. Specifically, using a spinner, each of the pattern reversing compositions (2-1) to (2-36) was applied to the anti-reflection film having the SL pattern formed thereon, and was then prebaked (PAB) and dried on a hotplate at 90° C. for 60 seconds, thereby forming a resin film (i.e., pattern reversing film).

Thereafter, alkali developing was conducted for 20 seconds at 23° C. in a 2.38% by weight aqueous solution of tetramethylammonium hydroxide (TMAH) (product name: NMD-3; manufactured by Tokyo Ohka Kogyo Co., Ltd.).

The results of pattern formation after the alkali development are shown in Table 5.

In the table, the result "A" means that a reversed pattern of the SL pattern which had been formed in the step (1) could be formed.

The result "13" means that a reversed pattern could be formed even though developing irregularities were slightly observed.

The result "C(1)" means that not only the SL pattern which had been formed in the step (1) but also the pattern reversing film were dissolved and removed by THAM aqueous solution.

The result "C(2)" means that the pattern reversing film was hardly dissolved in THAM aqueous solution, and hence, both the SL pattern which had been formed in the step (1) and the pattern reversing film could not be dissolved and removed, and the film and pattern remained.

The result "-" means that the resin component could not be dissolved in an organic solvent, and hence a pattern reversal composition could not be prepared.

TABLE 5

| | Pattern reversing composition | Film thickness t2/film thickness t1 | Dissolution ratio of pattern reversing film in alkali developing solution (nm/s) | Result of pattern formation |
|---|---|---|---|---|
| Comparative Example 1 | (2-1) | 1.18 | 7.42 | C(1) |
| Comparative Example 2 | (2-2) | 1.18 | 6.07 | C(1) |
| Comparative Example 3 | (2-3) | 1.18 | 7.49 | C(1) |
| Example 1 | (2-4) | 0.59 | 1.44 | A |
| Comparative Example 4 | (2-5) | 1.18 | 5.35 | C(1) |
| Comparative Example 5 | (2-6) | 0.59 | 0.28 | C(2) |
| Comparative Example 6 | (2-7) | 0.59 | 0.63 | C(2) |

TABLE 5-continued

| | Pattern reversing composition | Film thickness t2/film thickness t1 | Dissolution ratio of pattern reversing film in alkali developing solution (nm/s) | Result of pattern formation |
|---|---|---|---|---|
| Comparative Example 7 | (2-8) | 1.18 | 4.56 | C(1) |
| Comparative Example 8 | (2-9) | 1.18 | 8.99 | C(1) |
| Example 2 | (2-10) | 0.59 | 1.38 | A |
| Example 3 | (2-11) | 0.88 | 2.26 | A |
| Comparative Example 9 | (2-12) | 1.18 | 9.09 | C(1) |
| Comparative Example 10 | (2-13) | 1.18 | 3.89 | C(1) |
| Comparative Example 11 | (2-14) | 1.18 | 3.62 | C(1) |
| Comparative Example 12 | (2-15) | 1.18 | 3.73 | C(1) |
| Example 4 | (2-16) | 0.59 | 1.19 | B |
| Comparative Example 13 | (2-17) | 1.18 | 4.73 | C(1) |
| Comparative Example 14 | (2-18) | 0.59 | 0.23 | C(2) |
| Comparative Example 15 | (2-19) | 0.59 | 0.52 | C(2) |
| Comparative Example 16 | (2-20) | 1.18 | 3.76 | C(1) |
| Comparative Example 17 | (2-21) | 1.18 | 7.42 | C(1) |
| Example 5 | (2-22) | 0.59 | 1.14 | A |
| Example 6 | (2-23) | 0.88 | 1.86 | A |
| Comparative Example 18 | (2-24) | 1.18 | 7.49 | C(1) |
| Comparative Example 19 | (2-25) | Pattern reversing composition could not be prepared. | | — |
| Comparative Example 20 | (2-26) | 1.18 | 5.66 | C(1) |
| Comparative Example 21 | (2-27) | Pattern reversing compositon could not be prepared. | | — |
| Example 7 | (2-28) | 0.88 | 1.67 | A |
| Comparative Example 22 | (2-29) | 1.18 | 7.28 | C(1) |
| Comparative Example 23 | (2-30) | 0.59 | 0.32 | C(2) |
| Comparative Example 24 | (2-31) | 0.59 | 0.72 | C(2) |
| Comparative Example 25 | (2-32) | 1.18 | 5.29 | C(1) |
| Comparative Example 26 | (2-33) | 1.18 | 10.43 | C(1) |
| Example 8 | (2-34) | 0.88 | 1.60 | A |
| Example 9 | (2-35) | 1.18 | 2.62 | A |
| Comparative Example 27 | (2-36) | 1.18 | 10.53 | C(1) |

By the method of forming a pattern according to Examples 1 to 9, line portions of the SL pattern formed on the first resist film were dissolved and removed by THAM aqueous solution, and lines derived from the pattern reversing film were formed at the space portions of the SL pattern, thereby forming a reversed pattern of the SL pattern.

It was confirmed that, with respect to the method of forming a pattern according to Examples 1 to 9, the dissolution rate of the pattern reversing film in an alkali developing solution was within the range of 1.0 to 3.5 nm/s.

<Formation of Reversed Pattern (2)>

Using the resist composition (1-1) as a resist composition, and the pattern reversing composition (2-10) as a pattern reversing composition, formation of a reversed pattern (i.e., hole pattern) of a resist pattern having a dotted shape (i.e., pillar shape) was conducted in the following manner.

Example 10

Step (1)

An organic antireflection film composition (product name: ARC29A, manufactured by Brewer Science Ltd.) was applied to an 8-inch silicon wafer using a spinner, and the composition was then baked and dried on a hotplate at 205° C. for 60 seconds, thereby forming an organic antireflection film having a thickness of 89 nm.

The aforementioned resist composition (1-1) was then applied to the organic anti-reflection film using a spinner, and was then prebaked (PAB) and dried on a hotplate at 90° C. for 50 seconds, thus forming a resist film (i.e., first resist film) having a film thickness of 85 nm.

Subsequently, the first resist film was selectively irradiated with an ArF excimer laser (193 nm) through a photomask (6% halftone), using an immersion lithography ArF exposure apparatus NSR-S609B (manufactured by Nikon Corporation; NA (numerical aperture)=1.07; Annular in 0.78/out 0.97, Ratio 0.80; immersion medium: water).

Then, a post exposure bake (PEB) treatment was conducted at 95° C. for 50 seconds.

Next, a solvent development was conducted for 13 seconds at 23° C. using butyl acetate as a developing solution, followed by drying by shaking.

As a result, a resist pattern having a dotted shape (pillar shape) having a diameter of 50 nm, a pitch of 120 nm and a film thickness of 85 nm was formed.

Step (2)

Next, the ratio of the film thickness t2 of the pattern reversing film to the film thickness t1 of the resist pattern having a dotted shape (pillar shape) was set to [the thickness t2]/[the thickness t1]=0.59, and then, formation of a pattern reversing film was conducted. Specifically, using a spinner, the pattern reversing composition (2-10) was applied to the anti-reflection film having the resist pattern of a dotted shape (pillar shape) formed thereon, and was then prebaked (PAB) and dried on a hotplate at 90° C. for 60 seconds, thereby forming a resin film (i.e., pattern reversing film).

Thereafter, alkali developing was conducted for 20 seconds at 23° C. in a 2.38% by weight aqueous solution of tetramethylammonium hydroxide (TMAH) (product name: NMD-3; manufactured by Tokyo Ohka Kogyo Co., Ltd.).

By the method of forming a pattern according to Example 10, the dotted portion (pillar portion) of the resist pattern which had been formed on the first resist pattern was dissolved and removed by THAM aqueous solution to form a reversed pattern (contact hole pattern) having a diameter of about 50 nm, a pitch of about 120 nm and a height of about 47 nm.

<Formation of Reversed Pattern (3)>

Using the resist composition (1-1) as a resist composition, and the pattern reversing composition (2-10) as a pattern reversing composition, formation of a reversed pattern of a large area pattern was conducted in the following manner.

Example 11

Step (1)

An organic antireflection film composition (product name: ARC29A, manufactured by Brewer Science Ltd.) was applied to an 8-inch silicon wafer using a spinner, and the composition was then baked and dried on a hotplate at 205°

C. for 60 seconds, thereby forming an organic antireflection film having a thickness of 89 nm.

The aforementioned resist composition (1-1) was then applied to the organic anti-reflection film using a spinner, and was then prebaked (PAB) and dried on a hotplate at 90° C. for 50 seconds, thus forming a resist film (i.e., first resist film) having a film thickness of 85 nm.

Subsequently, the first resist film was selectively irradiated with an ArF excimer laser (193 nm) through a photomask (6% halftone), using an immersion lithography ArF exposure apparatus NSR-S609B (manufactured by Nikon Corporation; NA (numerical aperture)=1.07; Annular in 0.78/out 0.97, Ratio 0.80; immersion medium: water).

Then, a post exposure bake (PEB) treatment was conducted at 95° C. for 50 seconds.

Next, a solvent development was conducted for 13 seconds at 23° C. using butyl acetate as a developing solution, followed by drying by shaking.

As a result, a reversed pattern having a shape of number "5" was formed as a large area pattern (the size of the number portion: about length of 10 μm×width 10 μm, the width of the line of the number portion: about 1.5 μm, the film thickness of the number portion corresponding to unexposed portions removed from the first resist film (height of exposed portions): 85 nm).

Step (2)

Next, the ratio of the film thickness t2 of the pattern reversing film to the film thickness t1 of the resist pattern having a shape of the number "5" formed thereon was set to [the thickness t2]/[the thickness t1]=0.59, and then, formation of a pattern reversing film was conducted. Specifically, using a spinner, the pattern reversing composition (2-10) was applied to the anti-reflection film having the resist pattern of a number "5" formed thereon, and was then prebaked (PAB) and dried on a hotplate at 90° C. for 60 seconds, thereby forming a resin film (i.e., pattern reversing film).

Thereafter, alkali developing was conducted for 20 seconds at 23° C. in a 2.38% by weight aqueous solution of tetramethylammonium hydroxide (TMAH) (product name: NMD-3; manufactured by Tokyo Ohka Kogyo Co., Ltd.).

By the method of forming a pattern according to Example 11, the portion other than the number portion of the resist pattern formed on the first resist film was removed by THAM aqueous solution to form a reversed pattern having the shape of number "5" with excellent shape (the size of number portion: about length of 10 μm×width of 10 μm×height of 47 μm, the width of the line of the number portion: about 1.5 μm; the residual portion of the pattern reversing film constituted the number portion.).

The result means that a reversed pattern of the resist pattern (large area pattern) having the shape of number "5" formed thereon during step (1) could be formed.

DESCRIPTION OF REFERENCE NUMERALS AND CHARACTERS

1: Substrate
2: First resist film
3: Photomask
6: Pattern reversing film While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of forming a pattern, comprising:
applying a resist composition which exhibits decreased solubility in an organic solvent upon exposure is applied to a substrate to form a first resist film,
exposing the first resist film,
subjecting the exposed first resist film to patterning by negative-tone developing using a developing solution containing an organic solvent to form a first resist pattern;
applying a pattern reversing composition containing an organic solvent which does not dissolve the first resist pattern to the substrate on which the first resist pattern has been formed, so as to form a pattern reversing film, and
subjecting the pattern reversing film to alkali developing treatment using an alkali developing solution to remove the first resist pattern and to conduct patterning of the pattern reversing film, so as to form a reversed pattern of the first resist pattern, wherein
the dissolution rate of the pattern reversing film in an alkaline developing solution is 1.0 to 3.5 nm/s, and
the pattern reversing composition comprises:
a base component (A") which forms a pattern reversing film and contains a resin component (A"1) represented by general formula (A"1-11) or (A"1-12) shown below; and
an organic solvent (S') comprising at least one member selected from the group consisting of butyl acetate, ethyl-3-ethoxypropionate, 1-butoxy-2-propanol, isobutanol, 4-methyl-2-pentanol and n-butanol:

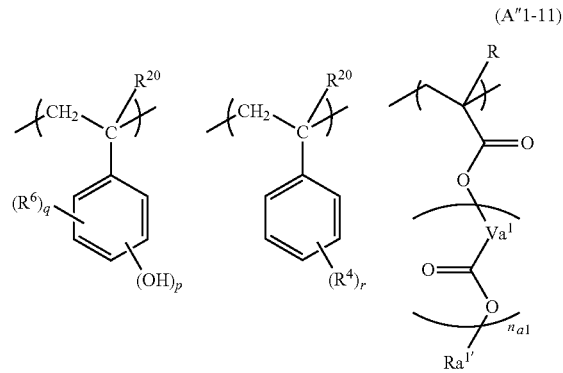

(A"1-11)

wherein $R^{20}$ each independently represents a hydrogen atom or an alkyl group of 1 to 5 carbon atoms; $R^6$ represents an alkyl group of 1 to 5 carbon atoms; p represents an integer of 1 to 3; and q represents an integer of 0 to 2; $R^4$ represents an alkyl group of 1 to 5 carbon atoms; r represents an integer of 1 to 3; R represents a hydrogen atom, an alkyl group of 1 to 5 carbon atoms or a halogenated alkyl group of 1 to 5 carbon atoms; $Va^1$ represents a divalent hydrocarbon group which may contain an ether bond, an urethane bond or an amide bond; $n_{a1}$ represents an integer of 0 to 2; and $Ra^{1"}$ represents an acid dissociable group represented by the formula (a1-r-2) shown below:

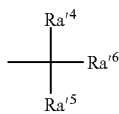
(a1-r-2)

wherein Ra'⁴ to Ra'⁶ each independently represents a hydrocarbon group, provided that Ra'⁵ and Ra'⁶ may be mutually bonded to form a ring;

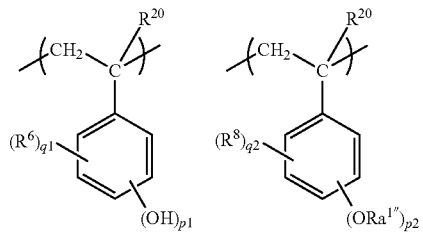
(A″1-12)

wherein $R^{20}$ each independently represents a hydrogen atom or an alkyl group of 1 to 5 carbon atoms; $R^6$ represents an alkyl group of 1 to 5 carbon atoms; p1 represents an integer of 1 to 3; q1 represents an integer of 0 to 2; $R^8$ represents an alkyl group of 1 to 5 carbon atoms; p2 represents an integer of 1 to 3; q2 represents an integer of 0 to 2; and Ra¹‴ represents an acid dissociable group represented by the formula (a1-r-1) shown below:

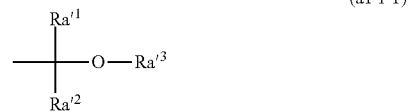
(a1-r-1)

wherein Ra'¹ and Ra'² represents a hydrogen atom or an alkyl group; and Ra'³ represents a hydrocarbon group, provided that Ra'³ may be bonded to Ra'¹ or Ra'² to form a ring.

2. The method according to claim 1, wherein portions of the pattern reversing film formed on the first resist pattern are removed together with the first resist pattern by alkali development.

3. The method according to claim 1, wherein the ratio of a film thickness of the pattern reversing film t2 to a film thickness of the first resist pattern t1 is 0.5 to 1.5.

4. The method according to claim 1, wherein the organic solvent contained in the developing solution is at least one member selected from the group consisting of ketone organic solvents, ester organic solvents, alcohol organic solvents, nitrile organic solvents, amide organic solvents and ether organic solvents, and hydrocarbon organic solvents.

* * * * *

UNITED STATES PATENT AND TRADEMARK OFFICE
CERTIFICATE OF CORRECTION

PATENT NO. : 9,529,266 B2
APPLICATION NO. : 14/579718
DATED : December 27, 2016
INVENTOR(S) : Tomohiro Oikawa and Kazuishi Tanno It is certified that error appears in the above-identified patent and that said Letters Patent is hereby corrected as shown below:

In the Specification

Column 9, Line 21, "It" should be --it--.

Column 20, Line 14, "Ra'd" should be --Ra'1--.

Column 29, Lines 2-14: " 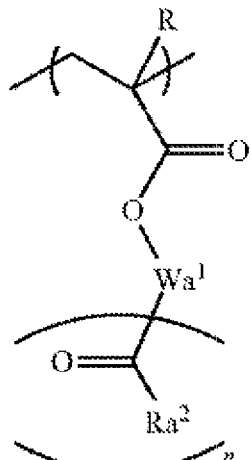 " should be -- 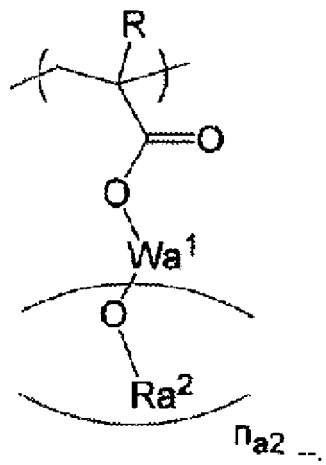 --.

Column 29, Line 39, "Rae" should be --Ra2--.

Column 32, Line 23, "Rae" should be --Ra2--.

Signed and Sealed this
Eighteenth Day of April, 2017

Michelle K. Lee
*Director of the United States Patent and Trademark Office*

CERTIFICATE OF CORRECTION (continued)

Column 35, Lines 20-29, " 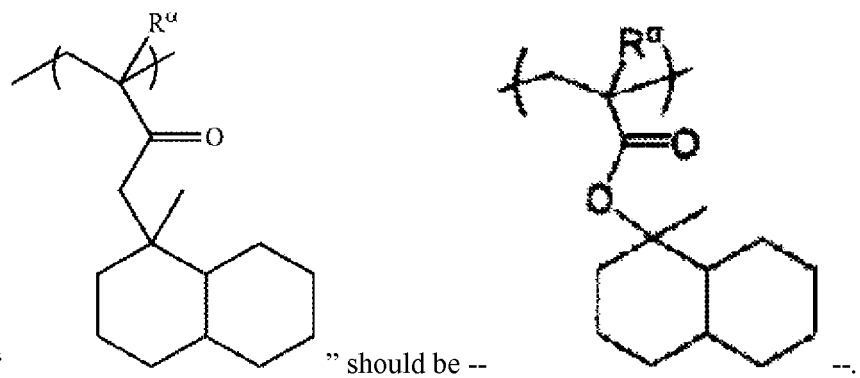 " should be -- --.

Column 41, Line 18, "norbomane," should be --norbornane,--.

Column 47, Lines 25-31, " 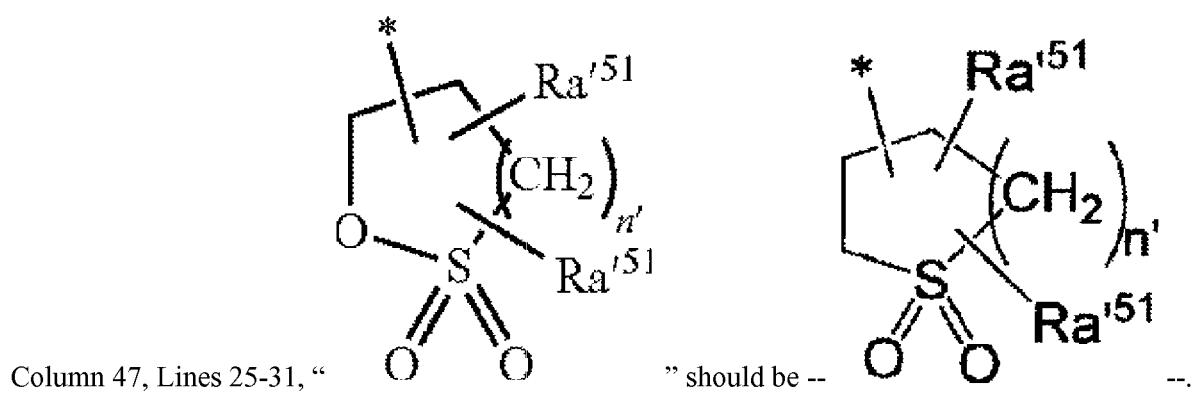 " should be -- --.

Column 53, Line 35, "Ra'2'" should be --Ra'21--.

Column 54, Line 26, "(r-cr-1-6)" should be --(r-cr-1-7)--.

Column 58, Lines 3-4, "—Y21—C(=O)—O—Y21," should be
-- -Y21-C(=O)-O-, -C(=O)-O-Y21,--.

Column 58, Line 18, "(O)" should be --(=O)--.

Column 60, Line 56, after "(a3-2)" insert --,--.

Column 60, Line 60, "norbonyl" should be --norbornyl--.

Column 60, Line 61, "norbonyl" should be --norbornyl--.

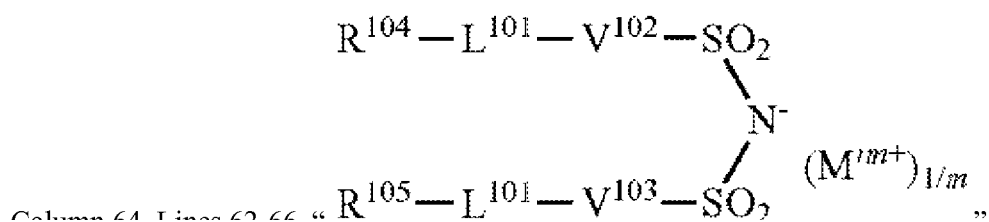

Column 64, Lines 62-66, "

should be -- 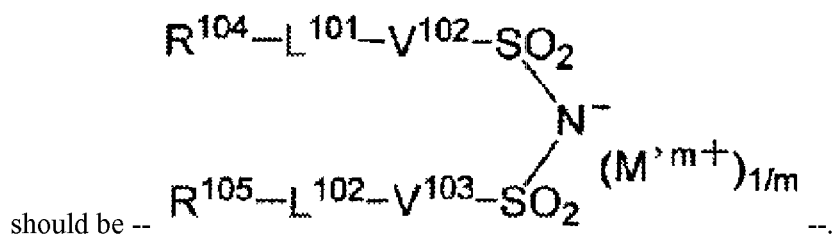 --.

Column 65, Line 8, "R1''" should be --R108--.

Column 69, Line 46, after "as" insert --R101,--.

Column 72, Line 49, "V'101" should be --V101--.

Column 74, Line 47, "phenoxathiin" should be --phenoxazine--.

Column 94, Line 24, "M+" should be --Mm+--.

Column 95, Line 54, "M"m+" should be --M'm+--.

Column 96, Line 49, "photoadsorption" should be --photoabsorption--.

Column 100, Line 48, "(2-methoxyethoxyl)" should be --(2-methoxyethoxy)--.

Column 100, Line 49, "(2-methoxyethoxymethoxyl)" should be --(2-methoxyethoxymethoxy)--.

Column 100, Line 52, "[2-{ 2" should be --[2-{2--.

Column 100, Line 52, "hydroxyethoxyl)" should be --hydroxyethoxy)--.

Column 100, Line 53, "tri acetate," should be --triacetate,--.

Column 102, Line 23, "Re103" should be --Rf103--.

Column 102, Line 47, "R103," should be --Rf103,--.

Column 105, Line 53, "(2-butoxyethoxyl)" should be --(2-butoxyethoxy)--.

Column 111, Line 20, "R5'" should be --R51--.

Column 112, Line 24, "polycycloorefin," should be --polycycloolefin,--.

Column 113, Lines 61-62, "polycycloorefin" should be --polycycloolefin--.

CERTIFICATE OF CORRECTION (continued)
U.S. Pat. No. 9,529,266 B2

Column 120, Line 21, "MHz 13C" should be --MHz_13C--.

Column 123, Line 28 (Table 4), "compositon" should be --composition--.

Column 125, Line 34 (Table 5 – continued), "compositon" should be --composition--.